United States Patent [19]

Okamura

[11] Patent Number: 5,801,426
[45] Date of Patent: Sep. 1, 1998

[54] FIELD EFFECT TRANSISTOR WITH IMPROVED SOURCE/DRAIN DIFFUSION REGIONS HAVING AN EXTREMELY SMALL CAPACITANCE

[75] Inventor: Ryuichi Okamura, Tokyo, Japan

[73] Assignee: NEC Corporation, Tokyo, Japan

[21] Appl. No.: 515,941

[22] Filed: Aug. 16, 1995

[30] Foreign Application Priority Data

Aug. 17, 1994 [JP] Japan ................. 6-215285

[51] Int. Cl.⁶ .......... H01L 29/76; H01L 29/74; H01L 31/062; H01L 31/113
[52] U.S. Cl. ................. 257/386; 257/346
[58] Field of Search ................. 257/335, 339, 257/345, 346, 386, 391, 392, 402, 403, 404

[56] References Cited

U.S. PATENT DOCUMENTS

| | | | |
|---|---|---|---|
| 5,359,221 | 10/1994 | Miyamoto et al. | 257/408 |
| 5,449,937 | 9/1995 | Arimura et al. | 257/345 |
| 5,536,959 | 7/1996 | Kellam | 257/327 |

FOREIGN PATENT DOCUMENTS 58-2067  1/1983  Japan.
60-94759  5/1985  Japan.

*Primary Examiner*—Ngân V. Ngô
*Attorney, Agent, or Firm*—Young & Thompson

[57] ABSTRACT

The invention provides a diffusion region structure in a semiconductor device wherein the diffusion region is applied with alternating voltages in an operation of the semiconductor device. The structure comprises at least one diffusion region being doped with an impurity of a first conductivity type at a first impurity concentration and also being provided in a semiconductor bulk region doped with an impurity of a second conductivity type at a second impurity concentration lower than the first impurity concentration, and at least a diffusion capacitance reduction layer provided under the diffusion region so as to be in contact with a bottom of the diffusion region. The diffusion capacitance reduction layer may be doped with an impurity of the second conductivity type at a third impurity concentration which is at least lower than the second impurity concentration of the semiconductor bulk region and not lower than zero or may be mode of an insulating material to thereby reduce a capacitance of the diffusion region.

39 Claims, 92 Drawing Sheets

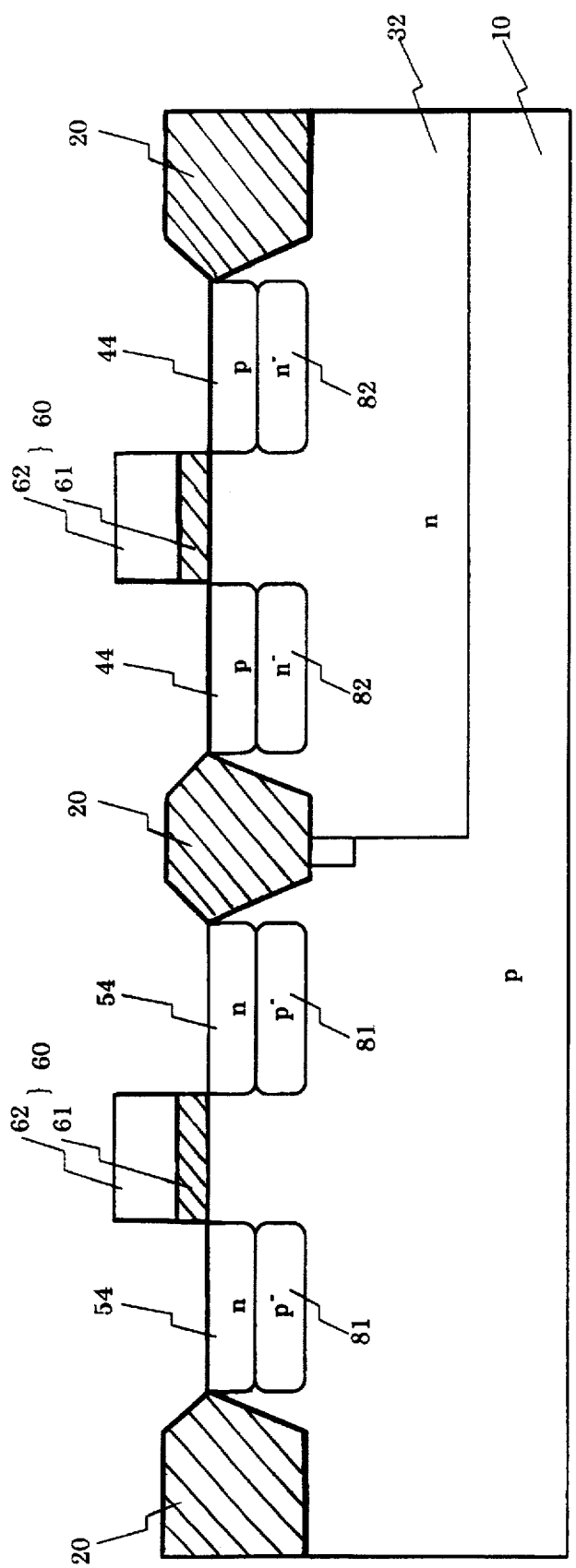

high energy implantation low energy implantation low energy implantation low energy implantation high energy implantation low energy implantation

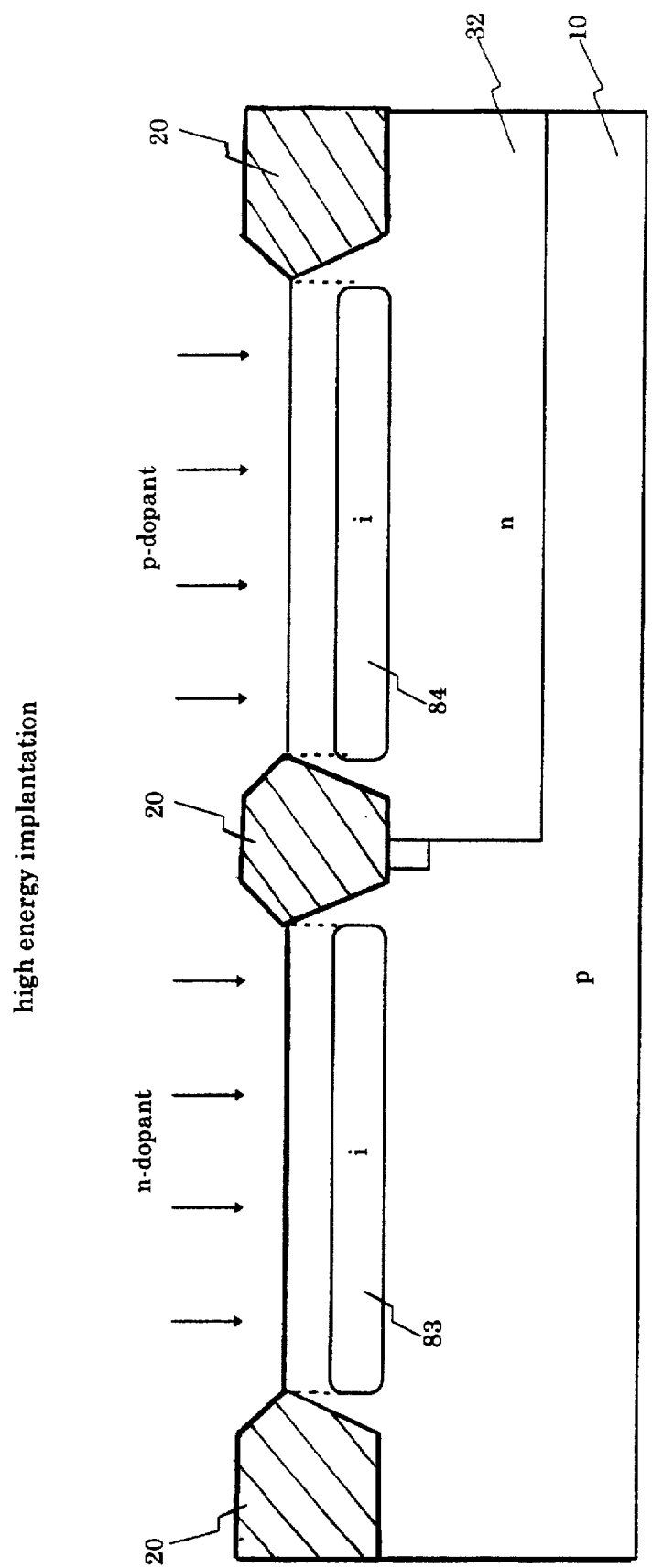

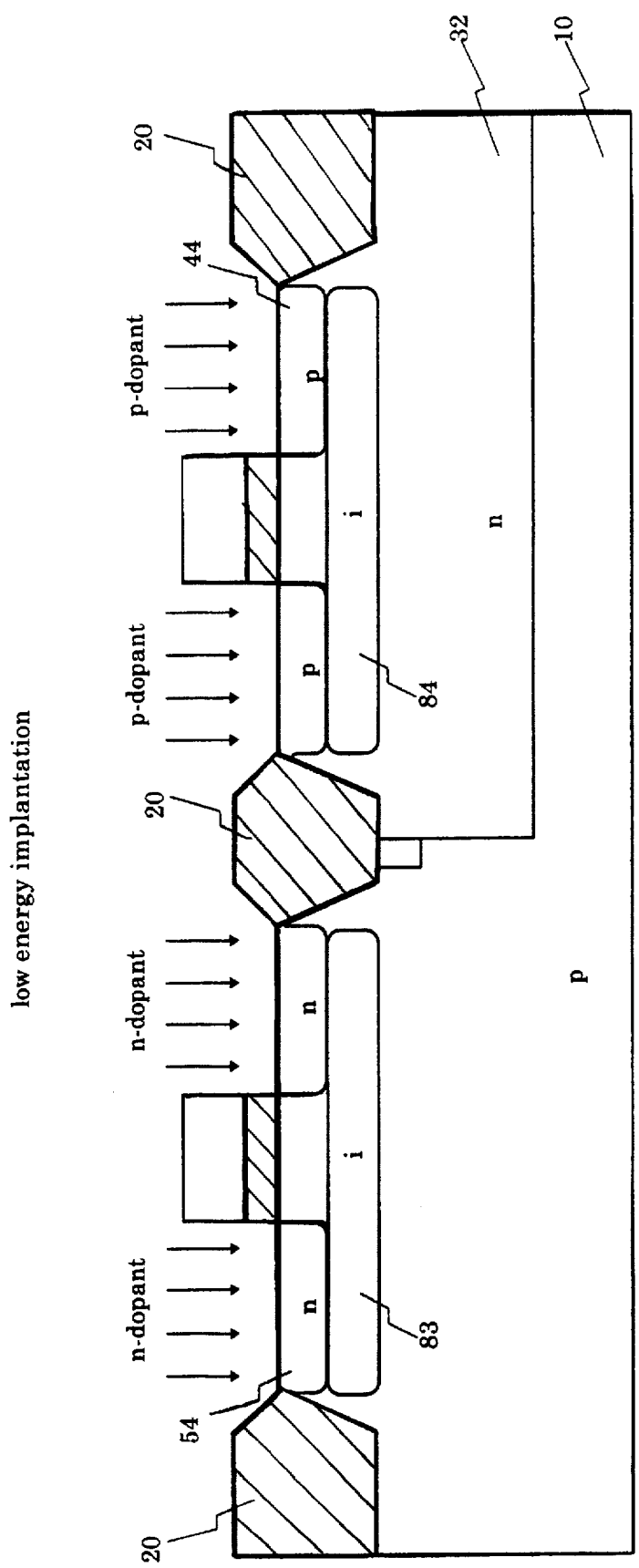

high energy implantation low energy implantation

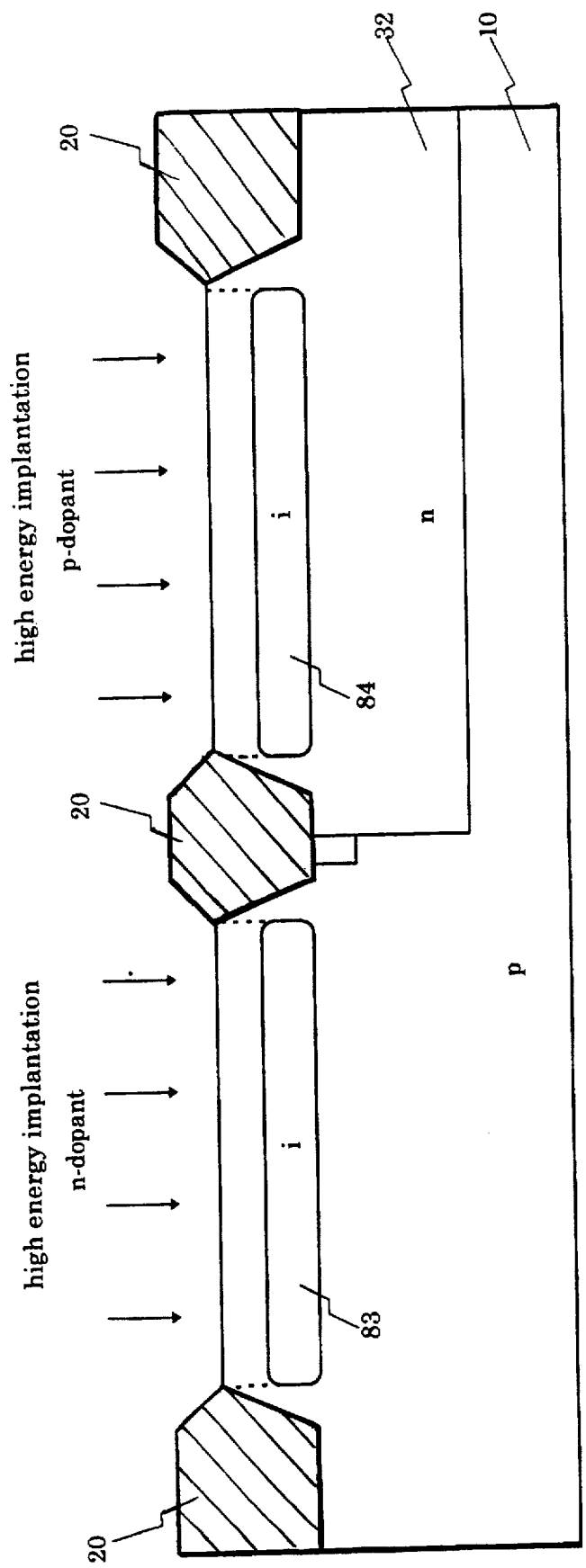

FIELD EFFECT TRANSISTOR WITH IMPROVED SOURCE/DRAIN DIFFUSION REGIONS HAVING AN EXTREMELY SMALL CAPACITANCE

BACKGROUND OF THE INVENTION

The present invention relates to a semiconductor device, and more particularly to a field effect transistor with source/drain diffusion regions having an extremely small capacitance for high speed and high frequency performances.

The most important issue in design of improved field effect transistors such as MOS field effect transistors would be how tzo achieve a possible scaling down and ensure possible high speed and high frequency performances. The field effect transistors such as MOSFETs have been on being subjected to requirements of a scaling down according to the scaling down law. Namely, a scaling down of the MOS field effect transistor requires a certain increase in impurity concentration of source/drain diffusion regions, for which reason the increase in impurity concentration of the source/drain diffusion regions would be unavoidable for improvements of the semiconductor devices including MOS field effect transistors.

On the other hand, high speed and high frequency performances of the field effect transistors such as MOSFETs may largely depend upon an alternating-current capacitance of the source/drain diffusion regions. The capacitance of the source/drain diffusion regions may also depend largely upon a p-n junction capacitance which is generated on an interface of the source/drain diffusion regions to a peripheral semiconductor bulk region in which the source/drain diffusion regions are formed. In the normal field effect transistors such as MOSFETs, the source/drain diffusion regions are formed in a surface region of a semiconductor substrate doped with an impurity at a predetermined impurity concentration or in a well region also doped with an impurity at a predetermined impurity concentration. Impurity concentrations of the semiconductor substrate and the well region should be determined to suppress short channel effects or punch through effects. A magnitude of the p-n junction capacitance depends upon impurity concentrations of the source/drain diffusion regions and the peripheral semiconductor regions such as semiconductor substrate and well region formed in the substrate. Low impurity concentrations of both the source/drain regions and the semiconductor peripheral region such as the semiconductor substrate or the well region may cause a small p-n junction capacitance to be generated at an interface of the source/drain diffusion regions to the semiconductor peripheral region. By contrast, high impurity concentrations of both the source/drain regions and the semiconductor peripheral region such as the semiconductor substrate or the well region may cause a large p-n junction capacitance to be generated at an interface of the source/drain diffusion regions to the semiconductor peripheral region. A certain reduction in impurity concentration of at least one of the source/drain diffusion regions and the semiconductor peripheral region such as the semiconductor substrate or the well region may lead to a reduction of the p-n junction capacitance.

From the above descriptions, it would be understood that the scaling down of the field effect transistors such as MOSFETs requires, according to the scaling down law, an increase in impurity concentration of the source/drain diffusion regions and further the increase in impurity concentration of the source/drain diffusion regions may lead to an increase in p-n junction capacitance of the source/drain diffusion regions thereby a capacitance of the source/drain diffusion regions is also increased.

The increased capacitance of the source/drain diffusion regions may, however, render it difficult to allow the field effect transistors to exhibit high speed and high frequency performances, for which reason a reduced or low capacitance of the source/drain diffusion regions is required to allow the field effect transistor to show the required high sped and high frequency performances. According to the scaling down law, it is difficult to reduce the capacitance of the source/drain diffusion regions while the scaling down is required. On the other hand, in view of suppressions of the short channel effects and punch through effects, it is also difficult to largely reduce an impurity concentration of the semiconductor peripheral region such as the semiconductor substrate or the semiconductor well region in which the source/drain diffusion regions are formed.

Under the above circumstances, the scaling down of the field effect transistors such as MOSFETs may prevent the transistors from showing high speed and high frequency performances, for which reasons there have been developed or proposed techniques for reducing the capacitance of the highly doped source/drain diffusion regions.

One of conventional techniques for reducing the capacitance of the source/drain diffusion regions is disclosed in the Japanese Laid-open Patent Application No. 58-2067, which will hereinafter be described with reference to FIGS. 1A and 1B. As illustrated in FIG. 1A, field oxide films 20 are selectively formed in a surface of a p-type semiconductor substrate 10. A gate oxide film 61 is selectively formed at a center of the surface of the p-type semiconductor substrate 10 and then a gate electrode 62 is formed on the gate oxide film 61 to thereby form a gate structure 60. The gate electrode may comprise a polysilicon film having a thickness of 0.5 micrometers and being doped with phosphorus. Arsenic is implanted at an implantation energy of 50 KeV into the surface of the p-type semiconductor substrate 10 by using the gate structure 60 and the field oxide films 20 as masks to form n-type source/drain diffusion regions 90.

As illustrated in FIG. 1B, boron is further implanted at a high implantation energy of 300 KeV into the p-type semiconductor substrate 10 by using the gate structure 60 and the field oxide films 20 as masks to form a p-type high impurity concentration region 100 being positioned at a deep level under the source/drain diffusion regions 90 but positioned just under the gate structure 60 so that a channel region between the source/drain diffusion regions 90 is occupied by the p-type high impurity concentration region 100. This may somewhat contribute to prevent the short channel effects and punch through effect. The p-type high impurity concentration diffusion region 100 is spaced apart from bottoms of the source/drain diffusion regions 90. This may contribute to suppress the unnecessary increase in a p-n junction capacitance of the source/drain diffusion regions.

Another one of the conventional techniques for reducing the capacitance of the source/drain diffusion regions is disclosed in the Japanese Laid-open Patent Application No. 60-94759 will be described with reference to FIG. 2. An n-type low impurity concentration well region 102 is selectively formed in a p-type semiconductor substrate 10 having a low impurity concentration. Field oxide films 20 are selectively formed in a surface of the substrate 10 to separate the n-type low impurity well region 32 from the surface region of the p-type low impurity concentration semiconductor substrate 10. Gate structures 60 comprising gate oxide films 61 and gate electrodes 62 are formed on a surface of the p-type low impurity concentration semiconductor substrate 10 and the n-type low impurity concentration well region 32. Further, n-type and p-type source/drain diffusion regions 54 and 44 are formed in the surface region of the p-type low impurity concentration semiconductor substrate 10 and the n-type low impurity concentration well region 32 respectively. Further, there is formed a p-type high impurity concentration diffusion region 101 having an impurity concentration in the range of from $1\times10^{13}$ to $6\times10^{13}$ atoms/cm$^3$ which is higher than an impurity concentration of the p-type low impurity concentration semiconductor substrate 10 to thereby allow the control of threshold voltage and suppress of punch through phenomenon. An n-type high impurity concentration diffusion region 102 is also formed having a high impurity concentration in the range of from $1\times10^{15}$ to $3\times10^{15}$ atoms/cm$^3$ which is higher than an impurity concentration of the n-type well region 32 to thereby allow the control of threshold voltage and suppress of punch through phenomenon.

The conventional techniques described above for reducing the capacitance of the source/drain diffusion regions would be to use the low impurity concentrations of the semiconductor substrate or the well region in which the source/drain diffusion regions are formed. Indeed, the above conventional techniques have been useful for the conventional devices, however, not applicable to further improved devices to be subjected to a further scaling down. Further scaling down of the device to be required in the future will surely accompany with further increase in impurity concentration of the source/drain diffusion regions, whereas the device will be required to be improved to show further high speed and high frequency performances. Further decrease in impurity concentration of the semiconductor substrate or the well region, in which the source/drain diffusion regions are formed, may cause serious problems with a certain increase in resistance of the substrate and a certain reduction in resistivity to latch-up phenomenon, in addition a certain increase in noise of the substrate. To suppress those problems, it is impossible to further reduce the impurity concentration of the substrate or the well region.

Under the above circumstances, for the purpose of allowing improvements in high speed and high frequency performances of the device, it have been required to develop a quite novel technique for reducing the capacitance of the highly doped source/drain diffusion regions with keeping the necessary high impurity concentration of the substrate and the well region to settle the above problems.

SUMMARY OF THE INVENTION

Accordingly, it is an object of the present invention to provide a semiconductor device having a quite novel structural feature for allowing the device to be free from any problems as described above.

It is a further object of the present invention to provide a quite novel technique for reducing a capacitance of highly doped source/drain diffusion regions in a semiconductor device for allowing a considerable scaling down to be required in the future.

It is a still further object of the present invention to provide a quite novel technique for reducing a capacitance of highly doped source/drain diffusion regions in a semiconductor device for allowing a considerable improvement in high speed and high frequency performances to be required in the future.

It is yet a further object of the present invention to provide a quite novel technique for reducing a capacitance of highly doped source/drain diffusion regions in a semiconductor device with keeping the necessary high impurity concentration of a peripheral semiconductor bulk region, in which the source/drain diffusion regions are formed, to suppress any increase in resistance of the semiconductor bulk region.

It is a furthermore object of the present invention to provide a quite novel technique for reducing a capacitance of highly doped source/drain diffusion regions in a semiconductor device with keeping the necessary high impurity concentration of a peripheral semiconductor bulk region, in which the source/drain diffusion regions are formed, to suppress any reduction in resistivity to latch-up phenomenon.

It is a moreover object of the present invention to provide a quite novel technique for reducing a capacitance of highly doped source/drain diffusion regions in a semiconductor device with keeping the necessary high impurity concentration of a peripheral semiconductor bulk region, in which the source/drain diffusion regions are formed, to suppress any increase in noise of the device.

The above objects, features and advantages of the present invention will be apparent from the following descriptions.

The present invention provides a diffusion region structure in a semiconductor device wherein the diffusion region is applied with alternating voltages in an operation of the semiconductor device. The diffusion region may comprise at least one diffusion region being doped with an impurity of a first conductivity type at a first impurity concentration and being provided in a semiconductor bulk region doped with an impurity of a second conductivity type at a second impurity concentration lower than the above fist impurity concentration, and at least a diffusion capacitance reduction layer provided under the above diffusion region so as to be in contact with a bottom of the diffusion region wherein the diffusion capacitance reduction layer is doped with an impurity of the second conductivity type at a third impurity concentration which is at least lower than the above second impurity concentration of the above semiconductor bulk region and not lower than zero to thereby reduce a capacitance of the diffusion region.

The present invention also provides a diffusion region structure in a semiconductor device wherein the diffusion region is applied with alternating voltages in an operation of the semiconductor device. The diffusion region may comprise at least one diffusion region being doped with an impurity of a first conductivity type at a first impurity concentration and being provided in a semiconductor bulk region doped with an impurity of a second conductivity type at a second impurity concentration lower than the above fist impurity concentration, and at least a diffusion capacitance reduction layer provided under the above diffusion region so as to be in contact with a bottom of the diffusion region, wherein the diffusion capacitance reduction layer is made of an insulating material to thereby reduce a capacitance of the diffusion region.

The above present inventions are applicable to various semiconductor devices including field effect transistors such as MOSFETs, which will be apparent in the descriptions of the invention.

BRIEF DESCRIPTIONS OF THE DRAWINGS

Preferred embodiments of the present inventions will be described in detail with reference to the accompanying drawings.

FIG. 5 is a cross sectional elevation view illustrative of a novel structure of a MOS field effect transistor in a second embodiment according to the present invention.

FIGS. 40A through 40C are cross sectional elevation views illustrative of MOS field effect transistors in sequential steps involved in a fabrication method thereof in a nineteenth embodiment according to the present invention.

FIGS. 44A through 44D are cross sectional elevation views illustrative of MOS field effect transistors in sequential steps involved in a fabrication method thereof in a twenty first embodiment according to the present invention.

DESCRIPTIONS OF THE INVENTION

Figure 1A:
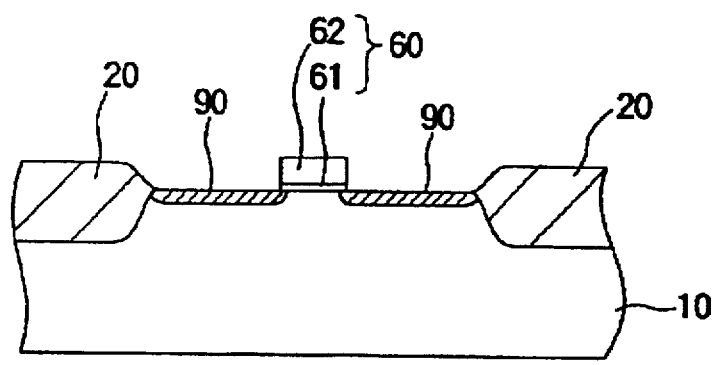
FIGS. 1A and 1B are cross sectional elevations views illustrative of one conventional structure of the MOSFETs.
Figure 1B:
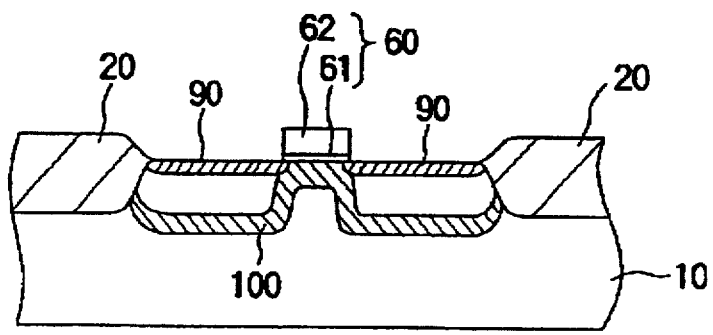
Figure 2:
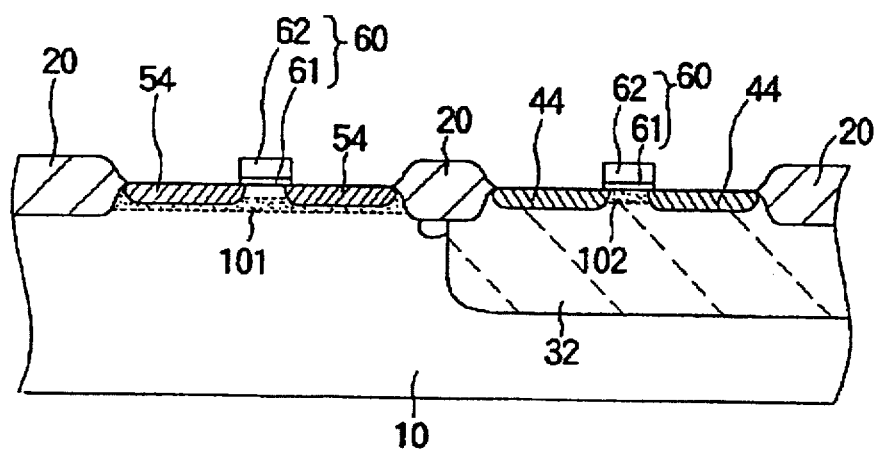
FIG. 2 is a cross sectional elevation view illustrative of another conventional structure of the MOSFETs.

The present invention provides a source/drain diffusion region structure in a field effect transistor. The source/drain diffusion regions are doped with an impurity of a first conductivity type at a first impurity concentration. The source/drain diffusion regions are provided in a surface of a semiconductor bulk region doped with an impurity of a second conductivity type at a second impurity concentration lower than the first impurity concentration. The source and drain diffusion regions are provided separately from one another so as to define, between the source/drain diffusion regions, a channel region over which a gate electrode is provided through a gate insulating film. There are essentially provided capacitance reduction layers provided under the source/drain diffusion regions so as to be in contact with bottoms of the source/drain diffusion regions. The capacitance reduction layers are doped with an impurity of the second conductivity type at a third impurity concentration which is at least lower than the second impurity concentration of the semiconductor bulk region and not lower than zero to thereby reduce a capacitance of the source/drain diffusion regions.

The capacitance of the source/drain diffusion regions depends mainly upon a p-n junction capacitance generated on bottoms of the source/drain diffusion regions. The junction capacitance is inversely proportional to a width of a space charge region formed at a p-n junction interface of the bottom of the source/drain diffusion region. In another viewpoint, the junction capacitance also depends upon both p-type and n-type impurity concentrations, namely be proportional to the square root of a value given by dividing the sum of the p-type and n-type impurity concentrations into the product thereof. When both the p-type and n-type impurity concentrations are large, the junction capacitance is also large. By contrast, when at least any one of the p-type and n-type impurity concentrations is decreased, then the junction capacitance is reduced. The above matters means that when an impurity concentration of a semiconductor region in contact with source/drain diffusion regions is reduced, a capacitance of the source/drain diffusion regions is also reduced. The capacitance reduction layers in contact with the bottoms of the source/drain diffusion regions may be made of a semiconductor having an impurity concentration lower than the semiconductor bulk region in which the source/drain diffusion regions are formed or may be made of an intrinsic or or quasi-intrinsic semiconductor so as to reduce the junction capacitance between the source/drain diffusion regions and the capacitance reduced regions to thereby reduce the capacitance of the source/drain diffusion regions. The above term "intrinsic semiconductor" means a semiconductor free of impurity and the term "quasi-intrinsic semiconductor" means a semiconductor having the same number or concentration of p-type and n-type impurities thereby the quasi-intrinsic semiconductor may act like the intrinsic semiconductor free of any impurity. The reduction of the capacitance of the source/drain diffusion regions may allows the field effect transistor to show high speed and high frequency performances.

The capacitance reduction layers may be in contact with at least entire parts of the bottoms of the source/drain diffusion regions.

The third impurity concentration may be set at zero to form the capacitance reduction layers in intrinsic or quasi-intrinsic semiconductor layers. Alternatively, the third impurity concentration may be set higher than zero to form the capacitance reduction layers in low impurity concentration diffusion layers.

The first conductivity type may be n-type and the second conductivity type may be p-type. In this case, the first impurity concentration of the source/drain diffusion regions may be $1 \times 10^{20}$ atoms/cm$^3$ and the third impurity concentration of the capacitance reduction layers may be $1 \times 10^{15}$ atoms/cm$^3$ to thereby form a space charge region with a width of 0.6 micrometers between the source/drain diffusion regions and the low impurity concentration diffusion layers. The second impurity concentration of the semiconductor bulk region may be $8 \times 10^{12}$ atoms/cm$^3$.

Alternatively, the first conductivity type may be p-type and the second conductivity type may be n-type. In this case, the first impurity concentration of the source/drain diffusion regions may be $1 \times 10^{20}$ atoms/cm$^3$ and the impurity concentration of the capacitance reduction layers may be $1 \times 10^{16}$ atoms/cm$^3$ to thereby form a space charge region with a width of 0.3 micrometers between the source/drain diffusion regions and the low impurity concentration diffusion layers. The second impurity concentration of the semiconductor bulk region amy be $8 \times 10^{12}$ atoms/cm$^3$.

The capacitance reduction layers may be provided separately from each other to extend only on entire parts of the bottoms of the source/drain diffusion regions so as to true up both edges of each of the capacitance reduction layers and each of the source/drain diffusion regions.

Alternatively, the capacitance reduction layers may be united with each other to form a single capacitance reduction layer continuously extending from an outside edge of one of the source/drain diffusion regions to an outside edge of another of the source/drain diffusion regions.

The semiconductor bulk region may comprise a semiconductor substrate or a semiconductor well region formed in a semiconductor substrate. Further, the semiconductor bulk region may comprise a semiconductor well region formed in a semi-insulating substrate. The semiconductor bulk region may be formed on an insulating substrate.

There may be further provided a high impurity diffusion region between the source/drain diffusion regions to include at least the channel region. The high impurity diffusion region may be doped with an impurity of the second conductivity type at a fourth impurity concentration at least higher than the second impurity concentration of the semiconductor bulk region.

There may be furthermore provided gate side walls comprising insulating films on side walls of the gate electrode and lightly doped regions just under the gate side walls and between the channel region and inside edges of the source/drain diffusion regions.

The capacitance reduction layers may be formed separately from each other to extend not only on entire parts of the bottoms of the source/drain diffusion regions but also on bottoms of the lightly doped regions.

The present invention also provides a MOS field effect transistor. A semiconductor substrate may be doped with an impurity of a first conductivity type at a first impurity concentration. The source/drain diffusion regions may be doped with an impurity of a second conductivity type at a second impurity concentration higher than the first impurity concentration of the semiconductor substrate. The source/ drain diffusion regions may be provided separately from each other in a surface region of the semiconductor substrate to define a channel region between the source/drain diffusion regions. A gate insulating film is provided to extend at least on the channel region. A gate electrode is provided on the gate insulating film and rightly over the channel region. Capacitance reduction layers are provided under the source/ drain diffusion regions so as to be in contact with bottoms of the source/drain diffusion regions. The capacitance reduction layers may be doped with an impurity of the second conductivity type at a third impurity concentration which is at least lower than the first impurity concentration of the semiconductor substrate and not lower than zero to thereby reduce a capacitance of the source/drain diffusion regions.

The capacitance reduction layers may be in contact with at least entire parts of the bottoms of the source/drain diffusion regions.

The third impurity concentration may be set at zero to form the capacitance reduction layers in intrinsic or quasi-intrinsic semiconductor layers. Alternatively, the third impurity concentration may be set higher than zero to form the capacitance reduction layers in low impurity cohe first conductivity type is p-type and the second conductivity type is n-type. IN this case, the second impurity concentration of the source/drain diffusion regions is $1 \times 10^{20}$ atoms/cm$^3$ and the third impurity concentration of the capacitance reduction layers is $1 \times 10^{15}$ atoms/cm$^3$ to thereby form a space charge region with a width of 0.6 micrometers between the source/ drain diffusion regions and the low impurity concentration diffusion layers. The first impurity concentration of the semiconductor substrate may be $8 \times 10^{12}$ atoms/cm$^3$.

The first conductivity type may be n-type and the second conductivity type may be p-type. In this case, the second impurity concentration of the source/drain diffusion regions may be $1 \times 10^{20}$ atoms/cm$^3$ and the third impurity concentration of the capacitance reduction layers may be $1 \times 10^{16}$ atoms/cm$^3$ to thereby form a space charge region with a width of 0.3 micrometers between the source/drain diffusion regions and the low impurity concentration diffusion layers. The the first impurity concentration of the semiconductor substrate may be $8 \times 10^{12}$ atoms/cm$^3$.

The the capacitance reduction layers may be provided separately from each other to extend only on entire parts of the bottoms of the source/drain diffusion regions so as to true up both edges of each of the capacitance reduction layers and each of the source/drain diffusion regions. Alternatively, the capacitance reduction layers may be united with each other to form a single capacitance reduction layer continuously extending from an outside edge of one of the source/ drain diffusion regions to an outside edge of another of the source/drain diffusion regions.

There may be further provided a high impurity diffusion region between the source/drain diffusion regions to include at least the channel region, the high impurity diffusion region being doped with an impurity of the second conductivity type at a fourth impurity concentration at least higher than the second impurity concentration of the semiconductor substrate.

There may be furthermore provided gate side walls comprising insulating films provided on side walls of the gate electrode and lightly doped regions just under the gate side walls and between the channel region and inside edges of the source/drain diffusion regions.

The capacitance reduction layers may be formed separately from each other to extend not only on entire parts of the bottoms of the source/drain diffusion regions but also on bottoms of the lightly doped regions.

The present invention also provides a CMOS transistor device. A semiconductor substrate is doped with an impurity of a first conductivity type at a first impurity concentration. A well region is doped with an impurity of a second conductivity type at a second impurity concentration. The well region is provided in the semiconductor substrate and a surface of the well region is separated from a surface of the semiconductor substrate by field oxide films selectively formed on the surface of the semiconductor substrate. First source/drain diffusion regions are doped with an impurity of the first conductivity type at a third impurity concentration higher than the second impurity concentration of the well region. The first source/drain diffusion regions are provided separately from each other in a surface region of the well region to define a first channel region between the first source/drain diffusion regions. A first gate insulating film is provided to extend at least on the first channel region. A first gate electrode is provided on the first gate insulating film and rightly over the first channel region. First capacitance reduction layers are provided under the first source/drain diffusion regions so as to be in contact with bottoms of the first source/drain diffusion regions. The first capacitance reduction layers are doped with an impurity of the first conductivity type at a fourth impurity concentration which is at least lower than the second impurity concentration of the well region and not lower than zero to thereby reduce a capacitance of the first source/drain diffusion regions. Second source/drain diffusion regions are doped with an impurity of the second conductivity type at a fifth impurity concentration higher than the first impurity concentration of the semiconductor substrate. The second source/drain diffusion regions are provided separately from each other in a surface region of the semiconductor substrate to define a second channel region between the second source/drain diffusion regions. A second gate insulating film is provided to extend at least on the second channel region. A second gate electrode is provided on the second gate insulating film and rightly over the second channel region. Second capacitance reduction layers are provided under the second source/drain diffusion regions so as to be in contact with bottoms of the second source/drain diffusion regions. The second capacitance reduction layers are doped with an impurity of the second conductivity type at a sixth impurity concentration which is at least lower than the first impurity concentration of the semiconductor substrate and not lower than zero to thereby reduce a capacitance of the source/drain diffusion regions.

The first capacitance reduction layers may be in contact with at least entire parts of the bottoms of the first source/drain diffusion regions as well as the second capacitance reduction layers may be in contact with at least entire parts of the bottoms of the second source/drain diffusion regions.

The fourth impurity concentration may be set at zero to form the first capacitance reduction layers in intrinsic quasi-intrinsic semiconductor layers. The sixth impurity concentration may be set at zero to form the second capacitance reduction layers in intrinsic or quasi-intrinsic semiconductor layers.

The fourth impurity concentration may be set higher than zero to form the first capacitance reduction layers in first low impurity concentration diffusion layers as well as the sixth impurity concentration is set higher than zero to form the first capacitance reduction layers in second low impurity concentration diffusion layers.

The first conductivity type may be p-type and the second conductivity type may be n-type. In this case, the third impurity concentration of the first source/drain diffusion regions may be $1 \times 10^{20}$ atoms/cm$^3$ and the fourth impurity concentration of the first capacitance reduction layers may be $1 \times 10^{16}$ atoms/cm$^3$ to thereby form a space charge region with a width of 0.3 micrometers between the first source/drain diffusion regions and the first low impurity concentration diffusion layers. The fifth impurity concentration of the second source/drain diffusion regions may be $1 \times 10^{20}$ atoms/cm$^3$ and the sixth impurity concentration of the second capacitance reduction layers may be $1 \times 10^{15}$ atoms/cm$^3$ to thereby form a space charge region with a width of 0.6 micrometers between the second source/drain diffusion regions and the second low impurity concentration diffusion layers.

The first and second impurity concentrations of the semiconductor substrate and the well region may be $8 \times 10^{12}$ atoms/cm$^3$.

The first conductivity type may be n-type and the second conductivity type may be p-type. In this case, the third impurity concentration of the first source/drain diffusion regions may be $1 \times 10^{20}$ atoms/cm$^3$ and the fourth impurity concentration of the first capacitance reduction layers may be $1 \times 10^{15}$ atoms/cm$^3$ to thereby form a space charge region with a width of 0.6 micrometers between the first source/drain diffusion regions and the first low impurity concentration diffusion layers. The fifth impurity concentration of the second source/drain diffusion regions may be $1 \times 10^{20}$ atoms/cm$^3$ and the sixth impurity concentration of the second capacitance reduction layers may be $1 \times 10^{16}$ atoms/cm$^3$ to thereby form a space charge region with a width of 0.3 micrometers between the second source/drain diffusion regions and the second low impurity concentration diffusion layers. The first and second impurity concentrations of the semiconductor substrate and the well region are $8 \times 10^{12}$ atoms/cm$^3$.

The first capacitance reduction layers may be provided separately from each other to extend only on entire parts of the bottoms of the first source/drain diffusion regions so as to true up both edges of each of the first capacitance reduction layers and each of the first source/drain diffusion regions. The second capacitance reduction layers may be provided separately from each other to extend only on entire parts of the bottoms of the second source/drain diffusion regions so as to true up both edges of each of the second capacitance reduction layers and each of the second source/drain diffusion regions.

The first capacitance reduction layers may be united with each other to form a first single capacitance reduction layer continuously extending from an outside edge of one of the first source/drain diffusion regions to an outside edge of another of the first source/drain diffusion regions as well as the second capacitance reduction layers may be united with each other to form a second single capacitance reduction layer continuously extending from an outside edge of one of the second source/drain diffusion regions to an outside edge of another of the second source/drain diffusion regions.

There may be further provided a first high impurity diffusion region between the first source/drain diffusion regions to include at least the first channel region. The first high impurity diffusion region is doped with an impurity of the second conductivity type at a seventh impurity concentration at least higher than the second impurity concentration of the well region. There may also be provided a second high impurity diffusion region between the second source/drain diffusion regions to include at least the second channel region. The second high impurity diffusion region is doped with an impurity of the first conductivity type at a fourth impurity concentration at least higher than the first impurity concentration of the semiconductor substrate.

There may furthermore be provided first gate side walls comprising insulating films provided on side walls of the first gate electrode. There may also be provided first lightly doped regions just under the first gate side walls and between the first channel region and inside edges of the first source/drain diffusion regions. There may also be provided second gate side walls comprising insulating films on side walls of the second gate electrode. There may also be second lightly doped regions just under the second gate side walls and between the second channel region and inside edges of the second source/drain diffusion regions.

The first capacitance reduction layers may be formed separately from each other to extend not only on entire parts of the bottoms of the first source/drain diffusion regions but also on bottoms of the first lightly doped regions as well as the second capacitance reduction layers may be formed separately from each other to extend not only on entire parts of the bottoms of the second source/drain diffusion regions but also on bottoms of the second lightly doped regions.

The present invention also provides another CMOS transistor device. A first well region doped with an impurity of a first conductivity type at a first impurity concentration is provided in a semiconductor substrate. A second well region doped with an impurity of a second conductivity type at a second impurity concentration is provided in the semiconductor substrate to abut the first well region and separated at its surface from the first well region by a field oxide film selectively formed on a surface of the semiconductor substrate. First source/drain diffusion regions doped with an impurity of the second conductivity type at a third impurity concentration higher than the first impurity concentration of the first well region are provided separately from each other in a surface region of the first well region to define a first channel region between the first source/drain diffusion regions. A first gate insulating film is provided to extend at least on the first channel region. A first gate electrode is provided on the first gate insulating film and rightly over the first channel region. First capacitance reduction layers are provided under the first source/drain diffusion regions so as to be in contact with bottoms of the first source/drain diffusion regions. The first capacitance reduction layers are doped with an impurity of the first conductivity type at a fourth impurity concentration which is at least lower than the first impurity concentration of the first well region and not lower than zero to thereby reduce a capacitance of the first source/drain diffusion regions. Second source/drain diffusion regions are doped with an impurity of the first conductivity type at a fifth impurity concentration higher than the second impurity concentration of the second well region. The second source/drain diffusion regions are provided separately from each other in a surface region of the second well region to define a second channel region between the second source/drain diffusion regions. A second gate insulating film is provided to extend at least on the second channel region. A second gate electrode is provided on the second gate insulating film and rightly over the second channel region. Second capacitance reduction layers are provided under the second source/drain diffusion regions so as to be in contact with bottoms of the second source/drain diffusion regions. The second capacitance reduction layers are doped with an impurity of the second conductivity type at a sixth impurity concentration which is at least lower than the second impurity concentration of the second well region and not lower than zero to thereby reduce a capacitance of the source/drain diffusion regions.

The first capacitance reduction layers may be in contact with at least entire parts of the bottoms of the first source/drain diffusion regions as well as the second capacitance reduction layers may be in contact with at least entire parts of the bottoms of the second source/drain diffusion regions.

The fourth impurity concentration may be set at zero to form the first capacitance reduction layers in intrinsic or quasi-intrinsic semiconductor layers as well as the sixth impurity concentration may be set at zero to form the second capacitance reduction layers in intrinsic semiconductor layers.

Alternatively, the fourth impurity concentration may be set higher than zero to form the first capacitance reduction layers in first low impurity concentration diffusion layers as well as the sixth impurity concentration may be set higher than zero to form the second capacitance reduction layers in second low impurity concentration diffusion layers.

The first conductivity type may be p-type and the second conductivity type may be n-type. In this case, the third impurity concentration of the first source/drain diffusion regions may be $1\times10^{20}$ atoms/cm$^3$ and the fourth impurity concentration of the first capacitance reduction layers may be $1\times10^{15}$ atoms/cm$^3$ to thereby form a space charge region with a width of 0.6 micrometers between the first source/drain diffusion regions and the first low impurity concentration diffusion layers. The fifth impurity concentration of the second source/drain diffusion regions may be $1\times10^{20}$ atoms/cm$^3$ and the sixth impurity concentration of the second capacitance reduction layers may be $1\times10^{16}$ atoms/cm$^3$ to thereby form a space charge region with a width of 0.3 micrometers between the second source/drain diffusion regions and the second low impurity concentration diffusion layers. The first and second impurity concentrations of the first and second well regions may be $8\times10^{12}$ atoms/cm$^3$.

The first conductivity type may be n-type and the second conductivity type may be p-type. In this case, the third impurity concentration of the first source/drain diffusion regions may be $1\times10^{20}$ atoms/cm$^3$ and the fourth impurity concentration of the first capacitance reduction layers may be $1\times10^{16}$ atoms/cm$^3$ to thereby form a space charge region with a width of 0.3 micrometers between the first source/drain diffusion regions and the first low impurity concentration diffusion layers. Also, the fifth impurity concentration of the second source/drain diffusion regions may be $1\times10^{20}$ atoms/cm$^3$ and the sixth impurity concentration of the second capacitance reduction layers may be $1\times10^{15}$ atoms/cm$^3$ to thereby form a space charge region with a width of 0.6 micrometers between the second source/drain diffusion regions and the second low impurity concentration diffusion layers. The first and second impurity concentrations of the first and second well region may be $8\times10^{12}$ atoms/cm$^3$.

The first capacitance reduction layers may be provided separately from each other to extend only on entire parts of the bottoms of the first source/drain diffusion regions so as to true up both edges of each of the first capacitance reduction layers and each of the first source/drain diffusion regions. The second capacitance reduction layers may be provided separately from each other to extend only on entire parts of the bottoms of the second source/drain diffusion regions so as to true up both edges of each of the second capacitance reduction layers and each of the second source/drain diffusion regions.

The present invention also provides a source/drain diffusion region structure in a field effect transistor. Source/drain diffusion regions are doped with an impurity of a first conductivity type at a first impurity concentration. The source/drain diffusion regions are provided in a surface of a semiconductor bulk region doped with an impurity of a second conductivity type at a second impurity concentration lower than the first impurity concentration. The source and drain diffusion regions are provided separately from one another so as to define, between the source/drain diffusion regions, a channel region over which a gate electrode is provided through a gate insulating film. Capacitance reduction layers provided under the source/drain diffusion regions so as to be in contact with bottoms of the source/drain diffusion regions. The capacitance reduction layers are made of an insulating material to thereby reduce a capacitance of the source/drain diffusion regions.

The capacitance reduction layers made of an insulating material in contact with the source/drain diffusion regions may contribute a reduction of the capacitance of the source/drain diffusion regions. The reduction of the capacitance of the source/drain diffusion regions may allows the field effect transistor to show high speed and high frequency performances.

The capacitance reduction layers may be in contact with at least entire parts of the bottoms of the source/drain diffusion regions. The capacitance reduction layers may be provided separately from each other to extend only on entire parts of the bottoms of the source/drain diffusion regions so as to true up both edges of each of the capacitance reduction layers and each of the source/drain diffusion regions.

Alternatively, the capacitance reduction layers may be united with each other to form a single capacitance reduction layer continuously extending from an outside edge of one of the source/drain diffusion regions to an outside edge of another of the source/drain diffusion regions.

The semiconductor bulk region may comprise a semiconductor substrate. The semiconductor bulk region may also comprise a semiconductor well region formed in a semiconductor substrate or a semiconductor well region formed in a semi-insulating substrate. The semiconductor bulk region may be formed on an insulating substrate.

There may be further provided a high impurity diffusion region between the source/drain diffusion regions to include at least the channel region. The high impurity diffusion region is doped with an impurity of the second conductivity type at a fourth impurity concentration at least higher than the second impurity concentration of the semiconductor bulk region.

There may be furthermore provided gate side walls comprising insulating films provided on side walls of the gate electrode and lightly doped regions just under the gate side walls and between the channel region and inside edges of the source/drain diffusion regions.

The capacitance reduction layers may be formed separately from each other to extend not only on entire parts of the bottoms of the source/drain diffusion regions but also on bottoms of the lightly doped regions.

Preferred embodiments of the present invention will be described in detail with reference to the accompanying drawings. Whereas modifications of the inventions illustrated in the preferred embodiments will be apparent to a person having ordinary skill in the art, to which the invention pertains, it is to be understood that preferred embodiments of the present invention will be considered in a limiting sense. Accordingly, it is to be intended to cover by claims all modifications of the present invention which fall within the spirit and scope of the present invention.

Figure 3:
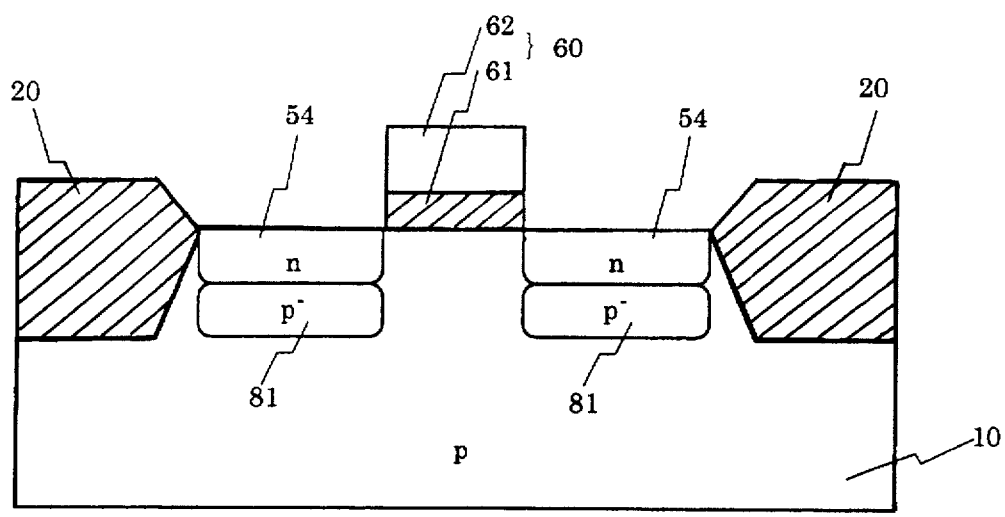
FIG. 3 is a cross sectional elevation view illustrative of a novel structure of a MOS field effect transistor in a first embodiment according to the present invention.

A first embodiment according to the present invention will be described in which an n-channel MOS field effect transistor having low impurity concentration diffusion layers for reducing a capacitance of the source/drain diffusion regions. A structure of the MOS field effect transistor is illustrated in FIG. 3. Field oxide films 20 are selectively provided in a surface of a p-type semiconductor substrate 10 to define an active region in the surface of the p-type semiconductor substrate 10. Source/drain diffusion regions 54 doped with an n-type dopant are selectively provided in the surface active region to define a channel region on which a gate oxide film 61 is provided. A gate electrode 62 is provided on the gate oxide film 61 to form a gate structure 60 over the channel region. The above structure is the same as the normal MOS transistor. However, the improved MOS field effect transistor is further provided with low impurity concentration diffusion layers 81 doped with a p-type impurity at a lower concentration than an impurity concentration of the p-type semiconductor substrate 10. The low impurity concentration diffusion layers 81 are provided under the source/drain diffusion regions 54 so that tops of the low impurity concentration diffusion layers 81 are in contact with bottoms of the source/drain diffusion layers 54 to thereby reduce a p-n junction capacitance of the source/drain diffusion regions 54.

The capacitance of the source/drain diffusion layers 54 depends upon an impurity concentration of a peripheral semiconductor which is provided to be in contact therewith. A reduction of the impurity concentration of the peripheral semiconductor results in a reduction of the p-n junction capacitance of the source/drain diffusion regions. The low impurity concentration diffusion layers 81 are designed to have a reduced impurity concentration which is lower than the impurity concentration of the p-type semiconductor substrate 10 to reduce the capacitance of the source/drain diffusion regions 54. A considerable scaling down of the MOS field effect transistor leads to an increase in the impurity concentration of the source/drain diffusion regions 54. Such increase of the impurity concentration of the source/drain diffusion regions 54 may lead to an increase of the capacitance of the source/drain diffusion regions 54, if the source/drain diffusion regions 54 were surrounded by a semiconductor bulk region having not so lower impurity concentration, for example, the p-type semiconductor substrate 10. However, the low impurity concentration diffusion regions 81 having a lower impurity concentration than an impurity concentration of the p-type semiconductor substrate 10 may prevent an increase of and reduce the capacitance of the source/drain diffusion regions 54. This allows the MOS field effect transistor to show high speed and high frequency performances.

An appropriate impurity concentration of the low impurity concentration diffusion layers 81 is variable by the impurity concentration of the source/drain diffusion regions 54 increased by the scaling down of the MOS field effect transistor and should be determined to cause the source/drain diffusion regions 54 to have a suitable lower capacitance for allowing the MOS field effect transistor to show predetermined high speed and high frequency performances.

Figure 4A:
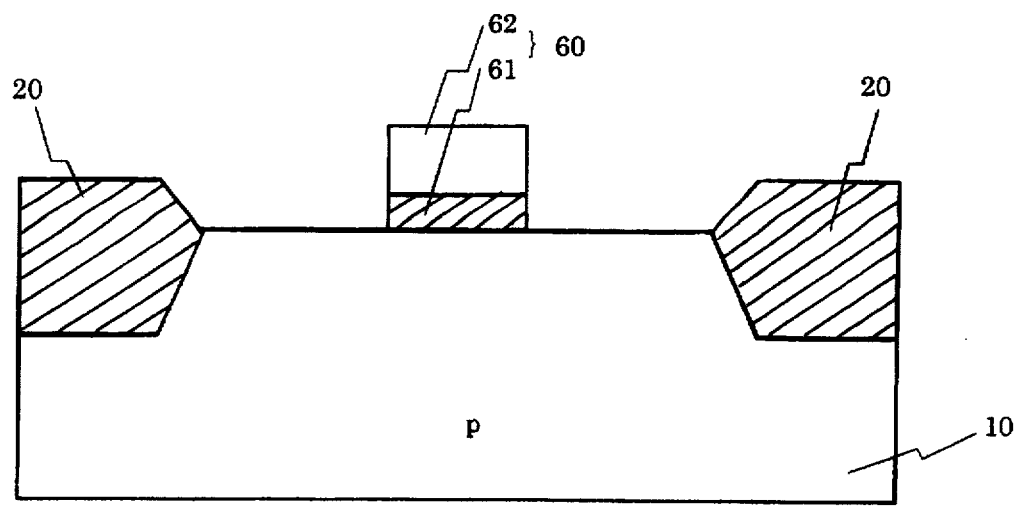
FIGS. 4A through 4C are cross sectional elevation views illustrative of MOS field effect transistors in sequential steps involved in a fabrication method thereof in a first embodiment according to the present invention.

The above improved MOS field effect transistor may be formed as follows. With reference to FIG. 4A, filed oxide films 20 are selectively formed by a thermal oxidation in a surface of a p-type semiconductor substrate 10. A gate oxide film 61 is formed on a predetermined channel region in a surface of the p-type semiconductor substrate 10. A gate electrode 62 made of polysilicon is formed on the gate oxide film 61 to form a gate structure 60.

Figure 4B:
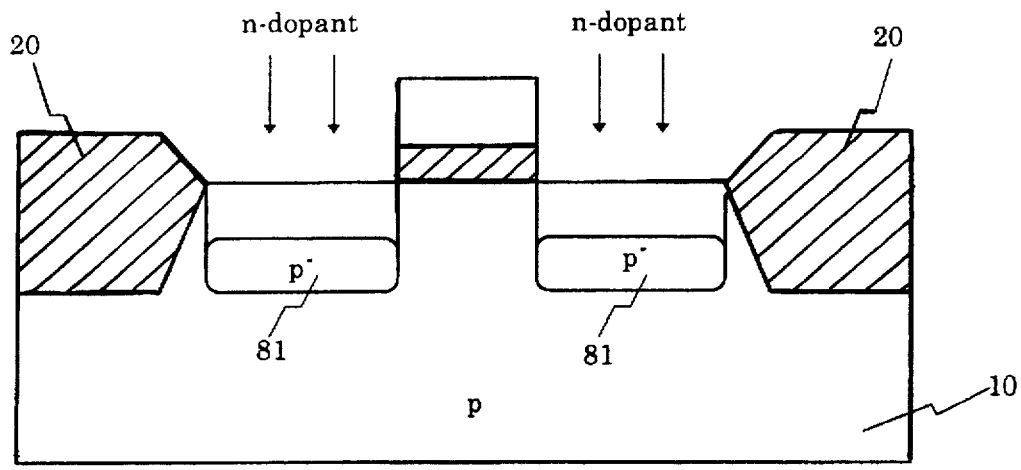

With reference to FIG. 4B, a high energy implantation of n-type dopant into the p-type semiconductor substrate 10 at a predetermined depth is carried out by using the gate structure 60 and the field oxide films 20 as masks at a high energy to form p$^-$-type low impurity concentration diffusion regions 81 in a deep level from the surface of the p-type semiconductor substrate 10. The implantation of the n-type impurity reduces a p-type impurity concentration of the p-type semiconductor substrate 10 to thereby form the p-type low impurity concentration diffusion layers. The energy, at which the impurity implantation was carried out, determines a depth in level where the low impurity concentration diffusion layers 81 are provided. The depth in level of the low impurity concentration diffusion layers 81 may be controlled by controlling the energy at which the implantation of the impurity was carried out so that a top level of the low impurity concentration diffusion layers 81 corresponds to a bottom level of a source/drain diffusion regions 54, which will be formed hereafter. A heat treatment may optionally be carried out to follow the high impurity implantation process to cause an impurity diffusion thereby the low energy impurity concentration diffusion layers 81 are activated.

Figure 4C:
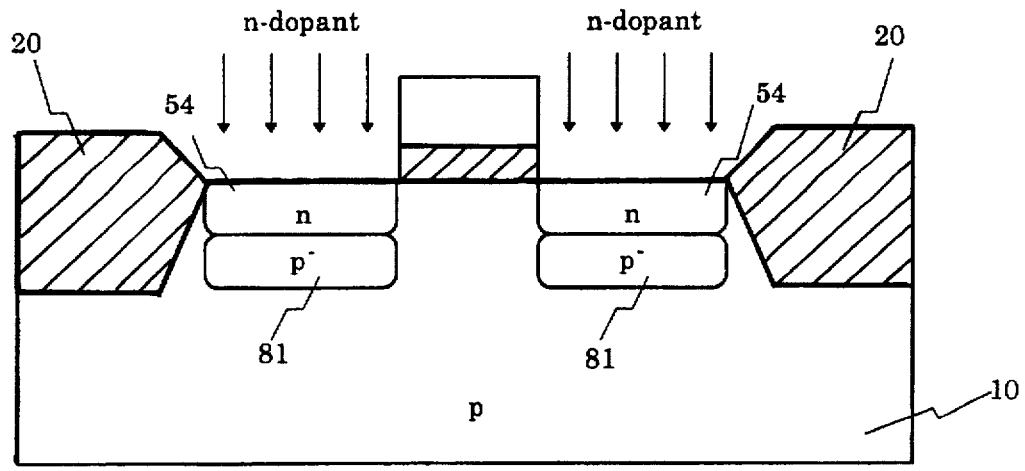

With reference to FIG. 4C, a low energy implantation of n-type impurity into a surface region of the p-type semiconductor substrate 10 is carried out by using the gate structure 60 and the field oxide films 20 as masks to form n-type source/drain diffusion regions 54 on the low impurity concentration diffusion layers 81 at an implantation energy to have a bottom level of the source/drain diffusion regions 54 corresponds to the top level of the low impurity concentration diffusion layers 81. An impurity concentration of the source/drain diffusion regions 54 is determined according to the scaling down law of MOS field effect transistor. A large scaling down of the MOS field effect transistor requires a large increase of the impurity concentration of the of the source/drain diffusion regions 54. The energy for impurity implantation is determined to have the bottom level of the source/drain diffusion regions 54 correspond to the top level of the low impurity concentration diffusion layers 81. A heat treatment is carried out to follow the low energy impurity implantation process to cause an impurity diffusion thereby the source/drain diffusion regions 54 are activated.

The impurity concentration of the source/drain diffusion layers 54 may, for example, be approximately $1\times10^{20}$ atoms/cm$^3$ and the low impurity concentration diffusion layers 81 may be approximately $1\times10^{15}$ atoms/cm$^3$.

As a modification of this embodiment, the high energy implantation process for forming the low impurity concentration diffusion regions 81 may be carried out to follow the low energy impurity implantation for forming the source/drain diffusion regions 54.

As a further modification of this embodiment, the impurity types of the source/drain diffusion regions and the semiconductor substrate as well as the low impurity concentration diffusion layers may be inverted. Namely, the invention described above may be applicable to a p-channel MOS field effect transistor.

As a furthermore modification of this embodiment, the gate structure 60 may advantageously include gate side wall oxide films just under which lightly doped diffusion regions are provided for relaxation of field concentrations between the gate electrode 62 and source/drain diffusion regions 54. Such structure may particularly be useful for a small size MOS field effect transistor having source/drain diffusion regions having higher impurity concentrations raised up according to the scaling down low of MOSFET.

A second embodiment according to the present invention will be described in which improved CMOS field effect transistors are provided. The present invention may be applicable to the CMOS field effect transistors. A structure of the improved CMOS field effect transistors will be described with reference to FIG. 5. A p-type semiconductor substrate 10 has an n-type well region within which a p-channel MOS field effect transistor and a p-type region other than the n-type well region 32 so that an n-channel MOS field effect transistor is formed in the p-type region of the semiconductor substrate 10. Field oxide films 20 are selectively provided in a surface of a p-type semiconductor substrate to define active regions in the n-type well region 32 and in the p-type region of the substrate 10. A channel stopper is provided under the field oxide film 20 extend over a boundary of the n-type well region and the p-type region of the substrate 10.

As to the n-channel MOS field effect transistor provided in the p-type region of the substrate 10, n-type source/drain diffusion regions 54 are provided in a surface of the p-type region of the substrate 10 to define an n-channel region on which a gate oxide film 61 is provided. A gate electrode, which may be made of polysilicon, is provided on the gate oxide film 61 to form a gate structure 60 over the n-channel region of the MOS field effect transistor. Low impurity concentration diffusion layers 81 doped with a p-type impurity at a lower concentration than an impurity concentration of the p-type region of the substrate 10. The low impurity concentration diffusion layers 81 are provided under the source/drain diffusion regions 54 so that tops of the low impurity concentration diffusion layers 81 are in contact with bottoms of the source/drain diffusion layers 54 to thereby reduce a p-n junction capacitance of the source/drain diffusion regions 54.

As to the p-channel MOS field effect transistor provided in the n-type well region 32, p-type source/drain diffusion regions 44 are provided in a surface of the n-type well region 32 to define a p-channel region on which a gate oxide film 61 is provided. A gate electrode, which may be made of polysilicon, is provided on the gate oxide film 61 to form a gate structure 60 over the n-channel region of the MOS field effect transistor. Low impurity concentration diffusion layers 82 doped with an n-type impurity at a lower concentration than an impurity concentration of the n-type well region 32. The low impurity concentration diffusion layers 82 are provided under the source/drain diffusion regions 44 so that tops of the low impurity concentration diffusion layers 82 are in contact with bottoms of the source/drain diffusion layers 44 to thereby reduce a p-n junction capacitance of the source/drain diffusion regions 44.

The capacitances of the source/drain diffusion layers 54 and 44 depend upon impurity concentrations of peripheral semiconductors which are provided to be in contact therewith, for example, the low impurity concentration diffusion layers 81 and 82. A reduction of the impurity concentration of the peripheral semiconductor results in a reduction of the p-n junction capacitance of the source/drain diffusion regions. The low impurity concentration diffusion layers 81 and 82 are designed to have reduced impurity concentrations which are lower than the impurity concentrations of the p-type region of the semiconductor substrate 10 and of the n-type well region 32 respectively to reduce the capacitances of the source/drain diffusion regions 54 and 44. A considerable scaling down of the p-channel and n-channel MOS field effect transistors leads to an increase in the impurity concentration of the source/drain diffusion regions 54 and 44. Such increase of the impurity concentration of the source/drain diffusion regions 54 and 44 may lead to an increase of the capacitance of the source/drain diffusion regions 54 and 44, if the source/drain diffusion regions 54 44 were surrounded by semiconductor bulk regions having not so lower impurity concentration, for example, the p-type region of the semiconductor substrate 10 and the n-type well region 32. However, the low impurity concentration diffusion regions 81 and 82 having lower impurity concentrations than impurity concentrations of the p-type region of the semiconductor substrate 10 and of the n-type well region 32 may prevent an increase of and reduce the capacitance of the source/drain diffusion regions 54 and 44. This allows the n-channel and p-channel MOS field effect transistors to show high speed and high frequency performances.

Appropriate impurity concentrations of the low impurity concentration diffusion layers 81 and 82 are variable by the impurity concentrations of the source/drain diffusion regions 54 and 44 increased by the scaling down of the n-channel and p-channel MOS field effect transistors and should be determined to cause the source/drain diffusion regions 54 and 44 to have suitable lower capacitances for allowing the n-channel and p-channel MOS field effect transistors to show predetermined high speed and high frequency performances.

Figure 6A:
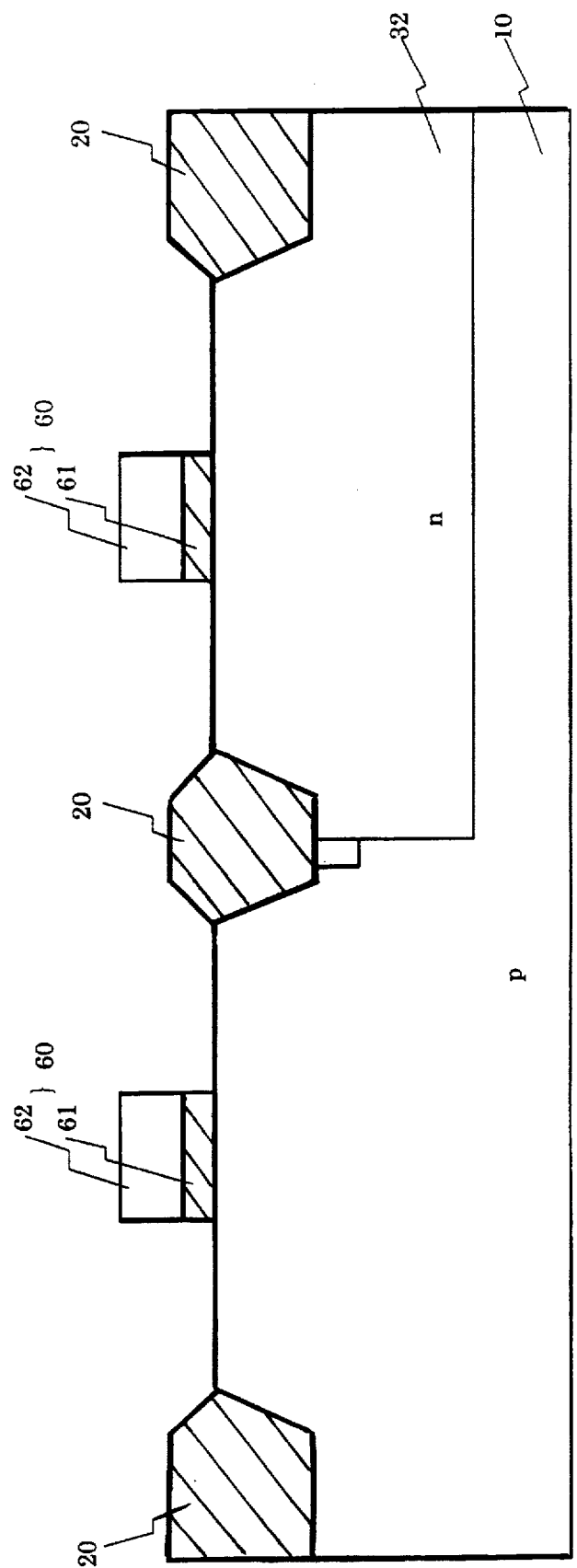
FIGS. 6A through 6C are cross sectional elevation views illustrative of MOS field effect transistors in sequential steps involved in a fabrication method thereof in a second embodiment according to the present invention.

The above improved CMOS field effect transistors may be formed as follows. With reference to FIG. 6A, filed oxide films 20 are selectively formed by a thermal oxidation in a surface of a p-type semiconductor substrate 10 including a n-type well region 32 so that the n-type well region 32 is separated at its surface from the p-type region of the substrate 10. Gate oxide films 61 are formed on predetermined channel regions in a surface of the p-type region of the semiconductor substrate 10 and a surface of the n-type well region 32. Gate electrodes 62 made of polysilicon are formed on the gate oxide films 61 to form gate structures 60 over the p-type region of the semiconductor substrate 10 and the n-type well region 32.

Figure 6B:
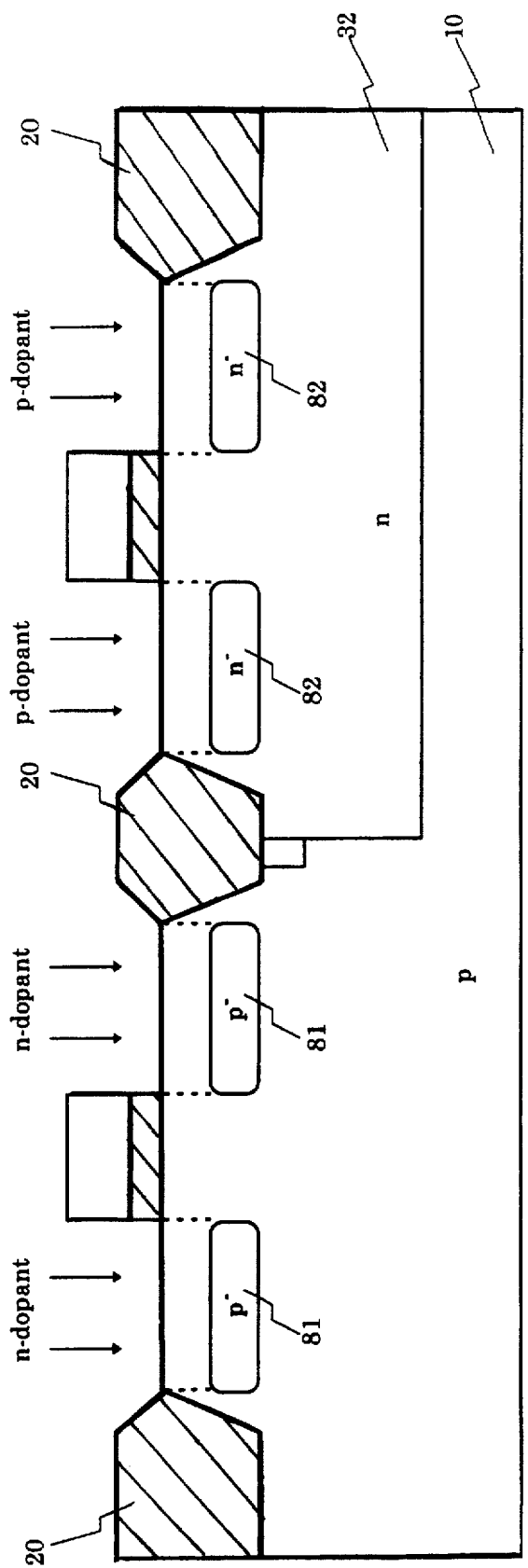

With reference to FIG. 6B, high energy implantations of n-type impurity and p-type impurity into the p-type region of the semiconductor substrate 10 and the n-type well region 32 respectively are carried out by using the gate structures 60 and the field oxide films 20 as masks at a high energy to form p$^-$-type and n$^-$-type low impurity concentration diffusion regions 81 and 82 at a deep level from the surface of the p-type region of the semiconductor substrate 10 and the n-type well region 32. The implantations of the n-type and n-type impurities reduce a p-type impurity concentration of the p-type region of the semiconductor substrate 10 and the n-type well region 32 to thereby form the p-type and n-type low impurity concentration diffusion layers 82. The energy, at which the impurity implantation was carried out, determines a depth in level where the low impurity concentration diffusion layers 81 and 82 are provided. The depth in level of the low impurity concentration diffusion layers 81 and 82 may be controlled by controlling the energy at which the implantations of the both types impurities are carried out so that top levels of the low impurity concentration diffusion layers 81 and 82 correspond to bottom levels of source/drain diffusion regions 54 and 44 respectively, which will be formed hereafter. A heat treatment may optionally be carried out to follow the high impurity implantation processes to cause an impurity diffusion thereby the low energy impurity concentration diffusion layers 81 and 82 are activated.

Figure 6C:
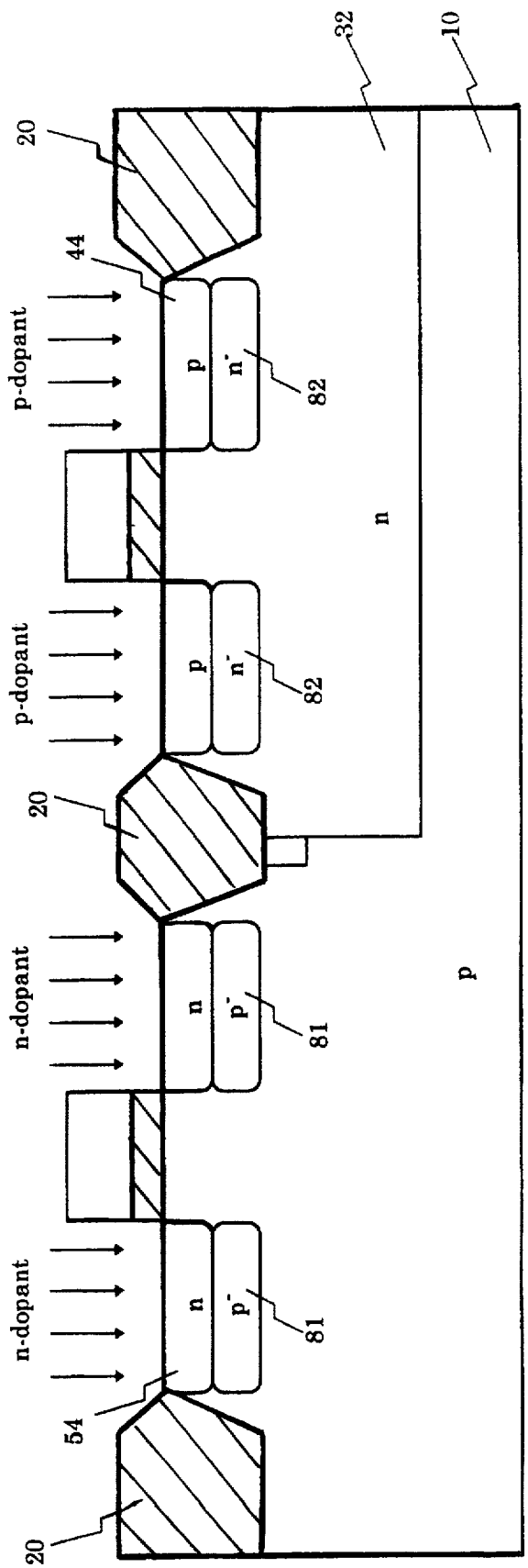

With reference to FIG. 6C, low energy implantations of n-type and p-type impurities into surfaces of the p-type region of the semiconductor substrate 10 and the n-type well region 82 respectively are carried out by using the gate structures 60 and the field oxide films 20 as masks to form n-type and p-type source/drain diffusion regions 54 and 44 on the low impurity concentration diffusion layers 81 and 82 respectively at an implantation energy to have bottom levels of the source/drain diffusion regions 54 and 44 correspond to top levels of the low impurity concentration diffusion layers 81 and 82 respectively. Impurity concentrations of the source/drain diffusion regions are determined according to the scaling down law of MOS field effect transistor. A large scaling down of the MOS field effect transistor requires a large increase of the impurity concentrations the of the source/drain diffusion regions 54 and 44. The energies for impurity implantations are determined to have the bottom levels of the source/drain diffusion regions 54 and 44 correspond to the top levels of the low impurity concentration diffusion layers 81 and 82. A heat treatment is carried out to follow the low energy impurity implantation processes to cause impurity diffusions thereby the source/drain diffusion regions 54 and 44 are activated.

The impurity concentrations of the source/drain diffusion layers 54 and 44 may, for example, be approximately $1\times10^{20}$ atoms/cm$^3$ and the p-type and n-type low impurity concentration diffusion layers 81 may be approximately $1\times10^{15}$ atoms/cm$^3$ and $1\times10^{16}$ atoms/cm$^3$ respectively.

As a modification of this embodiment, the high energy implantation process for forming the p-type and n-type low impurity concentration diffusion regions 81 and 82 may be carried out to follow the low energy impurity implantations for forming the n-type and p-type source/drain diffusion regions 54 and 44.

As a further modification of this embodiment, the impurity types of the source/drain diffusion regions and the semiconductor substrate as well as the low impurity concentration diffusion layers and the well region may be inverted. Namely, the above present invention may be applicable to the CMOS transistors wherein the n-channel MOS field effect transistor is formed in a p-type well region and the p-type channel MOS field effect transistor is formed in an n-type region of the n-type semiconductor substrate 10.

As a furthermore modification of this embodiment, the gate structure 60 may advantageously include gate side wall oxide films just under which lightly doped diffusion regions are provided for relaxation of field concentrations between the gate electrode 62 and source/drain diffusion regions 54. Such structure may particularly be useful for a small size MOS field effect transistor having source/drain diffusion regions having higher impurity concentrations raised up according to the scaling down low of MOSFET.

Figure 7:
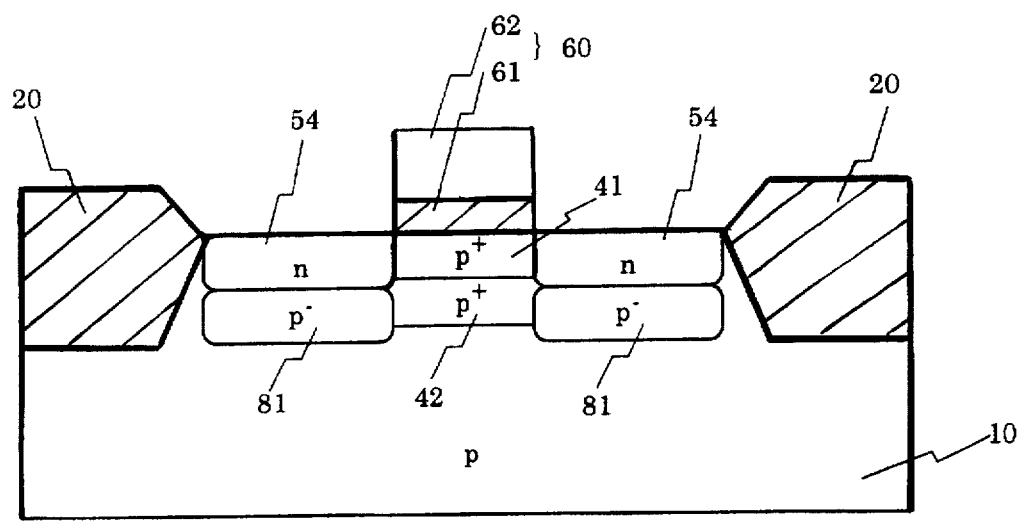
FIG. 7 is a cross sectional elevation view illustrative of a novel structure of a MOS field effect transistor in a third embodiment according to the present invention.

A third embodiment according to the present invention will be described in which another n-channel MOS field effect transistor having low impurity concentration diffusion layers for reducing a capacitance of the source/drain diffusion regions. A structure of the MOS field effect transistor is illustrated in FIG. 7. Field oxide films 20 are selectively provided in a surface of a p-type semiconductor substrate 10 to define an active region in the surface of the p-type semiconductor substrate 10. Source/drain diffusion regions 54 doped with an n-type dopant are selectively provided in the surface active region to define a channel region on which a gate oxide film 61 is provided. A gate electrode 62 is provided on the gate oxide film 61 to form a gate structure 60 over the channel region. The above structure is the same as the normal MOS transistor. However, the improved MOS field effect transistor is further provided with low impurity concentration diffusion layers 81 doped with a p-type impurity at a lower concentration than an impurity concentration of the p-type semiconductor substrate 10. The low impurity concentration diffusion layers 81 are provided under the source/drain diffusion regions 54 so that tops of the low impurity concentration diffusion layers 81 are in contact with bottoms of the source/drain diffusion layers 54 to thereby reduce a p-n junction capacitance of the source/drain diffusion regions 54. There is further provided between the source/drain diffusion regions 54 a high impurity concentration channel region 41 doped with a p-type impurity at a higher impurity concentration than the impurity concentration of the p-type semiconductor substrate 10. There is furthermore provided, just under the high impurity concentration channel region 41, a high impurity concentration bottom region 42 doped with a p-type impurity at a higher concentration than the impurity concentration of the p-type semiconductor substrate 10. The p-type high impurity concentration channel region 41 is electrically connect ed through the p-type high impurity concentration bottom region 42 to the p-type semiconductor substrate 10 so that a potential of the p-type high impurity concentration channel region 41 may be controlled by controlling a potential of the p-type semiconductor substrate 10 which may optionally be provided with a substrate electrode not illustrated for receiving a substrate potential control voltage.

The capacitance of the source/drain diffusion layers 54 depends upon an impurity concentration of a peripheral semiconductor which is provided to be in contact therewith. A reduction of the impurity concentration of the peripheral semiconductor results in a reduction of the p-n junction capacitance of the source/drain diffusion regions. The low impurity concentration diffusion layers 81 are designed to have a reduced impurity concentration which is lower than the impurity concentration of the p-type semiconductor substrate 10 to reduce the capacitance of the source/drain diffusion regions 54. This allows the MOS field effect transistor to show high speed and high frequency performances.

An appropriate impurity concentration of the low impurity concentration diffusion layers 81 is variable by the impurity concentration of the source/drain diffusion regions 54 increased by the scaling down of the MOS field effect transistor and should be determined to cause the source/drain diffusion regions 54 to have a suitable lower capacitance for allowing the MOS field effect transistor to show predetermined high speed and high frequency performances.

Figure 8A:
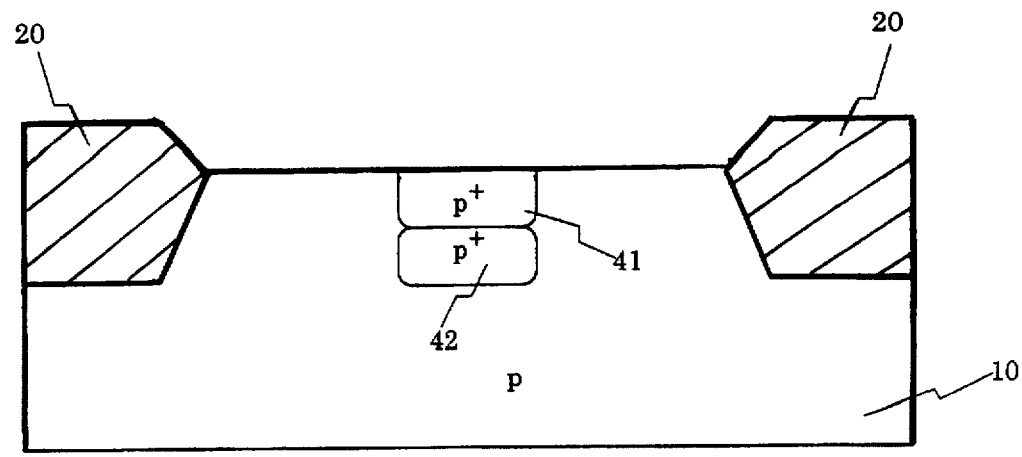
FIGS. 8A through 8D are cross sectional elevation views illustrative of MOS field effect transistors in sequential steps involved in a fabrication method thereof in a third embodiment according to the present invention.

The above improved MOS field effect transistor may be formed as follows. With reference to FIG. 8A, filed oxide films 20 are selectively formed by a thermal oxidation in a surface of a p-type semiconductor substrate 10. A p-type high impurity concentration channel region 41 and a p-type high impurity concentration bottom region 42 are formed by selective implantation of p-type impurity but at different energies. An implantation energy for forming the high impurity concentration channel region 41 is lower than an implantation energy for forming the high impurity concentration bottom region 42 provided just under the high impurity concentration channel region 41. The order in forming the p-type high impurity concentration channel region 41 and the p-type high impurity concentration bottom region 42 is variable.

Figure 8B:
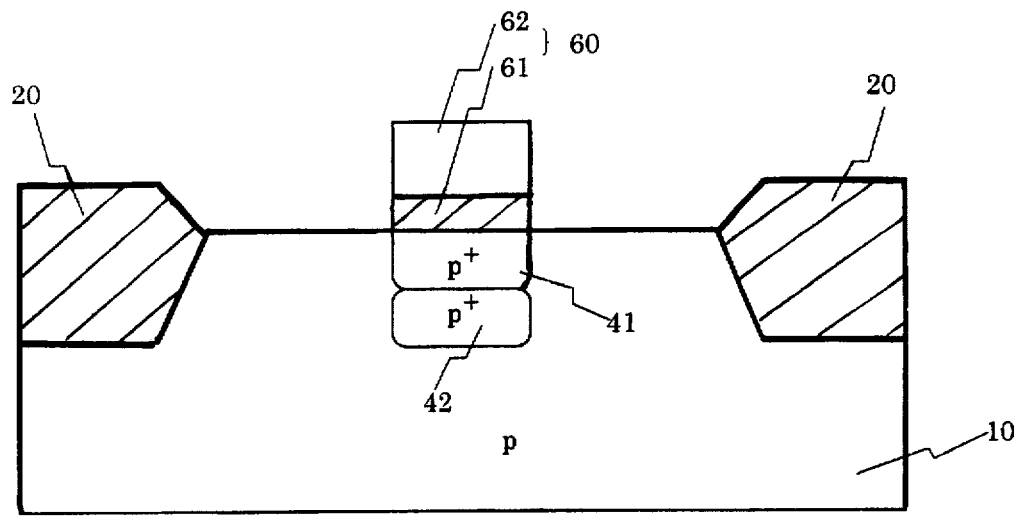

With reference to FIG. 8B, a gate oxide film 61 is formed on the p-type impurity concentration channel region 41. A gate electrode 62 made of polysilicon is formed on the gate oxide film 61 to form a gate structure 60.

Figure 8C:
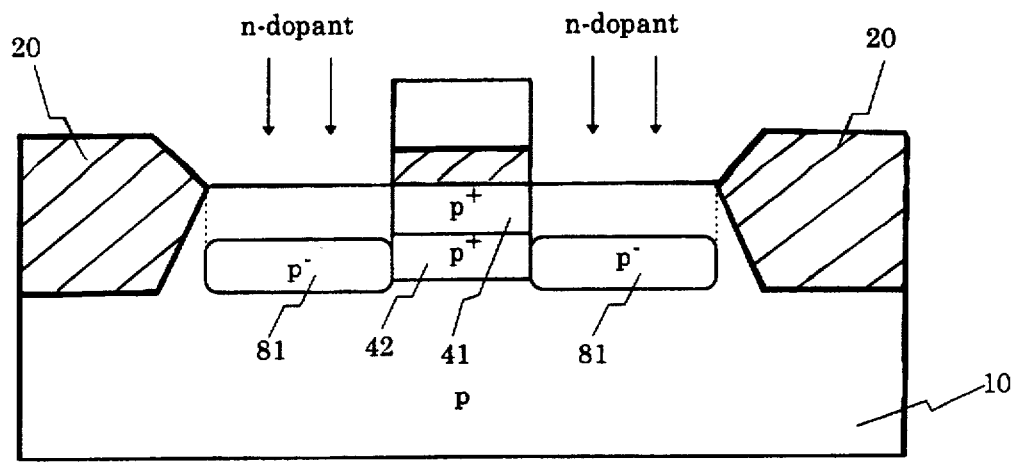

With reference to FIG. 8C, a high energy implantation of n-type dopant into the p-type semiconductor substrate 10 at a predetermined depth is carried out by using the gate structure 60 and the field oxide films 20 as masks at a high energy to form p⁻-type low impurity concentration diffusion regions 81 in a deep level from the surface of the p-type semiconductor substrate 10. The implantation of the n-type impurity reduces a p-type impurity concentration of the p-type semiconductor substrate 10 to thereby form the p-type low impurity concentration diffusion layers. The energy, at which the impurity implantation was carried out, determines a depth in level where the low impurity concentration diffusion layers 81 are provided. The depth in level of the low impurity concentration diffusion layers 81 may be controlled by controlling the energy at which the implantation of the impurity was carried out so that a top level of the low impurity concentration diffusion layers 81 corresponds to a bottom level of a source/drain diffusion regions 54, which will be formed hereafter. A heat treatment may optionally be carried out to follow the high impurity implantation process to cause an impurity diffusion thereby the low energy impurity concentration diffusion layers 81 are activated.

Figure 8D:
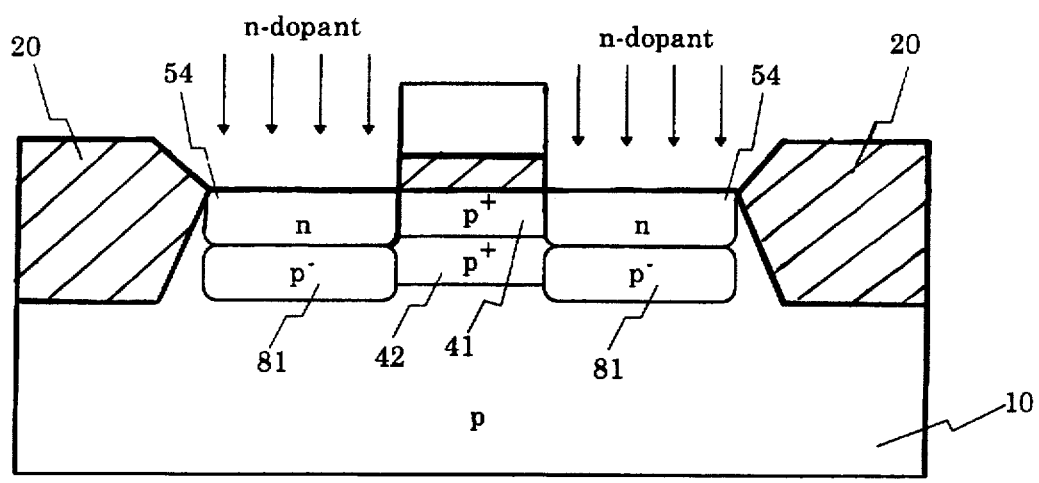

With reference to FIG. 8D, a low energy implantation of n-type impurity into a surface region of the p-type semiconductor substrate 10 is carried out by using the gate structure 60 and the field oxide films 20 as masks to form n-type source/drain diffusion regions 54 on the low impurity concentration diffusion layers 81 at an implantation energy to have a bottom level of the source/drain diffusion regions 54 corresponds to the top level of the low impurity concentration diffusion layers 81. An impurity concentration of the source/drain diffusion regions 54 is determined according to the scaling down law of MOS field effect transistor. A large scaling down of the MOS field effect transistor requires a large increase of the impurity concentration the of the source/drain diffusion regions 54. The energy for impurity implantation is determined to have the bottom level of the source/drain diffusion regions 54 correspond to the top level of the low impurity concentration diffusion layers 81. A heat treatment is carried out to follow the low energy impurity implantation process to cause an impurity diffusion thereby the source/drain diffusion regions 54 are activated.

The impurity concentration of the source/drain diffusion layers 54 may, for example, be approximately $1 \times 10^{20}$ atoms/cm$^3$ and the low impurity concentration diffusion layers 81 may be approximately $1 \times 10^{15}$ atoms/cm$^3$.

As a modification of this embodiment, the high energy implantation process for forming the low impurity concentration diffusion regions 81 may be carried out to follow the low energy impurity implantation for forming the source/drain diffusion regions 54.

As a further modification of this embodiment, the impurity types of the source/drain diffusion regions and the semiconductor substrate as well as the low impurity concentration diffusion layers may be inverted. Namely, the invention described above may be applicable to a p-channel MOS field effect transistor.

As a furthermore modification of this embodiment, the gate structure 60 may advantageously include gate side wall oxide films just under which lightly doped diffusion regions are provided for relaxation of field concentrations between the gate electrode 62 and source/drain diffusion regions 54. Such structure may particularly be useful for a small size MOS field effect transistor having source/drain diffusion regions having higher impurity concentrations raised up according to the scaling down low of MOSFET.

Figure 9:
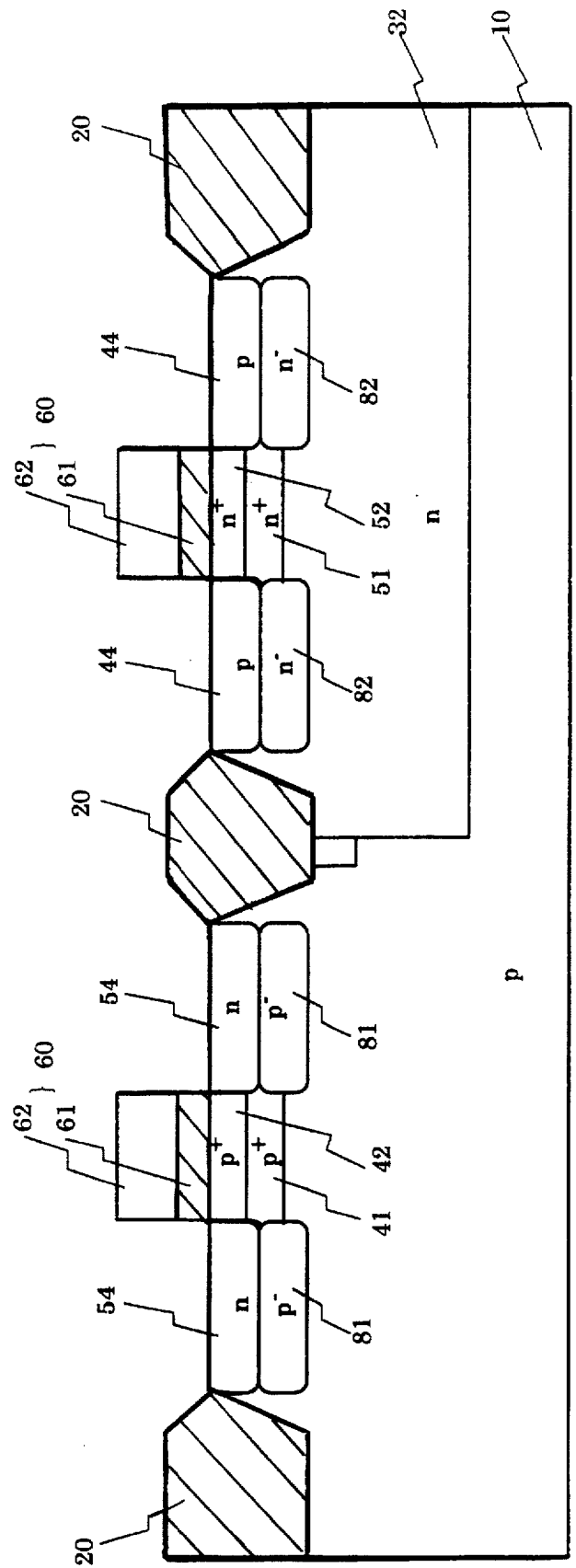
FIG. 9 is a cross sectional elevation view illustrative of a novel structure of a MOS field effect transistor in a fourth embodiment according to the present invention.

A fourth embodiment according to the present invention will be described in which improved CMOS field effect transistors are provided. The present invention may be applicable to the CMOS field effect transistors. A structure of the improved CMOS field effect transistors will be described with reference to FIG. 9. A p-type semiconductor substrate 10 has an n-type well region within which a p-channel MOS field effect transistor and a p-type region other than the n-type well region 32 so that an n-channel MOS field effect transistor is formed in the p-type region of the semiconductor substrate 10. Field oxide films 20 are selectively provided in a surface of a p-type semiconductor substrate to define active regions in the n-type well region 32 and in the p-type region of the substrate 10. A channel stopper is provided under the field oxide film 20 extend over a boundary of the n-type well region and the p-type region of the substrate 10.

As to the n-channel MOS field effect transistor provided in the p-type region of the substrate 10, n-type source/drain diffusion regions 54 are provided in a surface of the p-type region of the substrate 10 to define an n-channel region on which a gate oxide film 61 is provided. A gate electrode, which may be made of polysilicon, is provided on the gate oxide film 61 to form a gate structure 60 over the n-channel region of the MOS field effect transistor. Low impurity concentration diffusion layers 81 doped with a p-type impurity at a lower concentration than an impurity concentration of the p-type region of the substrate 10. The low impurity concentration diffusion layers 81 are provided under the source/drain diffusion regions 54 so that tops of the low impurity concentration diffusion layers 81 are in contact with bottoms of the source/drain diffusion layers 54 to thereby reduce a p-n junction capacitance of the source/drain diffusion regions 54.

There is further provided between the source/drain diffusion regions 54 a high impurity concentration channel region 41 doped with a p-type impurity at a higher impurity concentration than the impurity concentration of the p-type semiconductor substrate 10. There is furthermore provided, just under the high impurity concentration channel region 41, a high impurity concentration bottom region 42 doped with a p-type impurity at a higher concentration than the impurity concentration of the p-type semiconductor substrate 10. The p-type high impurity concentration channel region 41 is electrically connected through the p-type high impurity concentration bottom region 42 to the p-type semiconductor substrate 10 so that a potential of the p-type high impurity concentration channel region 41 may be controlled by controlling a potential of the p-type semiconductor substrate 10 which may optionally be provided with a substrate electrode not illustrated for receiving a substrate potential control voltage.

As to the p-channel MOS field effect transistor provided in the n-type well region 32, p-type source/drain diffusion regions 44 are provided in a surface of the n-type well region 32 to define a p-channel region on which a gate oxide film 61 is provided. A gate electrode, which may be made of polysilicon, is provided on the gate oxide film 61 to form a gate structure 60 over the n-channel region of the MOS field effect transistor. Low impurity concentration diffusion layers 82 doped with an n-type impurity at a lower concentration than an impurity concentration of the n-type well region 32. The low impurity concentration diffusion layers 82 are provided under the source/drain diffusion regions 44 so that tops of the low impurity concentration diffusion layers 82 are in contact with bottoms of the source/drain diffusion layers 44 to thereby reduce a p-n junction capacitance of the source/drain diffusion regions 44.

There is further provided between the source/drain diffusion regions 44 a high impurity concentration channel region 51 doped with an n-type impurity at a higher impurity concentration than the impurity concentration of the n-type well region 32. There is furthermore provided, just under the high impurity concentration channel region 51, a high impurity concentration bottom region 52 doped with an n-type impurity at a higher concentration than the impurity concentration of the n-type well region 32. The n-type high impurity concentration channel region 51 is electrically connected through the n-type high impurity concentration bottom region 52 to the n-type well region 32 so that a potential of the n-type high impurity concentration channel region 51 may be controlled by controlling a potential of the n-type well region which may optionally be provided with an electrode via through hole both of which are not illustrated for receiving a substrate potential control voltage.

For the reasons described in the second embodiment, the p-type and n-type low impurity concentration diffusion layers 81 and 82 may reduce the individual p-n junction capacitance of the n-type and p-type source/drain diffusion regions 54 and 44 to thereby permit the CMOS device to show high speed and high frequency performances.

Appropriate impurity concentrations of the low impurity concentration diffusion layers 81 and 82 are variable by the impurity concentrations of the source/drain diffusion regions 54 and 44 increased by the scaling down of the n-channel and p-channel MOS field effect transistors and should be determined to cause the source/drain diffusion regions 54 and 44 to have suitable lower capacitances for allowing the n-channel and p-channel MOS field effect transistors to show predetermined high speed and high frequency performances.

Figure 10A:
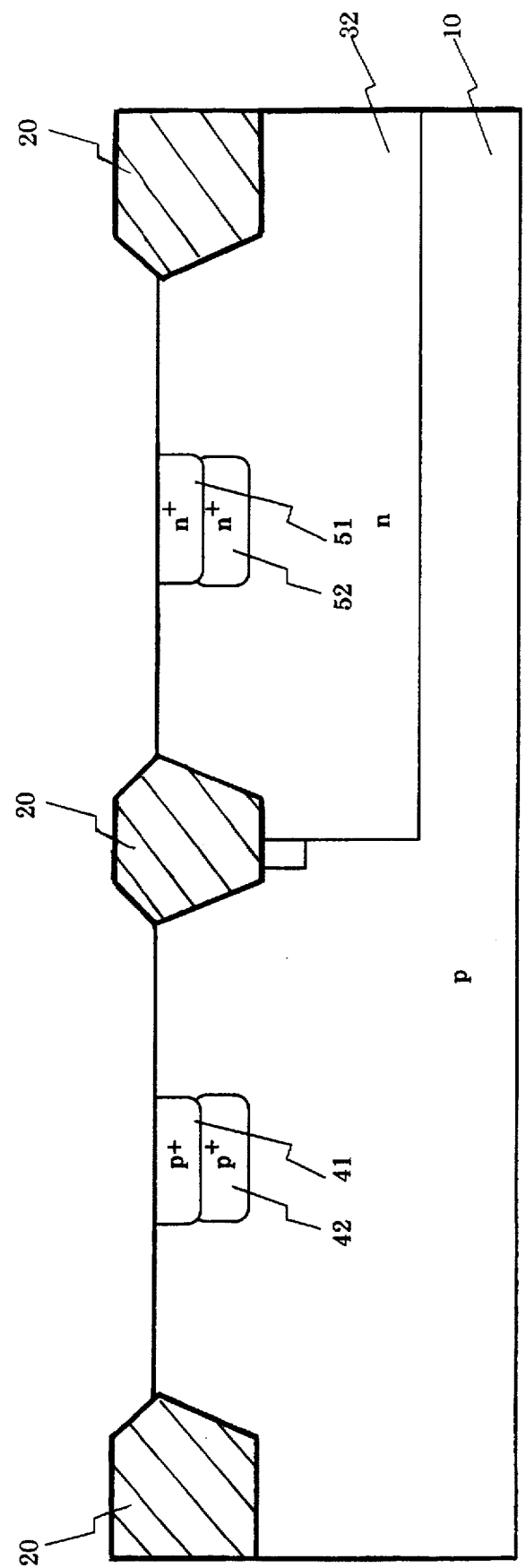
FIGS. 10A through 10D are cross sectional elevation views illustrative of MOS field effect transistors in sequential steps involved in a fabrication method thereof in a fourth embodiment according to the present invention.

The above improved CMOS field effect transistors may be formed as follows. With reference to FIG. 10A, filed oxide films 20 are selectively formed by a thermal oxidation in a surface of a p-type semiconductor substrate 10 including a n-type well region 32. A p-type high impurity concentration channel region 41 and a p-type high impurity concentration bottom region 42 are formed in a surface of the p-type region of the semiconductor substrate 10 by selective implantation of p-type impurity but at different energies. An n-type high impurity concentration channel region 51 and an n-type high impurity concentration bottom region 52 are formed in a surface of the n-type well region 32 in the semiconductor substrate 10 by selective implantation of n-type impurity but at different energies. An implantation energy for forming the high impurity concentration channel regions 41 and 51 is lower than an implantation energy for forming the high impurity concentration bottom regions 42 and 52 provided just under the high impurity concentration channel regions 41 and 51 respectively. The order in forming the high impurity concentration channel regions 41 and 51 and the high impurity concentration bottom regions 42 and 52 is variable.

Figure 10B:
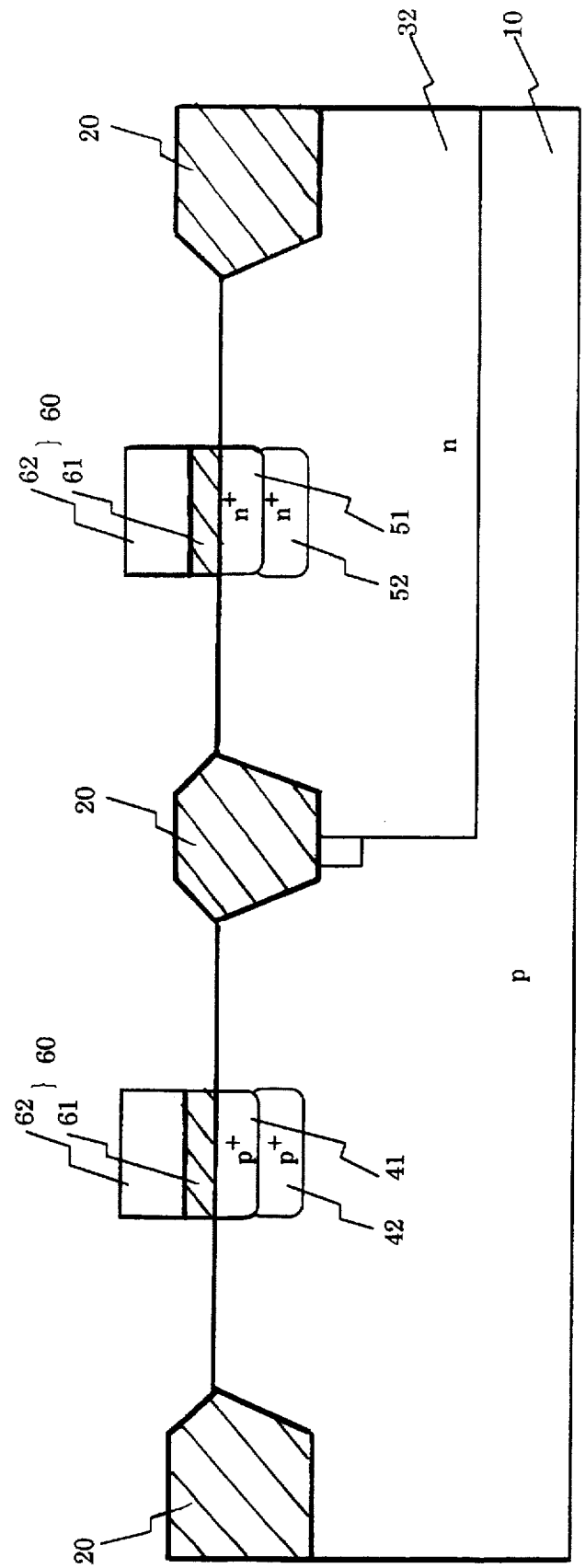

With reference to FIG. 10B, gate oxide films 61 are formed on the p-type and n-type high impurity concentration channel regions 41 and 51. Gate electrodes 62 made of polysilicon are formed on the gate oxide films 61 to form gate structures 60 over the p-type region of the semiconductor substrate 10 and the n-type well region 32.

Figure 10C:
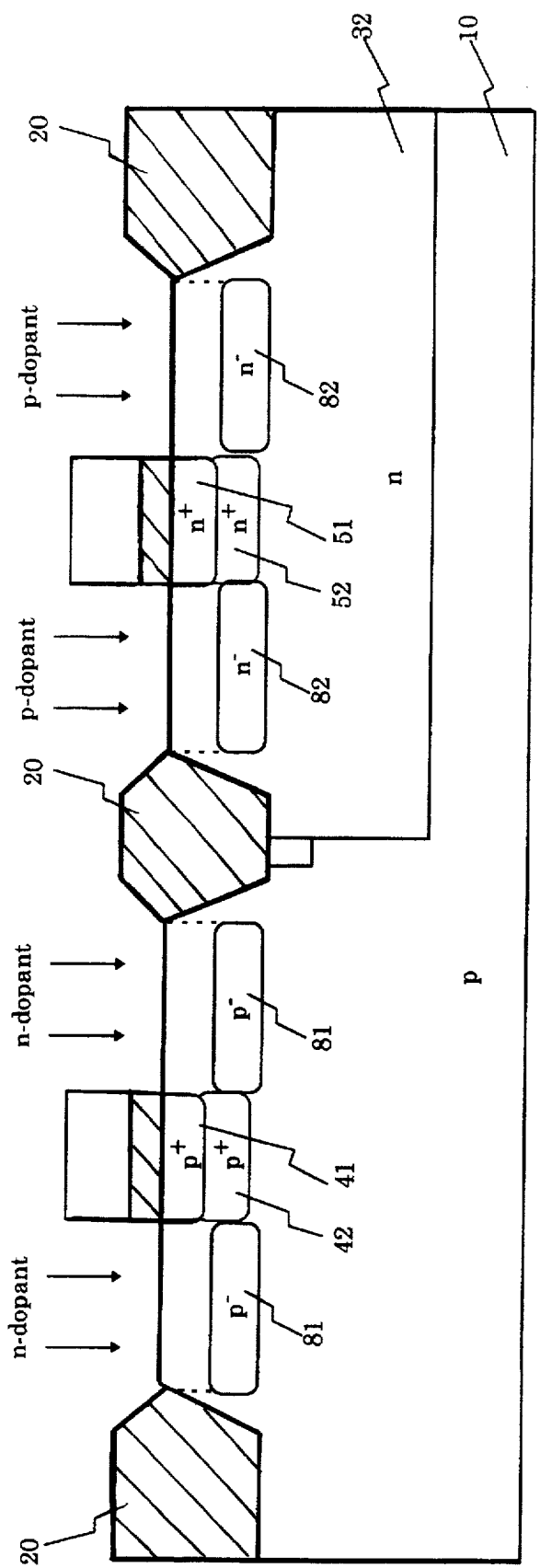

With reference to FIG. 10C, high energy implantations of n-type impurity and p-type impurity into the p-type region of the semiconductor substrate 10 and the n-type well region 32 respectively are carried out by using the gate structures 60 and the field oxide films 20 as masks at a high energy to form p⁻-type and n⁻-type low impurity concentration diffusion regions 81 and 82.

Figure 10D:
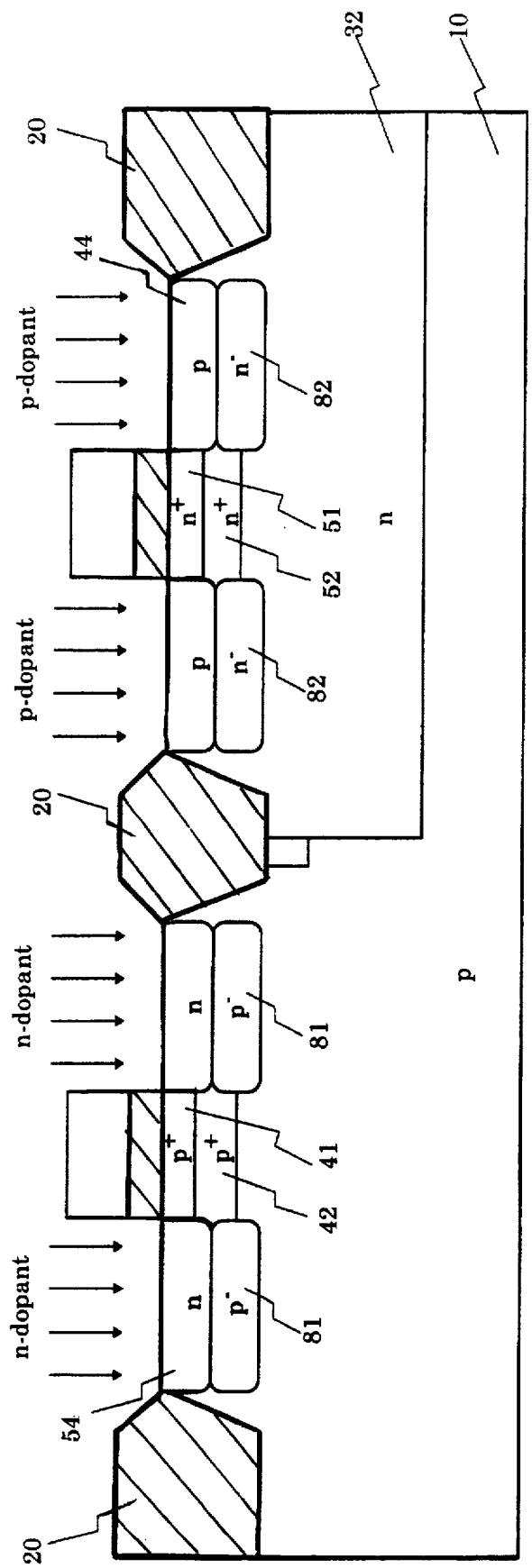

With reference to FIG. 10D, low energy implantations of n-type and p-type impurities into surfaces of the p-type region of the semiconductor substrate 10 and the n-type well region 82 respectively are carried out by using the gate structures 60 and the field oxide films 20 as masks to form n-type and p-type source/drain diffusion regions 54 and 44 on the low impurity concentration diffusion layers 81 and 82 respectively. A heat treatment is carried out to follow the low energy impurity implantation processes to cause impurity diffusions thereby the source/drain diffusion regions 54 and 44 are activated.

The impurity concentrations of the source/drain diffusion layers 54 and 44 may, for example, be approximately $1 \times 10^{20}$ atoms/cm$^3$ and the p-type and n-type low impurity concentration diffusion layers 81 may be approximately $1 \times 10^{15}$ atoms/cm$^3$ and $1 \times 10^{16}$ atoms/cm$^3$ respectively.

As a modification of this embodiment, the high energy implantation process for forming the p-type and n-type low impurity concentration diffusion regions 81 and 82 may be carried out to follow the low energy impurity implantations for forming the n-type and p-type source/drain diffusion regions 54 and 44.

As a further modification of this embodiment, the impurity types of the source/drain diffusion regions and the semiconductor substrate as well as the low impurity concentration diffusion layers and the well region may be inverted. Namely, the above present invention may be applicable to the CMOS transistors wherein the n-channel MOS field effect transistor is formed in a p-type well region and the p-type channel MOS field effect transistor is formed in an n-type region of the n-type semiconductor substrate 10.

As a furthermore modification of this embodiment, the gate structure 60 may advantageously include gate side wall oxide films just under which lightly doped diffusion regions are provided for relaxation of field concentrations between the gate electrode 62 and source/drain diffusion regions. Such structure may particularly be useful for a small size MOS field effect transistor having source/drain diffusion regions having higher impurity concentrations raised up according to the scaling down low of MOSFET.

Figure 11A:
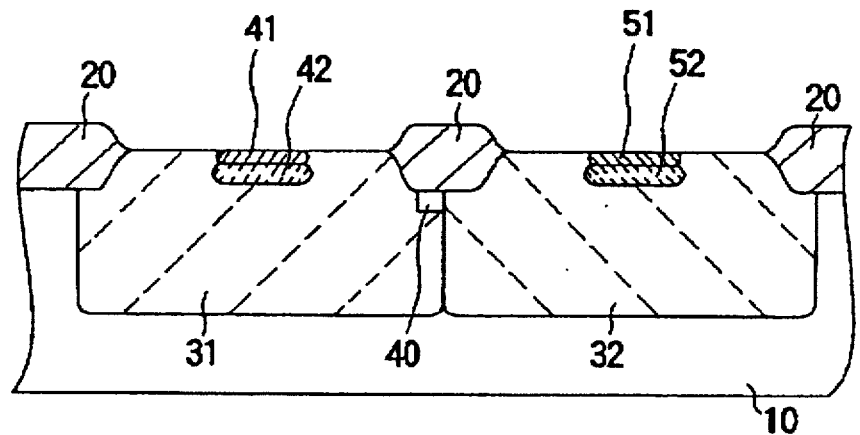
FIGS. 11A through 11C are cross sectional elevation views illustrative of MOS field effect transistors in sequential steps involved in a fabrication method thereof in a fifth embodiment according to the present invention.

A fifth embodiment according to the present invention will be described wherein a substrate 10 has p-type and n-type well regions 31 and 32 on which n-channel and p-channel MOS field effect transistors with side wall oxide films are provided respectively. With reference to FIG. 11C, field oxide films 20 are selectively formed in a surface of the substrate 10 to separate the p-type well region 31 from the n-type well region 32. A channel stopper 40 may be provided between the p-type and n-type well regions 31 and 32. Source/drain diffusion regions 54 doped with an n-type impurity are provided in the p-type well region 31 and the source/drain diffusion regions 44 doped with a p-type impurity are provided in the n-type well region 32. A p-type high impurity concentration channel region 41 is provided in the p-type well region 31 and an n-type high impurity concentration channel region 51 is provided in the n-type well region 32. Just under the p-type and n-type high impurity concentration channel regions 41 and 51, p-type and n-type high impurity concentration bottom regions 42 and 52 are provided respectively so that the p-type and n-type high impurity concentration channel regions 41 and 51 are electrically connected respectively through the p-type and n-type high impurity concentration bottom regions 42 and 52 to the p-type and n-type well regions 31 and 32. Gate oxide films 61 are provided on the p-type and n-type high impurity concentration channel regions 41 and 51. Gate electrodes 62 are provided on the gate oxide films 61 to form gate structures 60 on the p-type and n-type well regions 31 and 32. Each of the gate structures 60 has gate side wall oxide films 70 under which lightly doped regions 53 and 43 of the same conductivity as the source/drain diffusion regions 54 and 44 are provided.

The above CMOS field effect transistors with the gate side wall oxide films 70 may be fabricated as follows. Referring back to FIG. 11A, there is prepared a semiconductor substrate 10 including p-type and n-type well regions 31 and 32 between which a channel stopper 40 is provided. Field oxide films 20 are selectively formed in a surface of the substrate by a selective oxidation to separate the p-type well region 31 from the n-type well region 32. A p-type high impurity concentration channel region 41 is selectively formed by a p-type impurity implantation into a surface of the p-type well region 31 at a low implantation energy. An n-type high impurity concentration channel region 51 is selectively formed by a p-type impurity implantation into a surface of the n-type well region 32 at a low implantation energy. A p-type high impurity concentration bottom region 42 is selectively formed just under the p-type high impurity concentration channel region 41 by using a p-type impurity implantation at a high implantation energy. An n-type high impurity concentration bottom region 52 is selectively formed just under the n-type high impurity concentration channel region 51 by using an n-type impurity implantation at a high implantation energy. The formations of the p-type and n-type high impurity concentration channel regions 41 and 51 may follow the formations of the p-type and n-type high impurity concentration bottom regions 41 and 52 respectively.

Figure 11B:
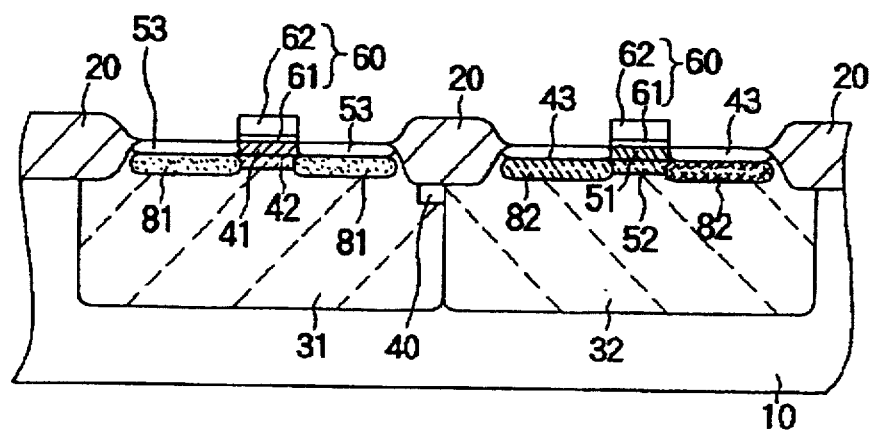
Figure 11C:
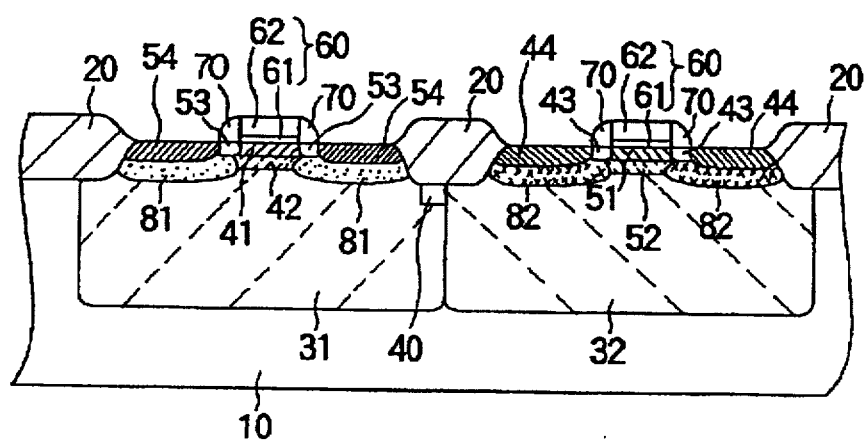

With reference to FIG. 11B, gate oxide films 61 are formed on the p-type and n-type high impurity concentration channel regions 41 and 51. Gate electrodes 62 are provided on the gate oxide films 61. Then, n-type impurity implantations into the surface of the p-type well region 31 are carried out at a low implantation energy by use of the gate structure 60 and the field oxide film 20 as masks to form n-type lightly doped regions 53. Similarly, p-type impurity implantations into the surface of the n-type well region 32 are carried out at a low implantation energy by use of the gate structure 60 and the field oxide film 20 as masks to form p-type lightly doped regions 43. Further, n-type impurity implantations into a deep region of the p-type well region 31 are carried out at a high implantation energy by use of the gate structure 60 and the field oxide film 20 as masks to form p$^-$-type low impurity concentration diffusion layers 81 just under the n-type lightly doped diffusion regions 53. Similarly, p-type impurity implantations into a deep region of the n-type well region 32 are carried out at a high implantation energy by use of the gate structure 60 and the field oxide film 20 as masks to form n$^-$-type low impurity concentration diffusion layers 82 just under the p-type lightly doped diffusion regions 43.

With reference to FIG. 11C, gate side walls 70 are formed on opposite sides of each of the gate structures 60, after which an n-type impurity implantation into the n-type lightly doped diffusion regions 53 are carried out at a low implantation energy by using the gate structure 60 provided with the gate side wall oxide films 70 and the field oxide films 20 as masks to form the n-type source/drain diffusion regions 54 outside the n-type lightly doped diffusion regions 53. Further, a p-type impurity implantation into the p-type lightly doped diffusion regions 43 are carried out at a low implantation energy by using the gate structure 60 provided with the gate side wall oxide films 70 and the field oxide films 20 as masks to form the p-type source/drain diffusion regions 44 outside the p-type lightly doped diffusion regions 43.

A sixth embodiment according to the present invention will be described wherein a substrate 10 has p-type and n-type well regions 31 and 32 on which n-channel and p-channel MOS field effect transistors with side wall oxide films are provided respectively. A structure of the CMOS device of this embodiment is substantially the same as the CMOS device of the fifth embodiment.

Figure 12A:
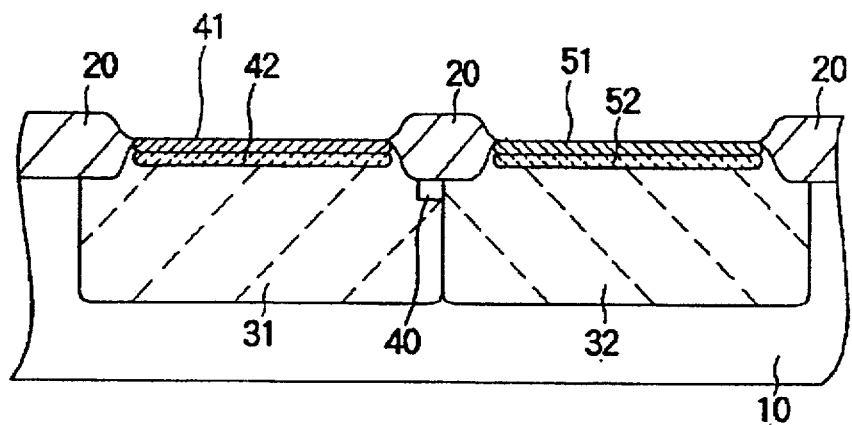
FIGS. 12A through 12C are cross sectional elevation views illustrative of MOS field effect transistors in sequential steps involved in a fabrication method thereof in a sixth embodiment according to the present invention.
Figure 12B:
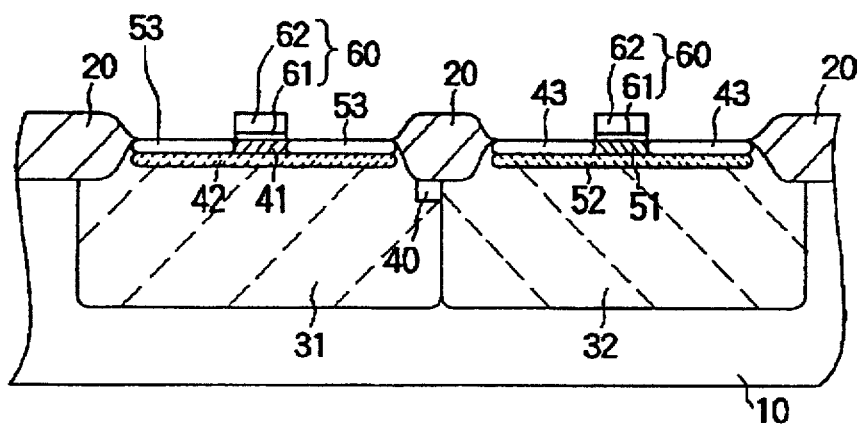
Figure 12C:
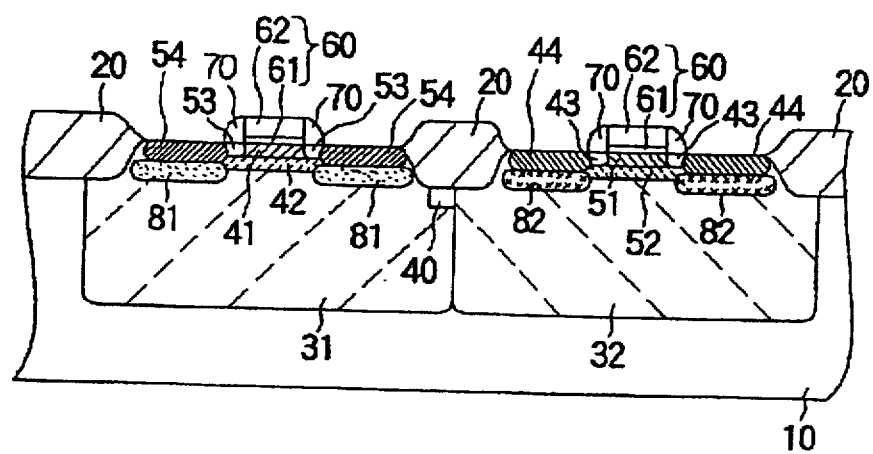

With reference to FIG. 12C, field oxide films 20 are selectively formed in a surface of the substrate 10 to separate the p-type well region 31 from the n-type well region 32. A channel stopper 40 may be provided between the p-type and n-type well regions 31 and 32. Source/drain diffusion regions 54 doped with an n-type impurity are provided in the p-type well region 31 and the source/drain diffusion regions 44 doped with a p-type impurity are provided in the n-type well region 32. A p-type high impurity concentration channel region 41 is provided in the p-type well region 31 and an n-type high impurity concentration channel region 51 is provided in the n-type well region 32. Just under the p-type and n-type high impurity concentration channel regions 41 and 51, p-type and n-type high impurity concentration bottom regions 42 and 52 are provided respectively so that the p-type and n-type high impurity concentration channel regions 41 and 51 are electrically connected respectively through the p-type and n-type high impurity concentration bottom regions 42 and 52 to the p-type and n-type well regions 31 and 32. Gate oxide films 61 are provided on the p-type and n-type high impurity concentration channel regions 41 and 51. Gate electrodes 62 are provided on the gate oxide films 61 to form gate structures 60 on the p-type and n-type well regions 31 and 32. Each of the gate structures 60 has gate side wall oxide films 70 under which lightly doped regions 53 and 43 of the same conductivity as the source/drain diffusion regions 54 and 44 are provided.

The above CMOS field effect transistors with the gate side wall oxide films 70 may be fabricated as follows. Referring back to FIG. 12A, there is prepared a semiconductor substrate 10 including p-type and n-type well regions 31 and 32 between which a channel stopper 40 is provided. Field oxide films 20 are selectively formed in a surface of the substrate by a selective oxidation to separate the p-type well region 31 from the n-type well region 32. A p-type high impurity concentration channel region 41 is not-selectively formed by a p-type impurity implantation into a surface of the p-type well region 31 at a low implantation energy. An n-type high impurity concentration channel region 51 is not-selectively formed by a p-type impurity implantation into a surface of the n-type well region 32 at a low implantation energy. A p-type high impurity concentration bottom region 42 is not-selectively formed just under the p-type high impurity concentration channel region 41 by using a p-type impurity implantation at a high implantation energy. An n-type high impurity concentration bottom region 52 is not-selectively formed just under the n-type high impurity concentration channel region 51 by using an n-type impurity implantation at a high implantation energy. The formations of the p-type and n-type high impurity concentration channel regions 41 and 51 may follow the formations of the p-type and n-type high impurity concentration bottom regions 41 and 52 respectively.

With reference to FIG. 12B, gate oxide films 61 are formed on the p-type and n-type high impurity concentration channel regions 41 and 51. Gate electrodes 62 are provided on the gate oxide films 61. Then, n-type impurity implantation into the p-type high impurity concentration region 41 is carried out at a low implantation energy by use of the gate structure 60 and the field oxide film 20 as masks to form n-type lightly doped regions 53. Similarly, p-type impurity implantation into the n-type high impurity concentration channel region 51 is carried out at a low implantation energy by use of the gate structure 60 and the field oxide film 20 as masks to form p-type lightly doped regions 43.

With reference to FIG. 12C, gate side walls 70 are formed on opposite sides of each of the gate structures 60. An n-type impurity implantation into the n-type lightly doped diffusion regions 53 is carried out at a low implantation energy by using the gate structure 60 provided with the gate side wall oxide films 70 and the field oxide films 20 as masks to form the n-type source/drain diffusion regions 54 outside the n-type lightly doped diffusion regions 53. Further, a p-type impurity implantation into the p-type lightly doped diffusion regions 43 are carried out at a low implantation energy by using the gate structure 60 provided with the gate side wall oxide films 70 and the field oxide films 20 as masks to form the p-type source/drain diffusion regions 44 outside the p-type lightly doped diffusion regions 43. Further, n-type impurity implantations into a deep region of the p-type well region 31 are carried out at a high implantation energy by use of the gate structure 60 and the field oxide film 20 as masks to form p$^-$s-type low impurity concentration diffusion layers 81 just under the n-type lightly doped diffusion regions 53. Similarly, p-type impurity implantations into a deep region of the n-type well region 32 are carried out at a high implantation energy by use of the gate structure 60 and the field oxide film 20 as masks to form n$^-$-type low impurity concentration diffusion layers 82 just under the p-type lightly doped diffusion regions 43.

The following simulations were made with respect to the CMOS devices of the fifth and sixth embodiments to evaluate the effects of the present invention. As to the n-channel MOS field effect transistor according to the present invention, FIGS. 13A and 13B are illustrative of profiles of impurity concentrations in net impurity and individual impurities respectively associated with the source/drain diffusion regions, the low impurity concentration diffusion layers and the well regions.

The substrate has a sheet sheet resistance of 10 ohms/square. Boron is implanted at a dose of $1.3\times10^{13}$ cm$^{-2}$ for subsequent heat treatment at a temperature of 1200° C. for activation thereof. Thereafter, phosphorus is further implanted at a dose of $8\times10^{12}$ cm$^{-2}$ to reduce a p-type impurity concentration for subsequent heat treatment at a temperature of 1200° C. for activation thereof to thereby form the p-type well region 31 in the substrate 10.

Boron is selectively implanted into a channel region only in the p-type well region at a low energy of $3\times10^{12}$ cm$^{-2}$ and such boron implantation is again carried out at a high energy and a dose of of $5\times10^{12}$ cm$^{-2}$ to thereby form the p-type high impurity concentration channel region and the p-type high impurity concentration bottom region just under the channel region. After formations of the gate oxide film 61 and the gate electrode 62, phosphorus is then implanted at a low energy and a dose of $3\times10^{13}$ cm$^{-3}$ to form the n-type lightly doped diffusion regions 53. Gate side wall oxide films 70 are then formed. Arsenic is implanted at a low energy and a dose of $3\times10^{15}$ cm$^{-2}$ to form the n-type source/drain diffusion regions 54. Phosphorus is further implanted three times at a high energy and a dose in the range from $1\times10^{11}$ cm$^{-2}$ to $2\times10^{11}$ cm$^{-2}$ to form the p-type low impurity concentration diffusion layers just under the n-type source/drain diffusion regions. After that, a heat treatment at a temperature of 850° C. is carried out for activation.

Figure 13A:
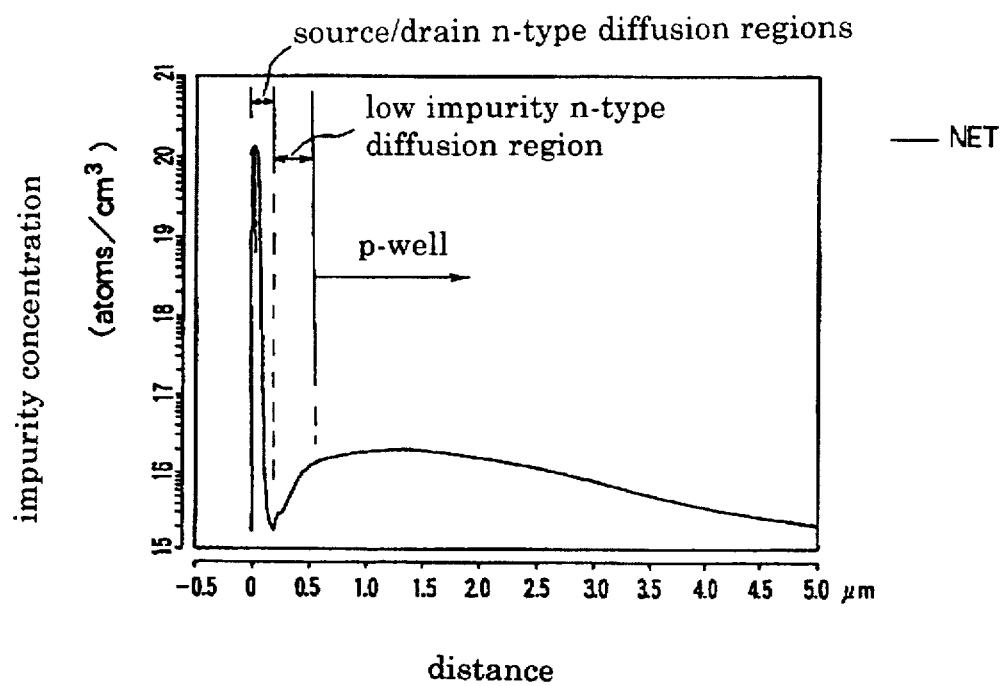
FIGS. 13A and 13B are diagrams illustrative of profiles of impurity concentrations of highly doped source/drain diffusion regions, low impurity concentration diffusion layers and well regions in MOS field effect transistors in fifth and sixth embodiments according to the present invention.
Figure 13B:
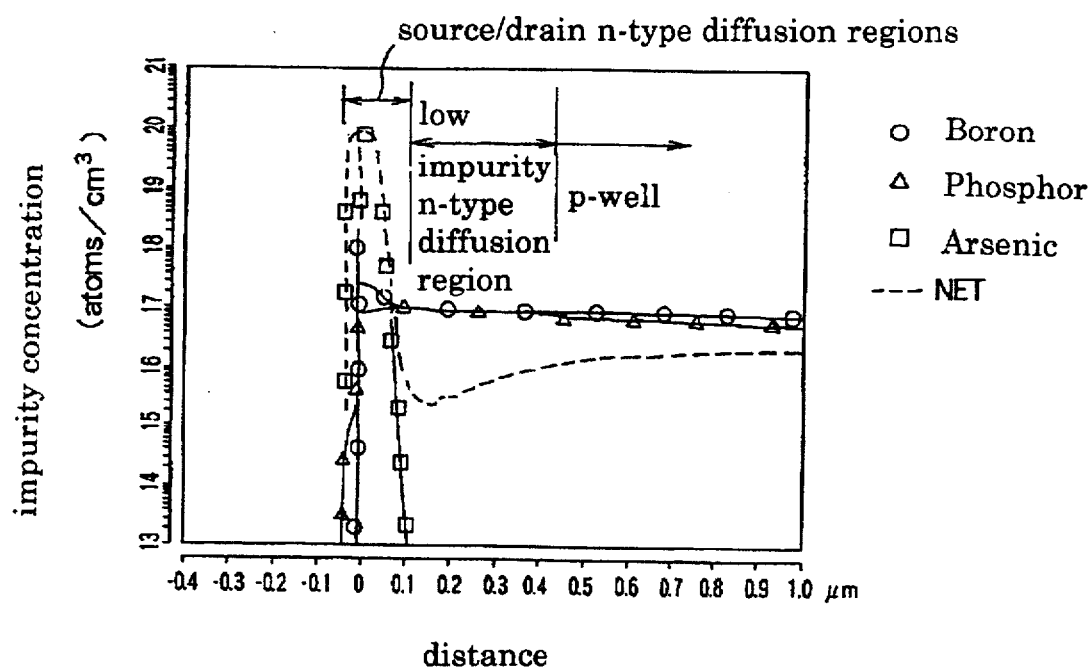

The net profiles of the impurity concentrations and the individual profiles of boron, phosphorus and arsenic with respect to the n-type source/drain diffusion regions, the p-type low impurity concentration diffusion layers and the p-type well region were simulated, results of which are illustrated in FIGS. 13A and 13B.

Figure 14A:
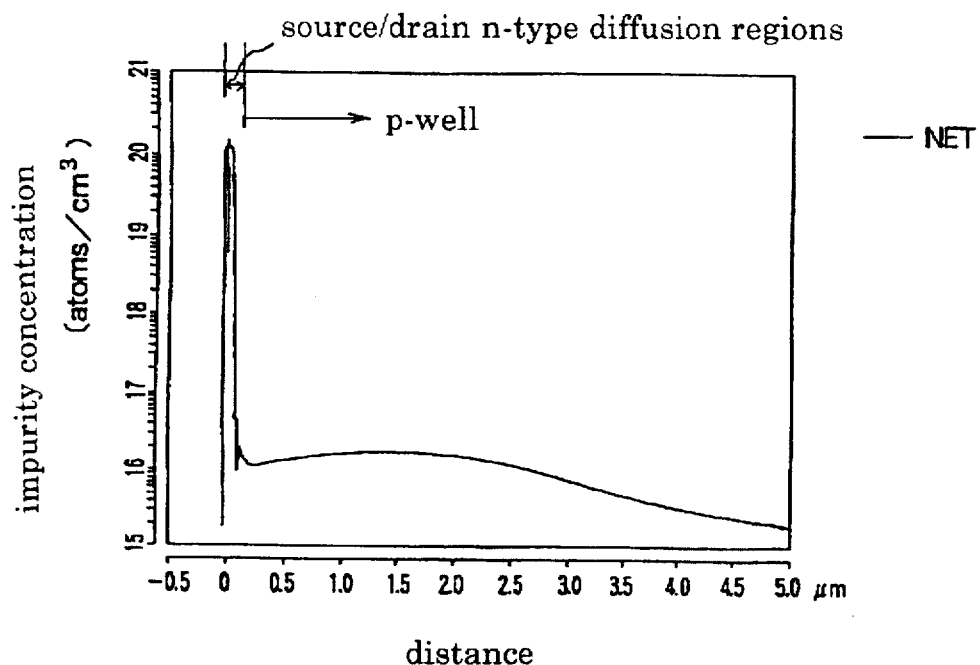
FIGS. 14A and 14B are diagrams illustrative of profiles of impurity concentrations of highly doped source/drain diffusion regions and a well region in the conventional MOS field effect transistors.
Figure 14B:
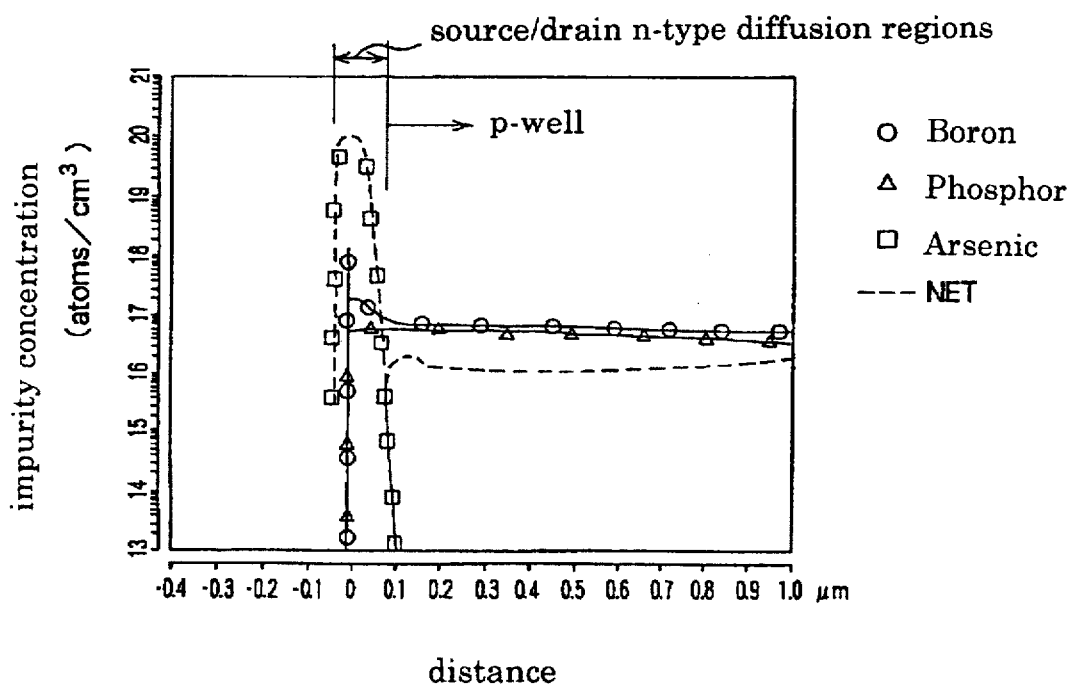

As a comparative simulation to the above, the n-channel MOS field effect transistor was simulated under the same conditions as the above but free of the p-type low impurity concentration layers were also simulated to obtain the net profiles of the impurity concentrations and the individual profiles of boron, phosphorus and arsenic with respect to the n-type source/drain diffusion regions and the p-type well region just under the source/drain diffusion region, results of which are illustrated in FIGS. 14A and 14B.

As can be seen from FIGS. 13A and 13B illustrative of the present invention, a p-n junction interface between the n-type source/drain diffusion regions and the p-type low impurity concentration diffusion layers has a linearly graded profile in net impurity concentration from $1\times10^{20}$ atoms/cm$^3$ at the n-type source/drain diffusion regions near to $1\times10^{15}$ atoms/cm$^3$ at the p-type low impurity concentration diffusion layers. A space charge region on the p-n junction interface thereof has a width of approximately 0.6 micrometers.

By contrast, as illustrated in FIGS. 14A and 14B of the comparative simulation, a p-n junction interface between the n-type source/drain diffusion regions and the p-type well region has a step-like or discontinuous profile in net impurity concentration from $1\times10^{20}$ atoms/cm$^3$ at the n-type source/drain diffusion regions to $1\times10^{16}$ atoms/cm$^3$ at the p-type well region. A space charge region on the p-n junction interface thereof may be computed to have a width of approximately 0.3 micrometers.

From the above, it can be understood that the capacitance of the n-type source/drain diffusion regions in contact with the p-type low impurity concentration diffusion layers would be reduced to approximately one fourth of the capacitance of the n-type source/drain diffusion regions in contact with the p-type well region having a higher impurity concentration than the impurity concentration of the low impurity concentration diffusion layers. This means that the improved source/drain diffusion structure of the present invention has a considerably reduced capacitance by about one fourth of the normal n-channel MOS transistor.

A further simulation of the p-channel MOS field effect transistor was made under the same conditions as described above. A p-n junction interface between the p-type source/drain diffusion regions and the n-type low impurity concentration diffusion layers has a linearly graded profile in net impurity concentration from $1\times10^{20}$ atoms/cm$^3$ at the source/drain diffusion regions near to $1\times10^{16}$ atoms/cm$^3$ at the n-type low impurity concentration diffusion layers. A space charge region on the p-n junction interface thereof has a width of approximately 0.3 micrometers.

By contrast, a p-n junction interface between the p-type source/drain diffusion regions and the n-type well region has a step-like or discontinuous profile in net impurity concentration from $1\times10^{20}$ atoms/cm$^3$ at the source/drain diffusion regions to $1\times10^{17}$ atoms/cm$^3$. A space charge region on the p-n junction interface thereof may be computed to have a width of approximately 0.1 micrometers.

From the above, it can be understood that the capacitance of the p-type source/drain diffusion regions in contact with the n-type low impurity concentration diffusion layers would be reduced to approximately one ninth of the capacitance of the p-type source/drain diffusion regions in contact with the n-type well region having a higher impurity concentration than the impurity concentration of the low impurity concentration diffusion layers. This means that the improved source/drain diffusion structure of the present invention has a considerably reduced capacitance by about one ninth of the normal p-channel MOS transistor.

Figure 15A:
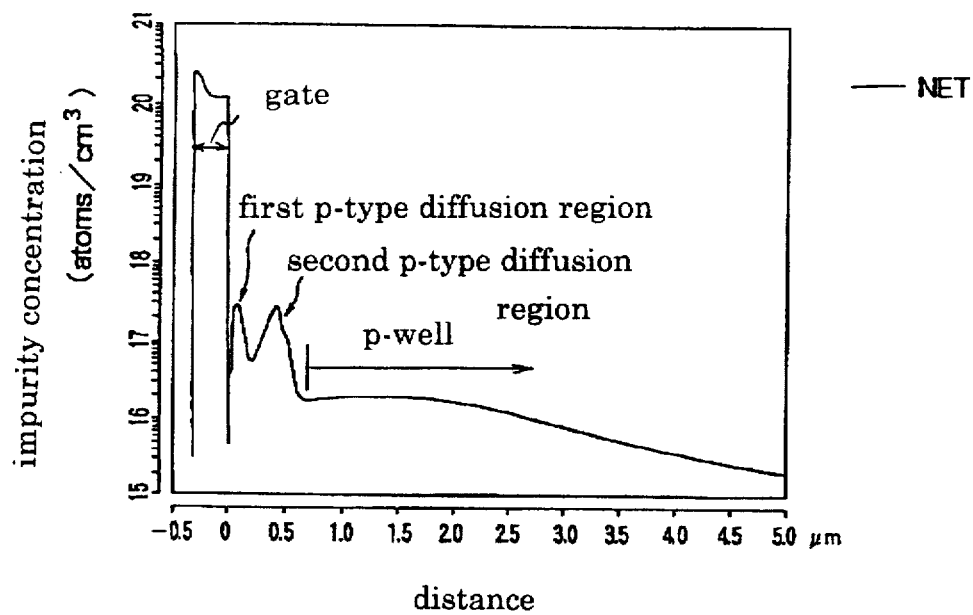
FIGS. 15A and 15B are diagrams illustrative of profiles of impurity concentrations of a gate structure, a channel region and a well region in MOS field effect transistors in fifth and sixth embodiments according to the present invention.
Figure 15B:
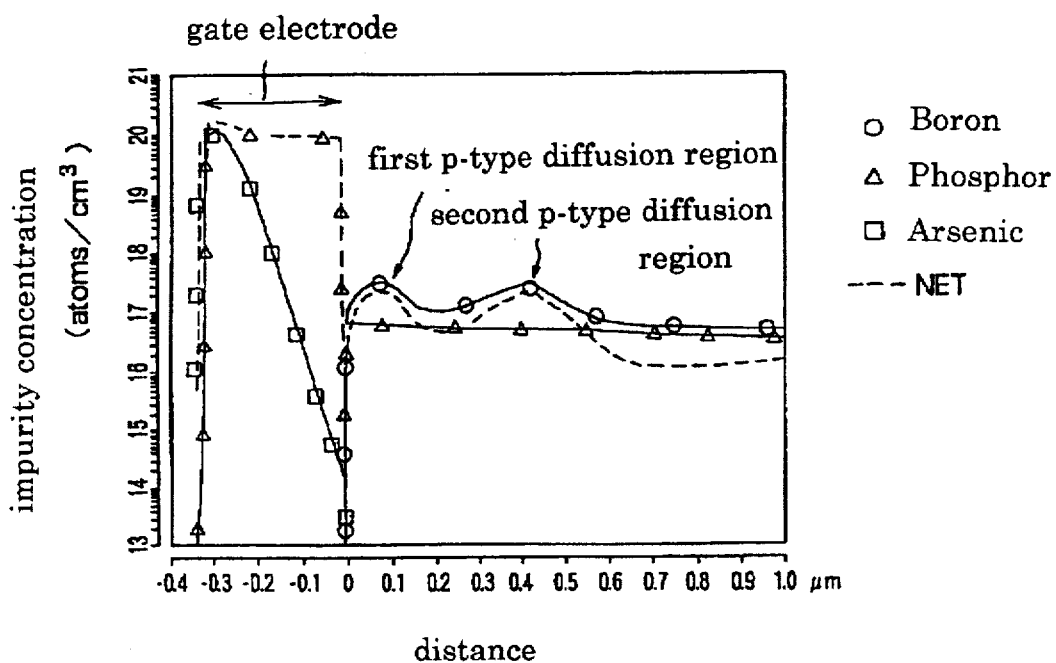
Figure 16A:
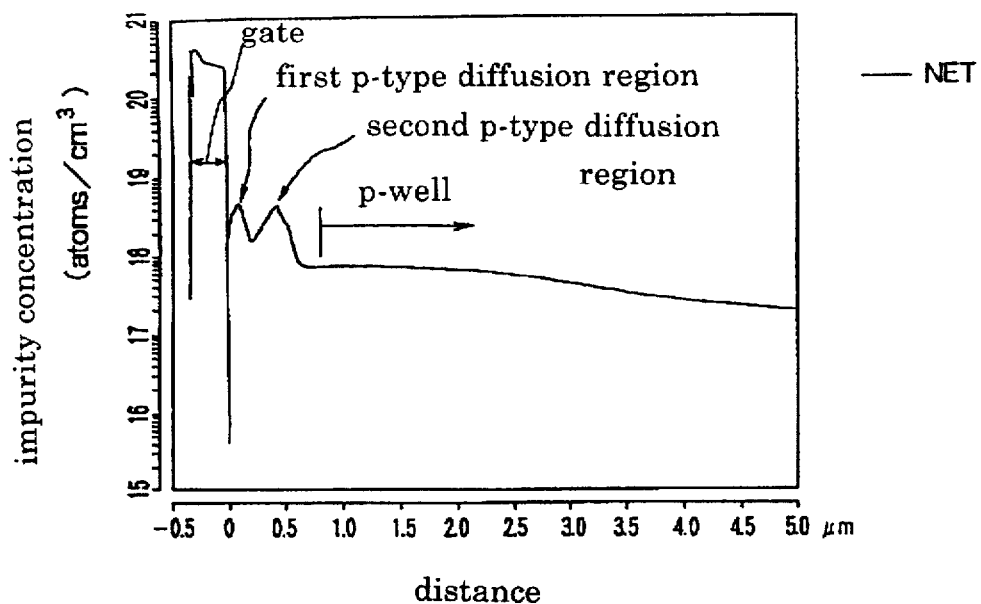
FIGS. 16A and 16B are diagrams illustrative of profiles of impurity concentrations of a gate structure, a channel region and a well region in the conventional MOS field effect transistors.
Figure 16B:
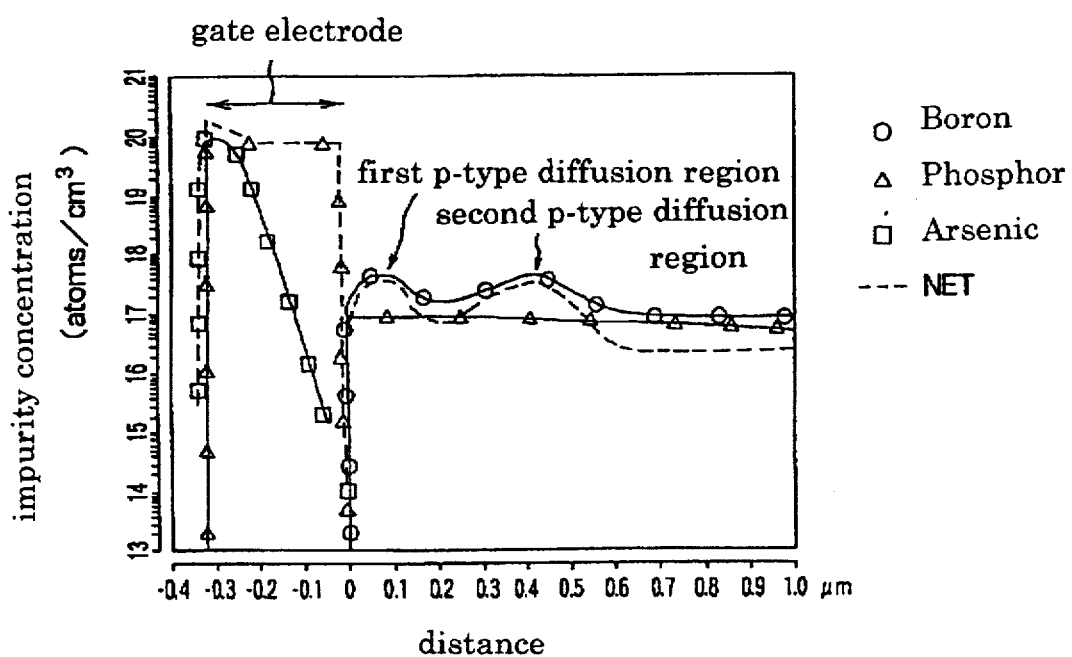

Net impurity concentration profiles and individual impurity profiles of boron, phosphorus and arsenic under the gate structure of the present invention are illustrated in FIGS. 15A and 15B. Also net impurity concentration profiles and individual impurity profiles of boron, phosphorus and arsenic under the gate structure of the comparative simulation are illustrated in FIGS. 16A and 16B. From which, it could be understood that the impurity concentration profiles under the gate structure are not changed by the low impurity concentration diffusion layers. This means that the low impurity concentration diffusion layers provided just under the source/drain diffusion regions may provide almost no influence to the impurity concentration profile under the gate structure.

Figure 17:
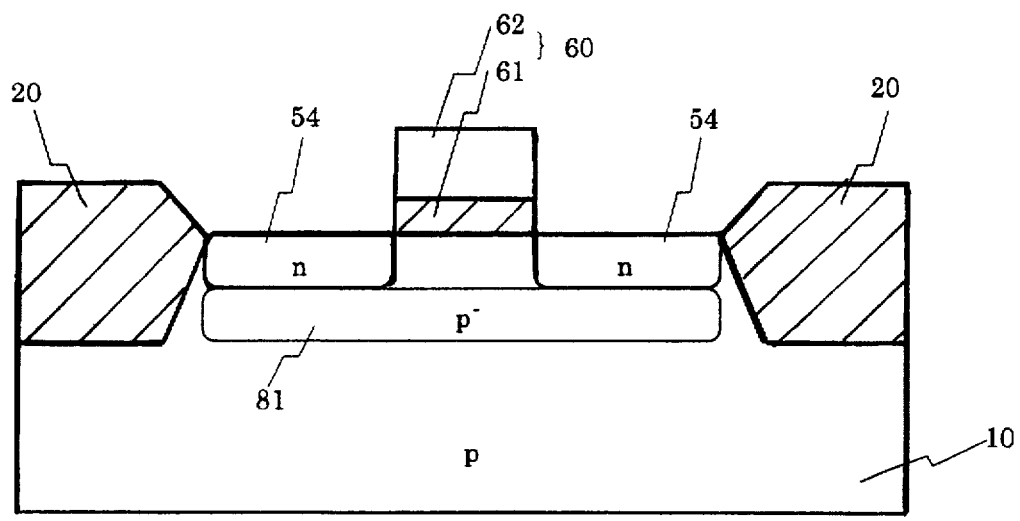
FIG. 17 is a cross sectional elevation view illustrative of a novel structure of a MOS field effect transistor in a seventh embodiment according to the present invention.

A seventh embodiment of the present invention will be described wherein a still another n-channel MOS field effect transistor is provided. A structure of the n-channel MOS field effect transistor is illustrated in FIG. 17. The n-channel MOS field effect transistor includes a p-type semiconductor substrate 10, field oxide films 20 selectively provided in a surface of the p-type semiconductor substrate 10, n-type source/drain diffusion regions 54 to define a channel region between them and a gate structure 60 provided on the channel region. The gate structure comprises a gate oxide film provided on the channel region and a gate electrode 62 provided on the gate oxide film 61. A single p-type low impurity concentration layer 81 is provided to extend under the source/drain diffusion regions 54 wherein a top portion of the p-type low impurity concentration diffusion layer 81 is in contact with bottoms of the n-type source/drain diffusion regions 54. The p-type low impurity concentration diffusion layer 81 has a lower impurity concentration than an impurity concentration of the p-type semiconductor substrate 10 to thereby reduce a p-n junction capacitance at interfaces between the p-type low impurity concentration diffusion layer 81 and the n-type source/drain diffusion regions 54. As a result, the capacitance of the n-type source/drain diffusion regions 54 is reduced to thereby allow the n-channel MOS field effect transistor to show high speed and high frequency performances.

The impurity concentrations of the source/drain diffusion regions 54 and the p-type low impurity concentration diffusion region 81 may be approximately $1\times10^{20}$ atoms/cm$^3$ and $1\times10^{15}$ atoms/cm$^3$ respectively. The impurity concentration of the semiconductor substrate 10 may be approximately $1\times10^{16}$ atoms/cm$^3$.

As a modification, a control electrode not illustrated may optionally be provided to be electrically connected, with making a detour to avoid the p-type low impurity concentration diffusion layer 81, to a region including the channel region between the source/drain diffusion regions 54 and over the p-type low impurity concentration layer 81 so as to control a potential of the channel region by controlling a voltage applied to the control electrode.

Figure 18A:
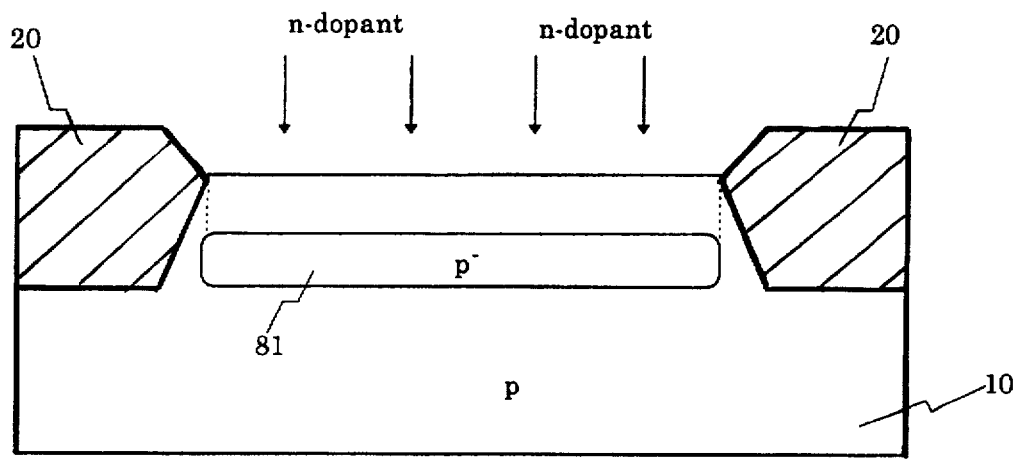
FIGS. 18A through 18C are cross sectional elevation views illustrative of MOS field effect transistors in sequential steps involved in a fabrication method thereof in a seventh embodiment according to the present invention.

The above n-channel MOS field effect transistor may be fabricated as follows. With reference to FIG. 18A, field oxide films 20 are selectively formed in a surface of a p-type semiconductor substrate 10. An n-type impurity implantation into a deep region of the p-type semiconductor substrate 10 is carried out by using the field oxide films 20 as a mask at a high implantation energy to thereby form a single p-type low impurity concentration diffusion layer 81 in the deep region.

Figure 18B:
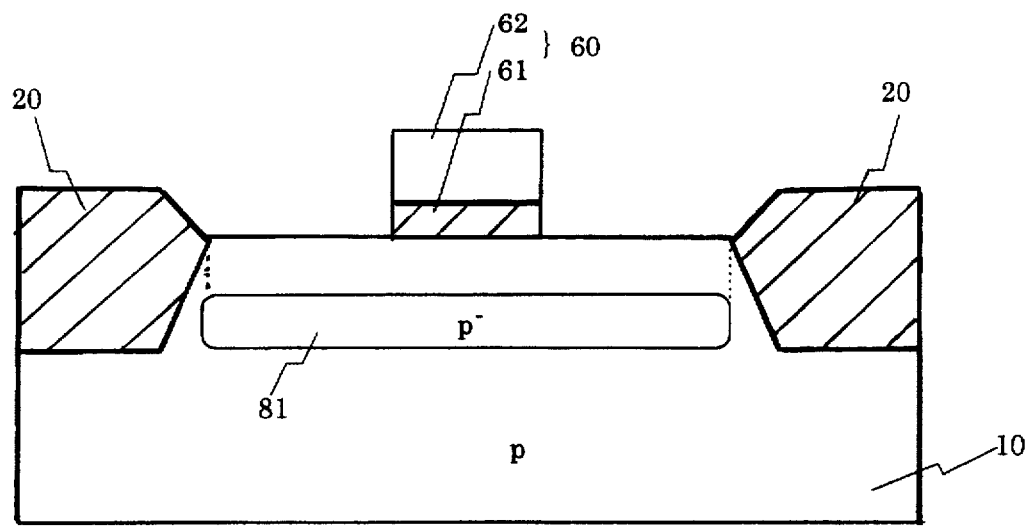

With reference to FIG. 18B, a gate oxide film is selectively formed on a channel region of the p-type semiconductor substrate 10. A gate electrode 62 is then provided on the gate oxide film 61 to thereby form a gate structure 60.

Figure 18C:
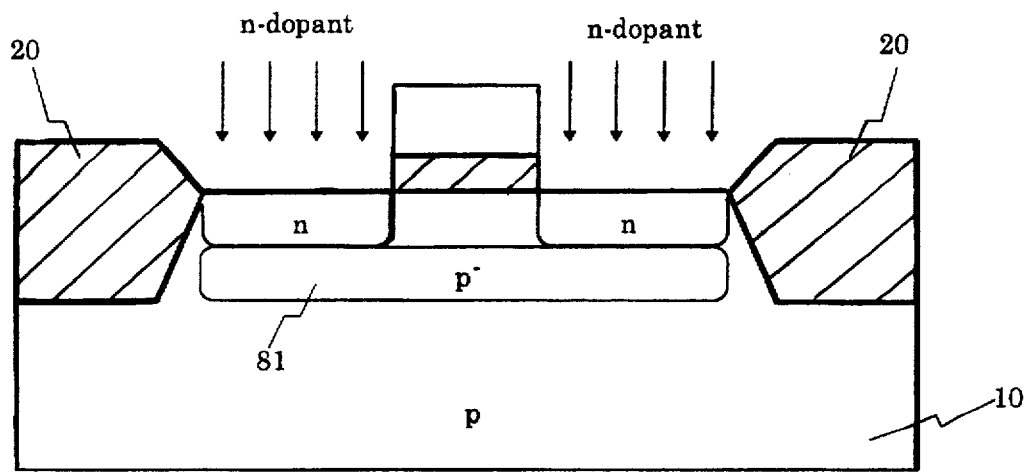

With reference to FIG. 18C, an n-type impurity implantation into a surface of the p-type semiconductor substrate 10 is carried out at a low implantation energy by using the gate structure 60 and the field oxide films 20 as masks to form the n-type source/drain diffusion regions 54 having bottoms in contact with a top surface of the p-type low impurity concentration diffusion layer 81.

The above present invention of this embodiment may be applicable to the p-channel MOS field effect transistor by changing the conductivity type of the impurities.

As a moreover modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 19:
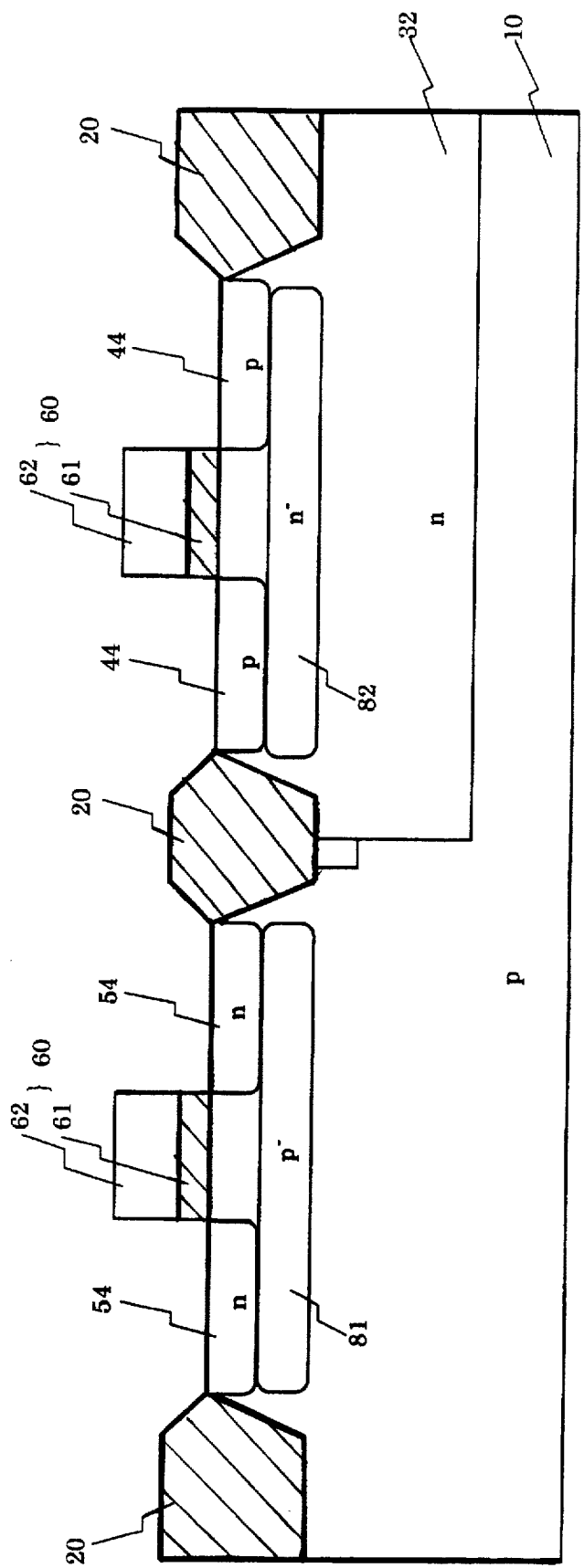
FIG. 19 is a cross sectional elevation view illustrative of a novel structure of a MOS field effect transistor in an eighth embodiment according to the present invention.

An eighth embodiment according to the present invention will be described wherein an improved CMOS device is provided. A structure of the CMOS device is illustrated in FIG. 19. A p-type semiconductor substrate 10 has an n-type well region 32. Field oxide films 20 are selectively provided in a surface of the substrate 10 to separate the n-type well region 32 from the p-type region of the substrate 10. An n-channel MOS field effect transistor is provided in the p-type region of the substrate 10. A p-channel MOS field effect transistor is provided in the n-type well region 32. The n-channel MOS field effect transistor has a gate structure 60 comprising a gate oxide film 61 and a gate electrode 62, n-type source/drain diffusion regions 54. There is further provided a single p-type low impurity concentration diffusion region 81 extending under the n-type source/drain diffusion regions 54. The p-channel MOS field effect transistor has a gate structure 60 comprising a gate oxide film 61 and a gate electrode 62, p-type source/drain diffusion regions 44 and a single n-type low impurity concentration diffusion layer 82 extending under the p-type source/drain diffusion regions 44. The p-type low impurity concentration diffusion layer 81 has a lower impurity concentration than an impurity concentration of the p-type region of the substrate 10 to thereby reduce a p-n junction capacitance of the n-type source/drain diffusion regions 54. As a result, the n-channel MOS field effect transistor may show high speed and high frequency performances. The n-type low impurity concentration diffusion layer 82 has a lower impurity concentration than an impurity concentration of the n-type well region 32 to thereby reduce a p-n junction capacitance of the p-type source/drain diffusion regions 44. As a result, the p-channel MOS field effect transistor may show high speed and high frequency performances.

The impurity concentrations of the source/drain diffusion regions 54 and the p-type low impurity concentration diffusion region 81 may be approximately $1\times10^{20}$ atoms/cm$^3$ and $1\times10^{15}$ atoms/cm$^3$ respectively. The impurity concentration of the semiconductor substrate 10 may be approximately $1\times10^{16}$ atoms/cm$^3$. The impurity concentrations of the source/drain diffusion regions 44 and the n-type low impurity concentration diffusion region 82 may be approximately $1\times10^{20}$ atoms/cm$^3$ and $1\times10^{16}$ atoms/cm$^3$ respectively. The impurity concentration of the n-type well region 32 may be approximately $1\times10^{17}$ atoms/cm$^3$.

As a modification, control electrodes not illustrated may optionally be provided to be electrically connected, with making a detour to avoid the p-type and n-type low impurity concentration diffusion layers 81 and 82, to regions including the n-type and p-type channel regions between the n-type and p-type source/drain diffusion regions 54 and 44 respectively and over the p-type and n-type low impurity concentration layers 81 and 82 so as to control a potential of the channel region by controlling a voltage applied to the control electrode.

Figure 20A:
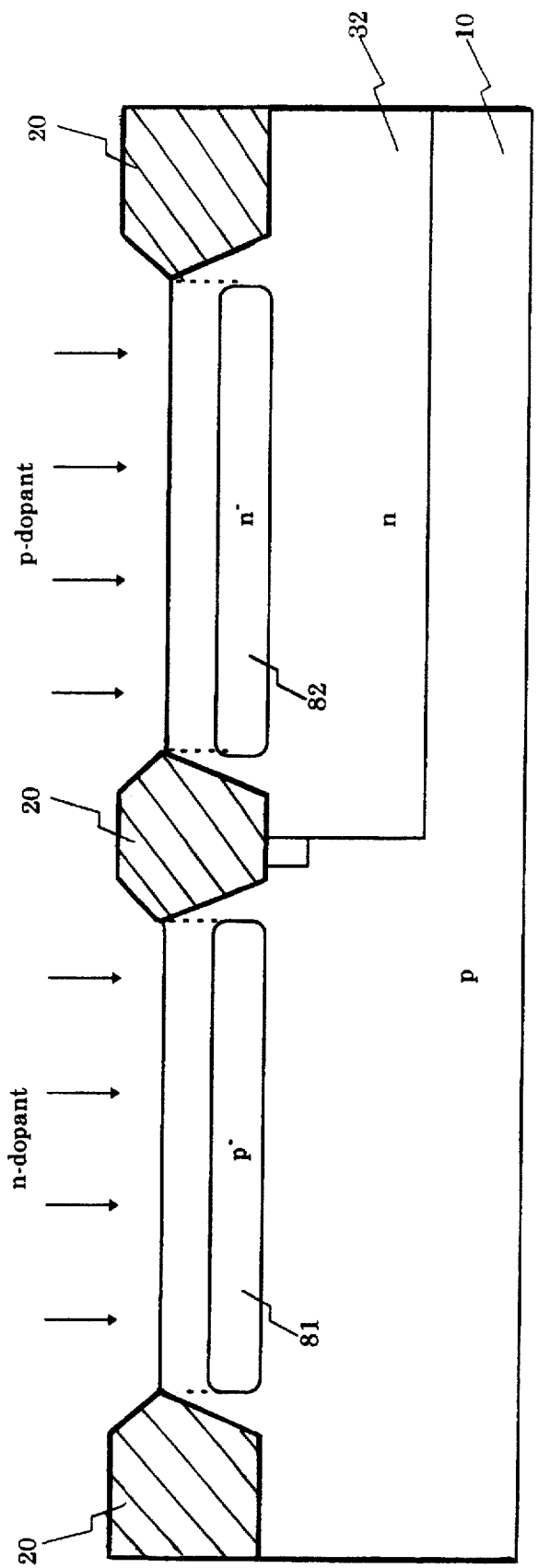
FIGS. 20A through 20C are cross sectional elevation views illustrative of MOS field effect transistors in sequential steps involved in a fabrication method thereof in an eighth embodiment according to the present invention.

The above CMOS device of this embodiment may be fabricated as follows. With reference to FIG. 20A, an n-type well region 32 is selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. An n-type impurity implantation into a deep level of the p-type region of the substrate 10 is carried out at a high implantation energy by using the field oxide films 20 as a mask to thereby form a p-type low impurity concentration diffusion layer 81 in the deep level in the p-type region of the substrate 10. A p-type impurity implantation into a deep level in the n-type well region 32 is carried out at a high implantation energy by using the field oxide films 20 as a mask to thereby form an n-type low impurity concentration diffusion layer 82 at the deep level in the n-type well region 32.

Figure 20B:
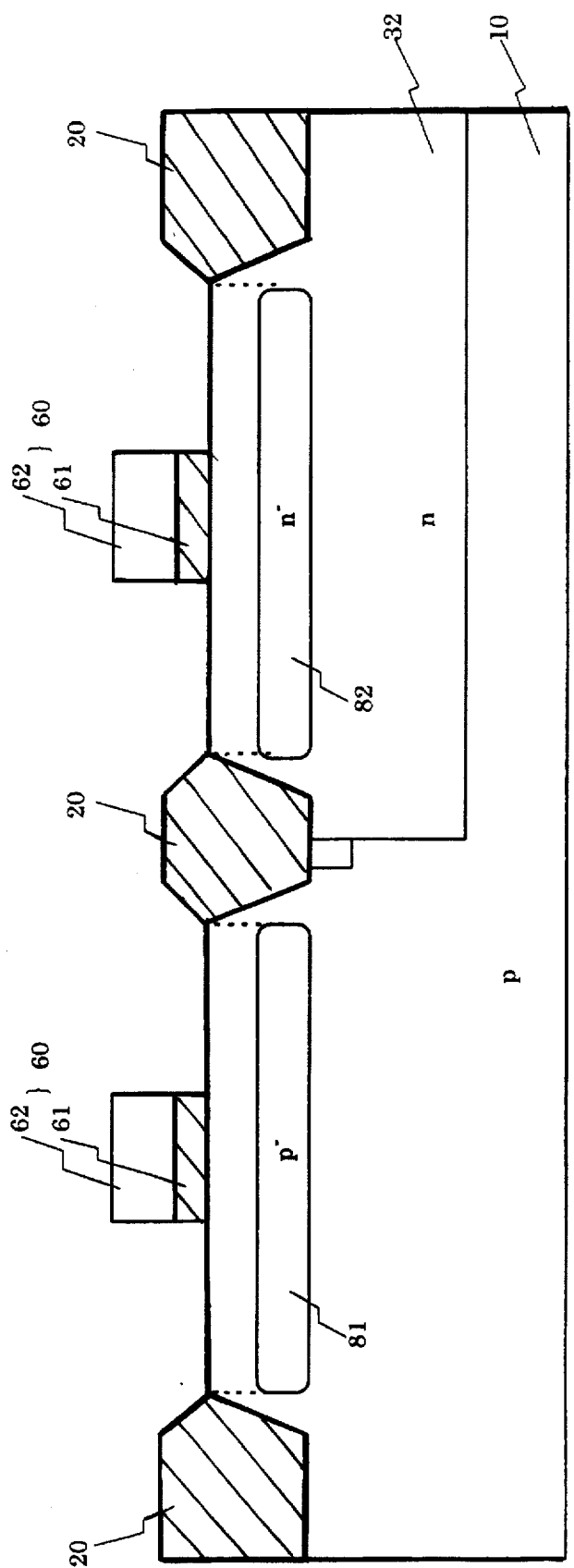

With reference to FIG. 20B, gate oxide films 61 are selectively formed on n-channel and p-channel regions in the p-type region of the substrate 10 and the n-type well region 32. Gate electrodes 62 are provided on the gate oxide films 61 to thereby form the gate structure 60.

Figure 20C:
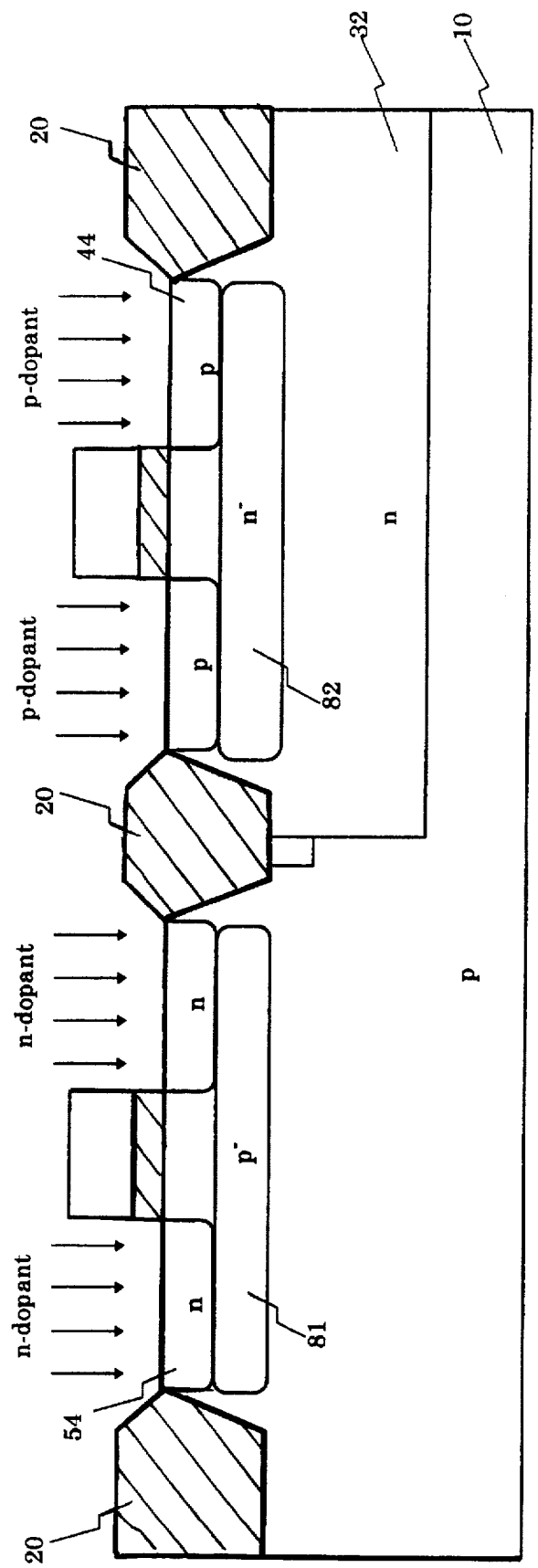

With reference to FIG. 20C, an n-type impurity implantation into the p-type region of the substrate 10 is carried out at a low implantation energy by using the gate structure 60 and the field oxide films 20 as masks to thereby form n-type source/drain diffusion regions 54. A p-type impurity implantation into the n-type well region 32 is carried out at a low implantation energy by using the gate structure 60 and the field oxide films 20 as masks to thereby form the p-type source/drain diffusion regions 44.

As a modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 21:
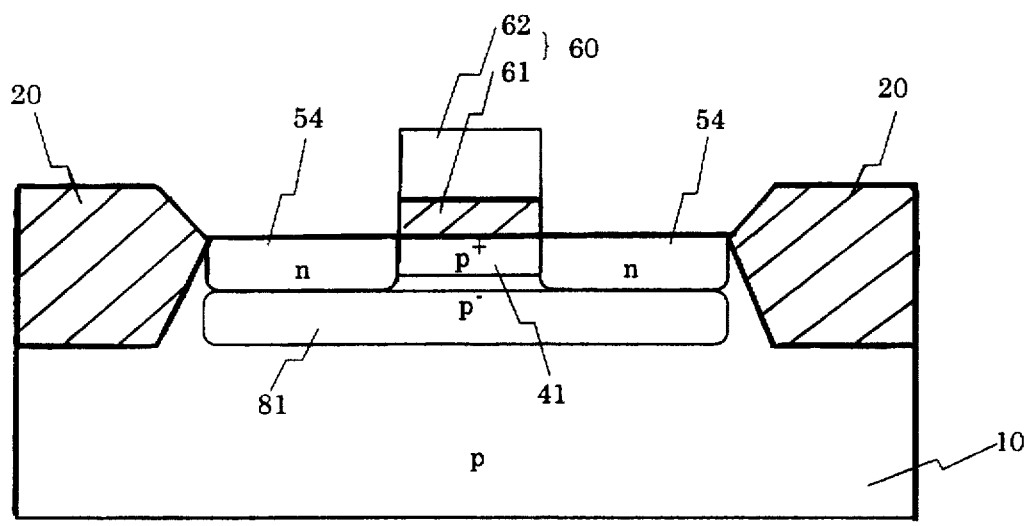
FIG. 21 is a cross sectional elevation view illustrative of a novel structure of a MOS field effect transistor in a ninth embodiment according to the present invention.

A ninth embodiment of the present invention will be described wherein yet another n-channel MOS field effect transistor is provided. A structure of the n-channel MOS field effect transistor is illustrated in FIG. 21. The n-channel MOS field effect transistor includes a p-type semiconductor substrate 10 field oxide films 20 selectively provided in a surface of the p-type semiconductor substrate 10, n-type source/drain diffusion regions 54, a p-type high impurity concentration channel region 41 between the source/drain diffusion regions 54 and a gate structure 60 provided on the channel region. The gate structure comprises a gate oxide film provided on the channel region and a gate electrode 62 provided on the gate oxide film 61. A single p-type low impurity concentration layer 81 is provided to extend under the source/drain diffusion regions 54 facsimile faxsimile wherein a top portion of the p-type low impurity concentration diffusion layer 81 is in contact with bottoms of the n-type source/drain diffusion regions 54. The p-type low impurity concentration diffusion layer 81 has a lower impurity concentration than an impurity concentration of the p-type semiconductor substrate 10 to thereby reduce a p-n junction capacitance at interfaces between the p-type low impurity concentration diffusion layer 81 and the n-type source/drain diffusion regions 54. As a result, the capacitance of the n-type source/drain diffusion regions 54 is reduced to thereby allow the n-channel MOS field effect transistor to show high speed and high frequency performances.

The impurity concentrations of the source/drain diffusion regions 54 and the p-type low impurity concentration diffusion region 81 may be approximately $1\times10^{20}$ atoms/cm$^3$ and $1\times10^{15}$ atoms/cm$^3$ respectively. The impurity concentration of the semiconductor substrate 10 may be approximately $1\times10^{16}$ atoms/cm$^3$.

Further, a control electrode not illustrated is provided to be electrically connected, with making a detour to avoid the p-type low impurity concentration diffusion layer 81, to the p-type high impurity concentration channel region 41 so as to control a potential of the channel region by controlling a voltage applied to the control electrode.

The above n-channel MOS field effect transistor may be fabricated as follows. With reference to FIG. 21A, field oxide films 20 are selectively formed in a surface of a p-type semiconductor substrate 10. An n-type impurity implantation into a deep level of the p-type semiconductor substrate 10 is carried out by using the field oxide films 20 as a mask at a high implantation energy to thereby form a single p-type low impurity concentration diffusion layer 81 in the deep region.

Figure 22A:
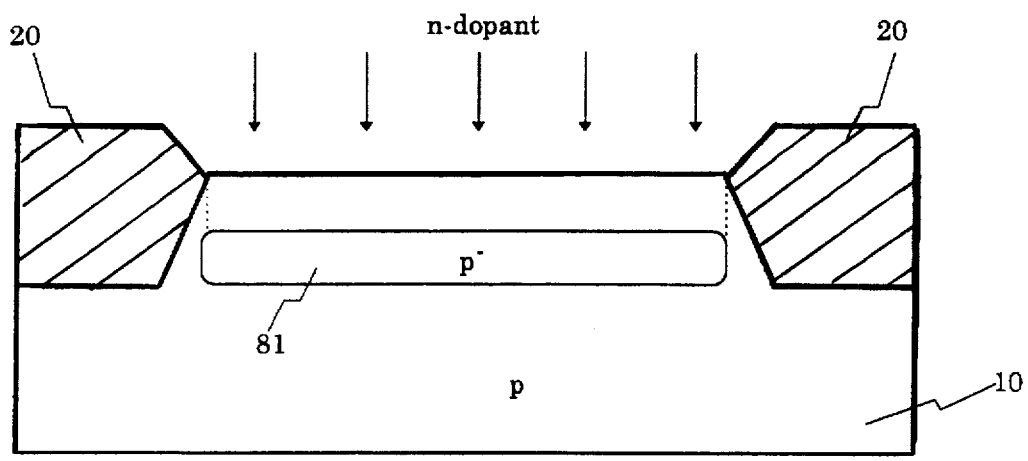
FIGS. 22A through 22D are cross sectional elevation views illustrative of MOS field effect transistors in sequential steps involved in a fabrication method thereof in a ninth embodiment according to the present invention.
Figure 22B:
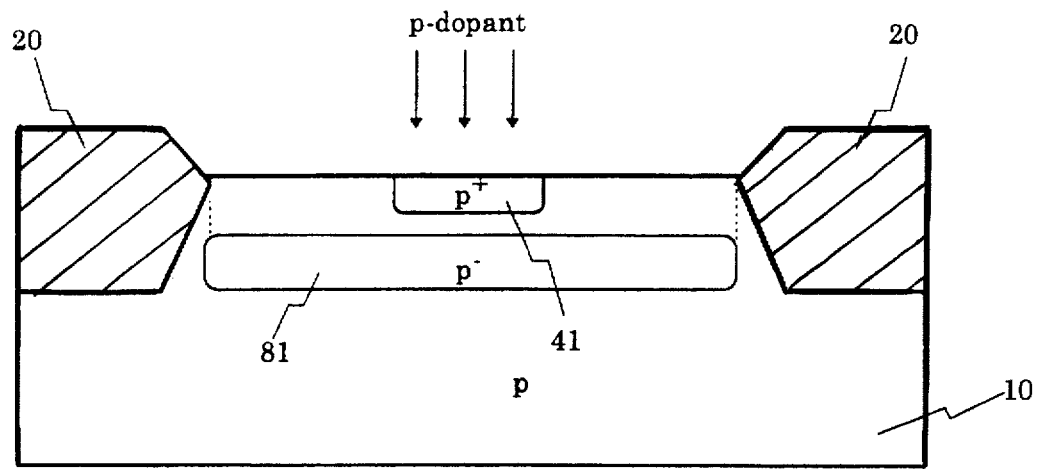

With reference to FIG. 22B, a p-type impurity implantation selectively into a channel region of the p-type semiconductor substrate 10 is carried out at a low implantation energy to thereby form the p-type high impurity concentration channel region 41.

Figure 22C:
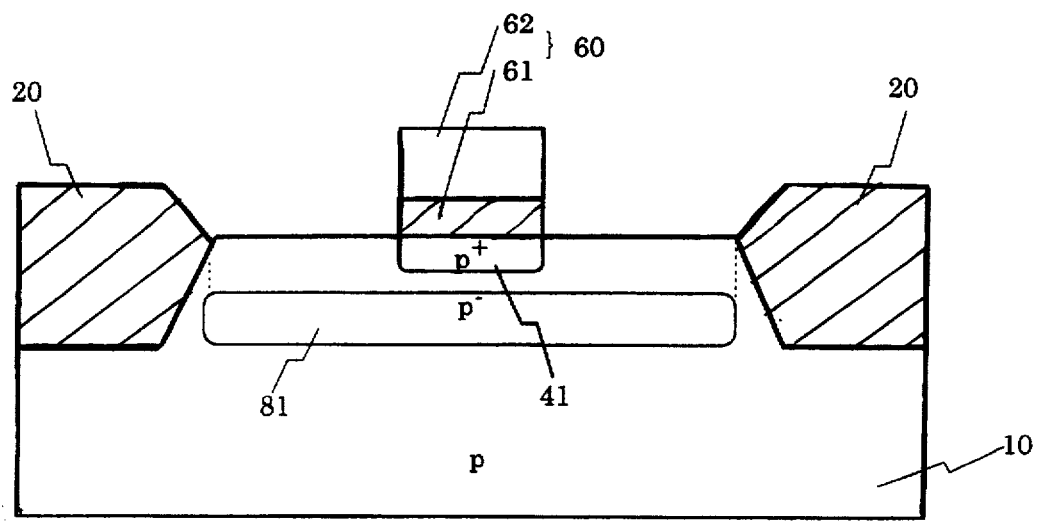

With reference to FIG. 22C, a gate oxide film 61 is selectively formed on the p-type high impurity concentration channel region 41. A gate electrode 62 is then provided on the gate oxide film 61 to thereby form a gate structure 60.

Figure 22D:
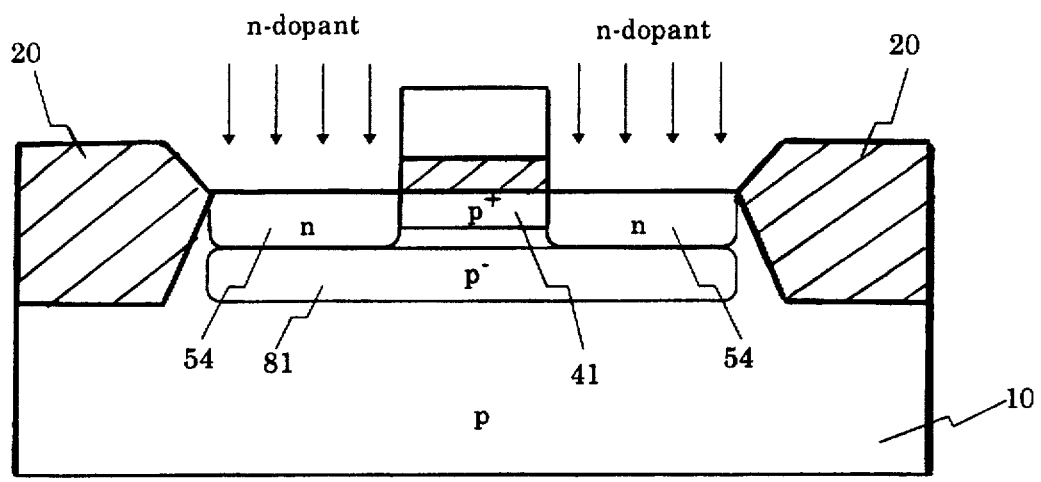

With reference to FIG. 22D, an n-type impurity implantation into a surface of the p-type semiconductor substrate 10 is carried out at a low implantation energy by using the gate structure 60 and the field oxide films 20 as masks to form the n-type source/drain diffusion regions 54 having bottoms in contact with a top surface of the p-type low impurity concentration diffusion layer 81.

The above present invention of this embodiment may be applicable to the p-channel MOS field effect transistor by changing the conductivity type of the impurities.

As a moreover modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 23:
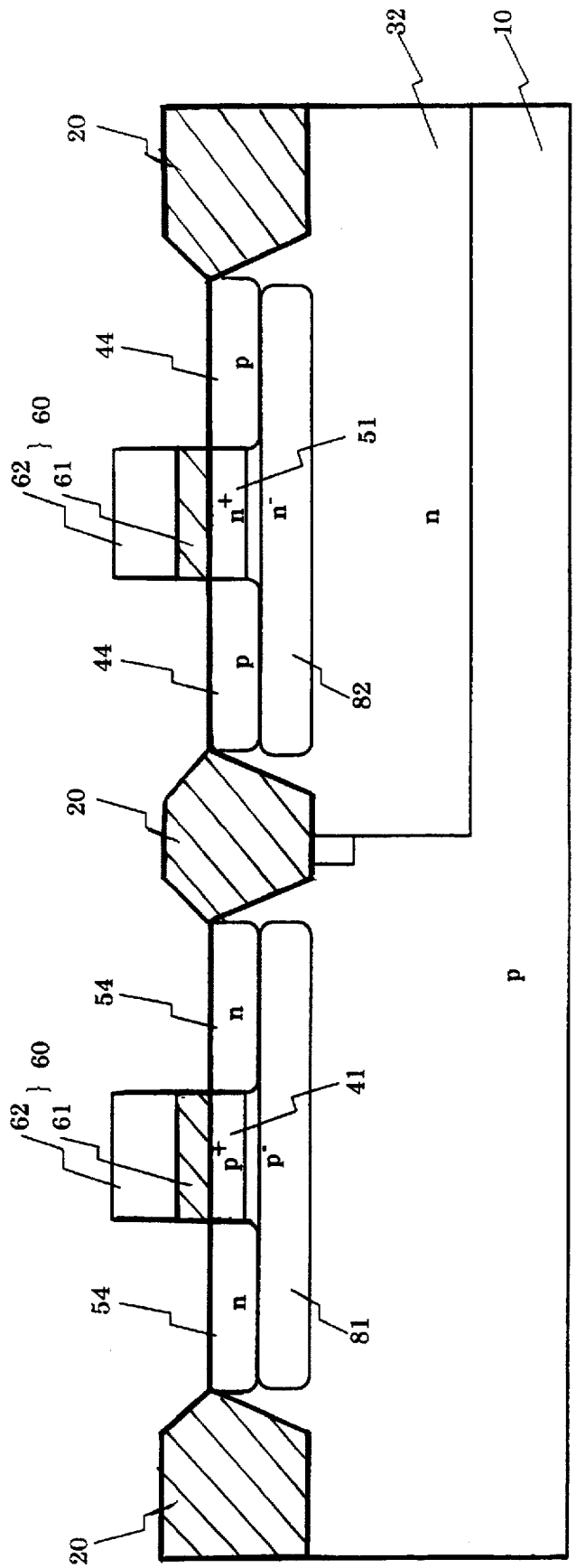
FIG. 23 is a cross sectional elevation view illustrative of a novel structure of a MOS field effect transistor in a tenth embodiment according to the present invention.

A tenth embodiment according to the present invention will be described wherein an improved CMOS device is provided. A structure of the CMOS device is illustrated in FIG. 23. A p-type semiconductor substrate 10 has an n-type well region 32. Field oxide films 20 are selectively provided in a surface of the substrate 10 to separate the n-type well region 32 from the p-type region of the substrate 10. An n-channel MOS field effect transistor is provided in the p-type region of the substrate 10. A p-channel MOS field effect transistor is provided in the n-type well region 32. The n-channel MOS field effect transistor has a gate structure 60 comprising a gate oxide film 61 and a gate electrode 62, n-type source/drain diffusion regions 54 and a p-type high impurity concentration channel region 41. There is further provided a single p-type low impurity concentration diffusion region 81 extending under the n-type source/drain diffusion regions 54. The p-channel MOS field effect transistor has a gate structure 60 comprising a gate oxide film 61 and a gate electrode 62, p-type source/drain diffusion regions 44, an n-type high impurity concentration channel region 51 and a s ingle n-type low impurity concentration diffusion layer 82 extending under the p-type source/drain diffusion regions 44. The p-type low impurity concentration diffusion layer 81 has a lower impurity concentration than an impurity concentration of the p-type region of the substrate 10 to thereby reduce a p-n junction capacitance of the n-type source/drain diffusion regions 54. As a result, the n-channel MOS field effect transistor may show high speed and high frequency performances. The n-type low impurity concentration diffusion layer 82 has a lower impurity concentration than an impurity concentration of the n-type well region 32 to thereby reduce a p-n junction capacitance of the p-type source/drain diffusion regions 44. As a result, the p-channel MOS field effect transistor may show high speed and high frequency performances.

The impurity concentrations of the source/drain diffusion regions 54 and the p-type low impurity concentration diffusion region 81 may be approximately $1\times10^{20}$ atoms/cm$^3$ and $1\times10^{15}$ atoms/cm$^3$ respectively. The impurity concentration of the semiconductor substrate 10 may be approximately $1\times10^{16}$ atoms/cm$^3$. The impurity concentrations of the source/drain diffusion regions 44 and the n-type low impurity concentration diffusion region 82 may be approximately $1\times10^{20}$ atoms/cm$^3$ and $1\times10^{16}$ atoms/cm$^3$ respectively. The impurity concentration of the n-type well region 32 may be approximately $1\times10^{17}$ atoms/cm$^3$.

Control electrodes not illustrated are provided to be electrically connected, with making a detour to avoid the p-type and n-type low impurity concentration diffusion layers 81 and 82, to the p-type and n-type high impurity concentration channel regions 41 and 51 so as to control a potential of the channel region by controlling a voltage applied to the control electrode.

Figure 24A:
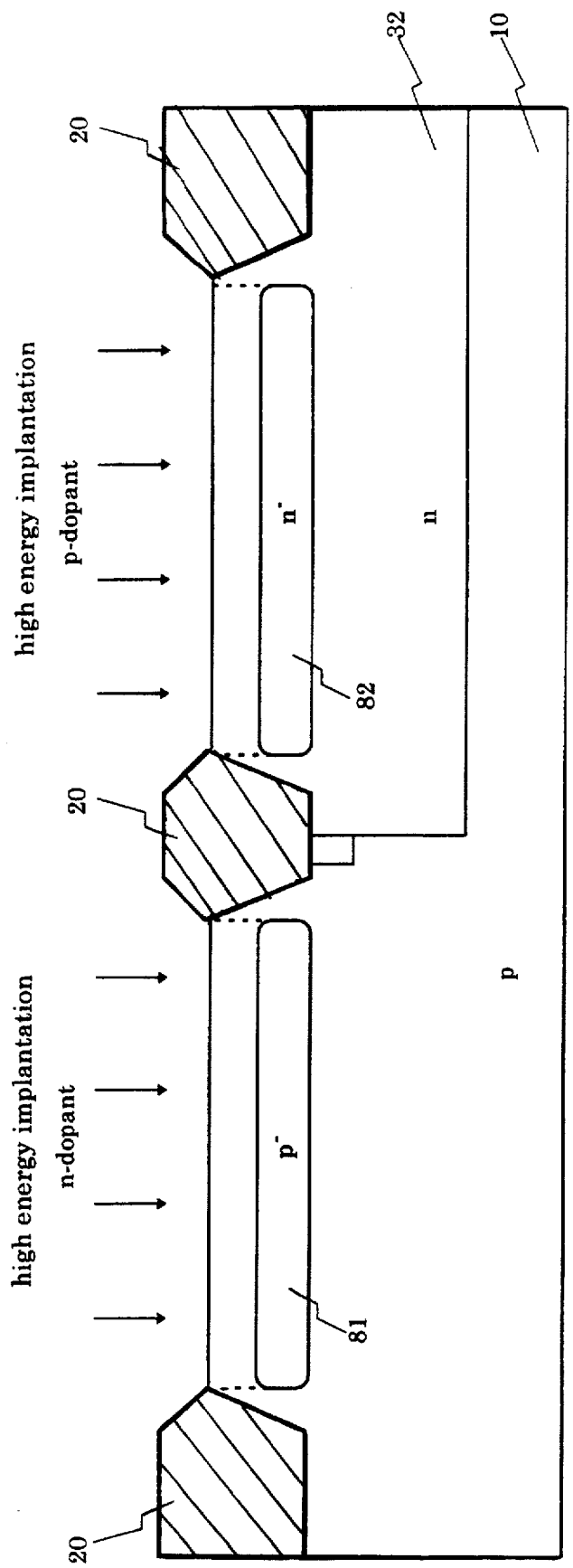
FIGS. 24A through 24D are cross sectional elevation views illustrative of MOS field effect transistors in sequential steps involved in a fabrication method thereof in a tenth embodiment according to the present invention.

The above CMOS device of this embodiment may be fabricated as follows. With reference to FIG. 24A, an n-type well region 32 is selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. An n-type impurity implantation into a deep level of the p-type region of the substrate 10 is carried out at a high implantation energy by using the field oxide films 20 as a mask to thereby form a p-type low impurity concentration diffusion layer 81 in the deep level in the p-type region of the substrate 10. A p-type impurity implantation into a deep level in the n-type well region 32 is carried out at a high implantation energy by using the field oxide films 20 as a mask to thereby form an n-type low impurity concentration diffusion layer 82 at the deep level in the n-type well region 32.

Figure 24B:
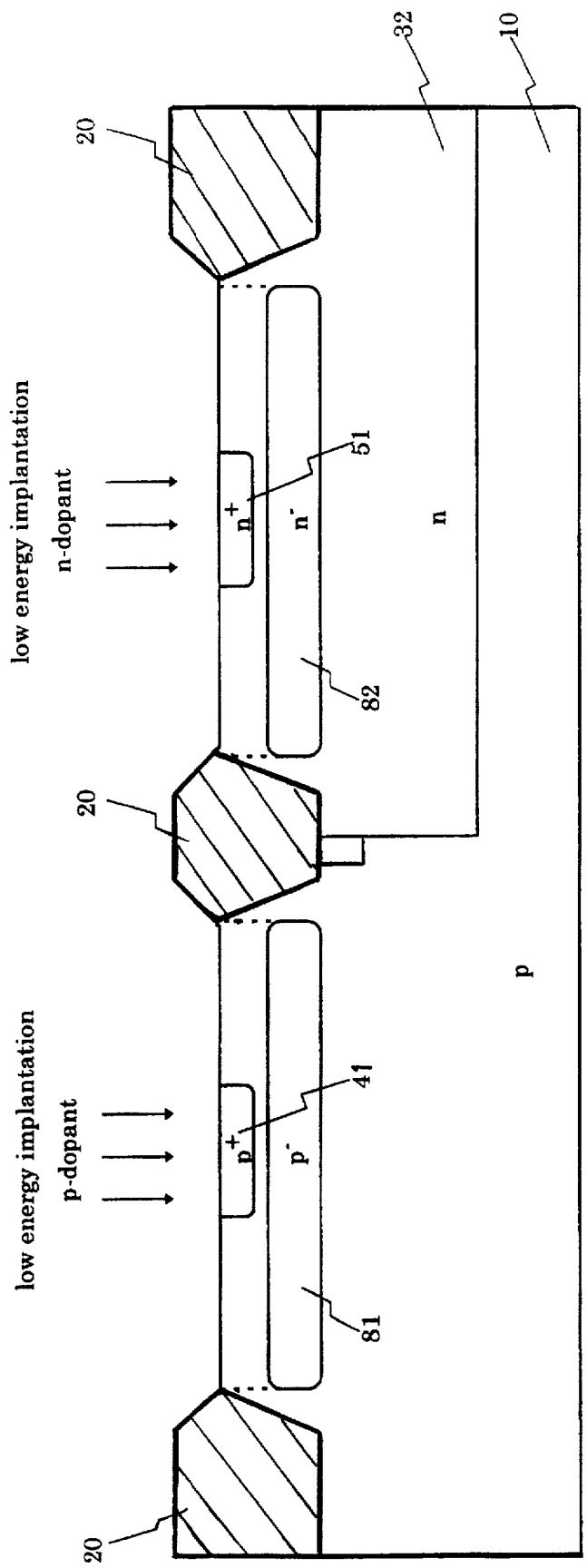

With reference to FIG. 24B, a p-type impurity implantation selectively into a channel region of the p-type semiconductor substrate 10 is carried out at a low implantation energy to thereby form the p-type high impurity concentration channel region 41. An n-type impurity implantation selectively into a channel region of the n-type well region 32 is carried out at a low implantation energy to thereby form the n-type high impurity concentration channel region 51.

Figure 24C:
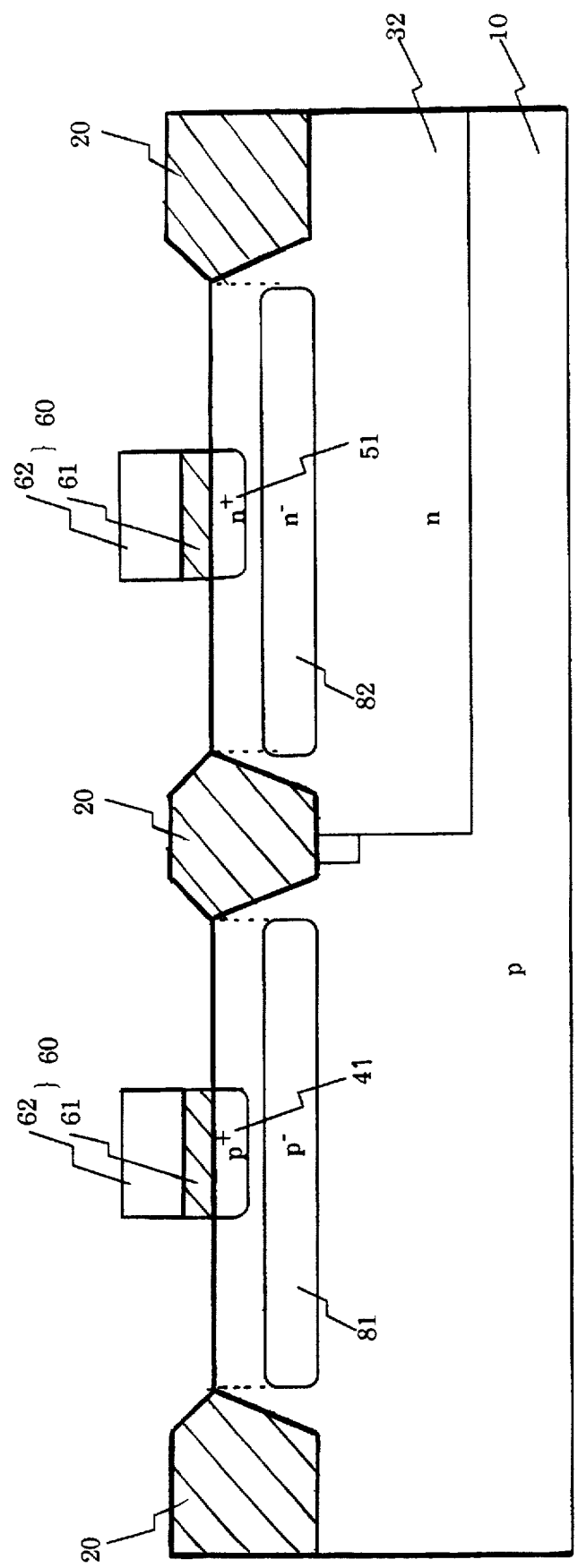

With reference to FIG. 24C, gate oxide films 61 are selectively formed on n-channel and p-channel regions in the p-type region of the substrate 10 and the n-type well region 32. Gate electrodes 62 are provided on the gate oxide films 61 to thereby form the gate structure 60.

Figure 24D:
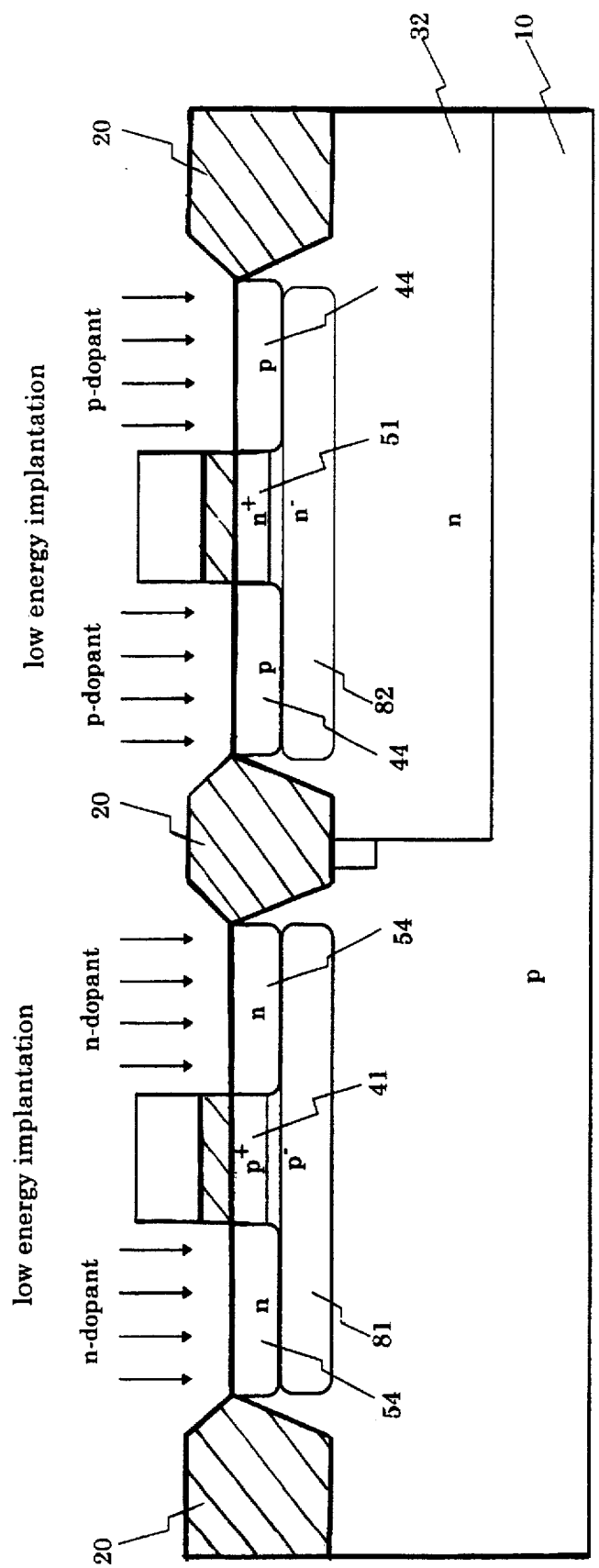

With reference to FIG. 24D, an n-type impurity implantation into the p-type region of the substrate 10 is carried out at a low implantation energy by using the gate structure 60 and the field oxide films 20 as masks to thereby form n-type source/drain diffusion regions 54. A p-type impurity implantation into the n-type well region 32 is carried out at a low implantation energy by using the gate structure 60 and the field oxide films 20 as masks to thereby form the p-type source/drain diffusion regions 44.

As a modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 25:
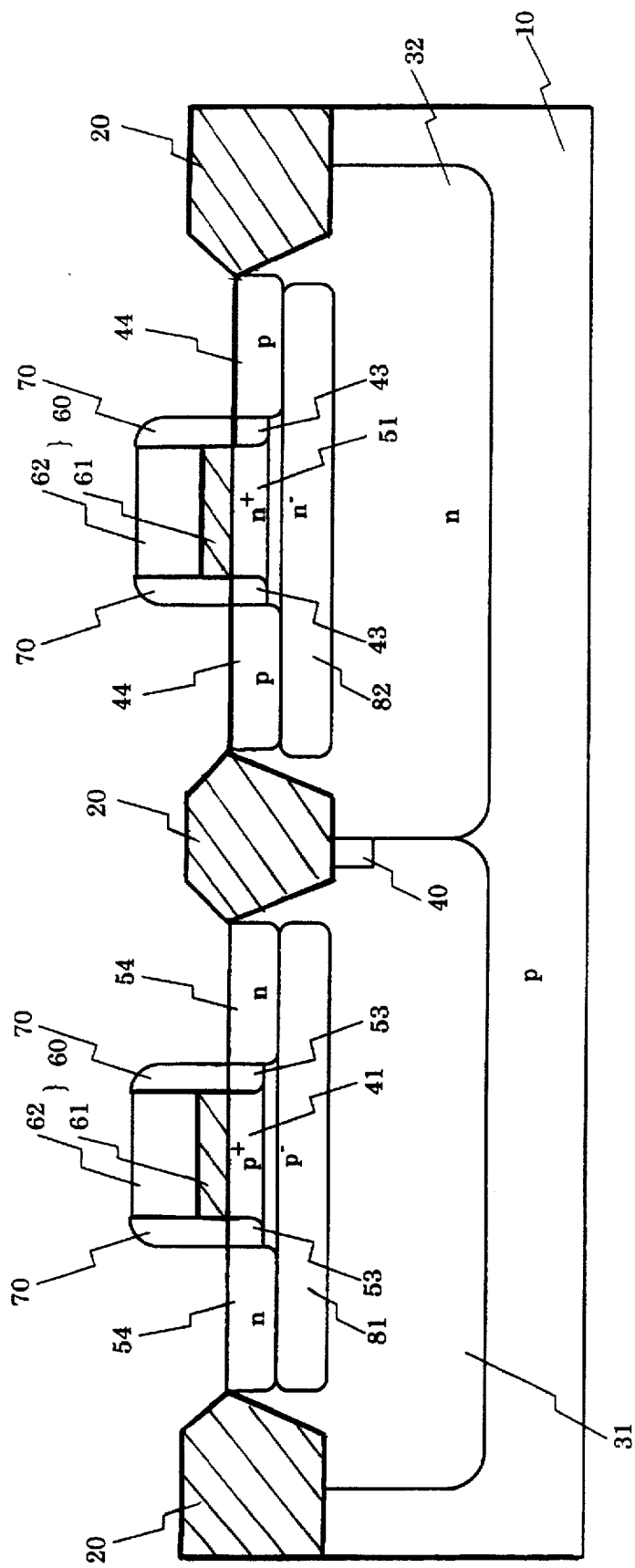
FIG. 25 is a cross sectional elevation view illustrative of a novel structure of a MOS field effect transistor in an eleventh embodiment according to the present invention.

An eleventh embodiment according to the present invention will be described wherein an improved CMOS device is provided. A structure of the CMOS device is illustrated in FIG. 25. A p-type semiconductor substrate 10 has p-type and n-type well regions 31 and 32. Field oxide films 20 are selectively provided in a surface of the substrate 10 to separate the n-type well region 32 from the p-type well region 31. An n-channel MOS field effect transistor is provided in the p-type well region 31. A p-channel MOS field effect transistor is provided in the n-type well region 32. The n-channel MOS field effect transistor has a gate structure 60 comprising a gate oxide film 61 and a gate electrode 62, gate side wall oxide films 70 provided on opposite sides of the gate structure 60, n-type source/drain diffusion regions 54, n-type lightly doped diffusion regions 53 just under the gate side wall oxide films 70 and insides of the n-type source/drain diffusion regions 54, a p-type high impurity concentration channel region 41 between the n-type lightly doped diffusion regions 53. There is further provided a single p-type low impurity concentration diffusion region 81 extending under the n-type source/drain diffusion regions 54. The p-channel MOS field effect transistor has a gate structure 60 comprising a gate oxide film 61 and a gate electrode 62, gate side wall oxide films 70 provided on opposite sides of the gate structure 60, p-type source/drain diffusion regions 44, p-type lightly doped diffusion regions 43 just under the gate side wall oxide films 70 and insides of the p-type source/drain diffusion regions 44 and an n-type high impurity concentration channel region 51. There is further provided a single n-type low impurity concentration diffusion layer 82 extending under the p-type source/drain diffusion regions 44. The p-type low impurity concentration diffusion layer 81 has a lower impurity concentration than an impurity concentration of the p-type well region 31 to thereby reduce a p-n junction capacitance of the n-type source/drain diffusion regions 54. As a result, the n-channel MOS field effect transistor may show high speed and high frequency performances. The n-type low impurity concentration diffusion layer 82 also has a lower impurity concentration than an impurity concentration of the n-type well region 32 to thereby reduce a p-n junction capacitance of the p-type source/drain diffusion regions 44. As a result, the p-channel MOS field effect transistor may show high speed and high frequency performances.

The impurity concentrations of the source/drain diffusion regions 54 and the p-type low impurity concentration diffusion region 81 may be approximately $1\times10^{20}$ atoms/cm$^3$ and $1\times10^{15}$ atoms/cm$^3$ respectively. The impurity concentration of the p-type well region may be approximately $1\times10^{16}$ atoms/cm$^3$. The impurity concentrations of the source/drain diffusion regions 44 and the n-type low impurity concentration diffusion region 82 may be approximately $1\times10^{20}$ atoms/cm$^3$ and $1\times10^{16}$ atoms/cm$^3$ respectively. The impurity concentration of the n-type well region 32 may be approximately $1\times10^{17}$ atoms/cm$^3$.

Control electrodes not illustrated are provided to be electrically connected, with making a detour to avoid the p-type and n-type low impurity concentration diffusion layers 81 and 82, to the p-type and n-type high impurity concentration channel regions 41 and 51 so as to control a potential of the channel region by controlling a voltage applied to the control electrode.

Figure 26A:
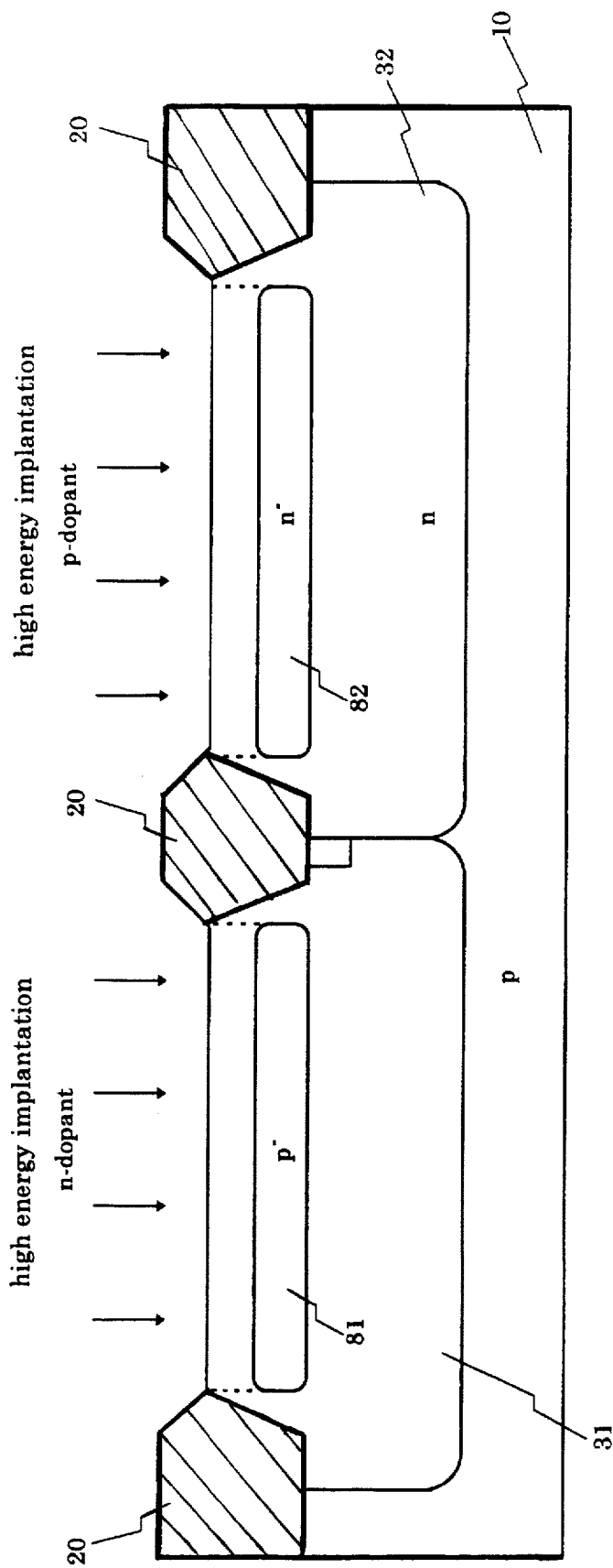
FIGS. 26A through 26E are cross sectional elevation views illustrative of MOS field effect transistors in sequential steps involved in a fabrication method thereof in an eleventh embodiment according to the present invention.

The above CMOS device of this embodiment may be fabricated as follows. With reference to FIG. 26A, p-type and n-type well regions 31 and 32 are selectively formed in a p-type semiconductor substrate 10. A channel stopper is provided on an edge of the n-type well region 32. Field oxide films 20 are selectively formed in a surface of the substrate 10 to separate the n-type well region 32 from the p-type well region 31. An n-type impurity implantation into a deep level of the p-type well region 31 is carried out at a high implantation energy by using the field oxide films 20 as a mask to thereby form a p-type low impurity concentration diffusion layer 81 in the deep level in the p-type well region 31. A p-type impurity implantation into a deep level in the n-type well region 32 is carried out at a high implantation energy by using the field oxide films 20 as a mask to thereby form an n-type low impurity concentration diffusion layer 82 at the deep level in the n-type well region 32.

Figure 26B:
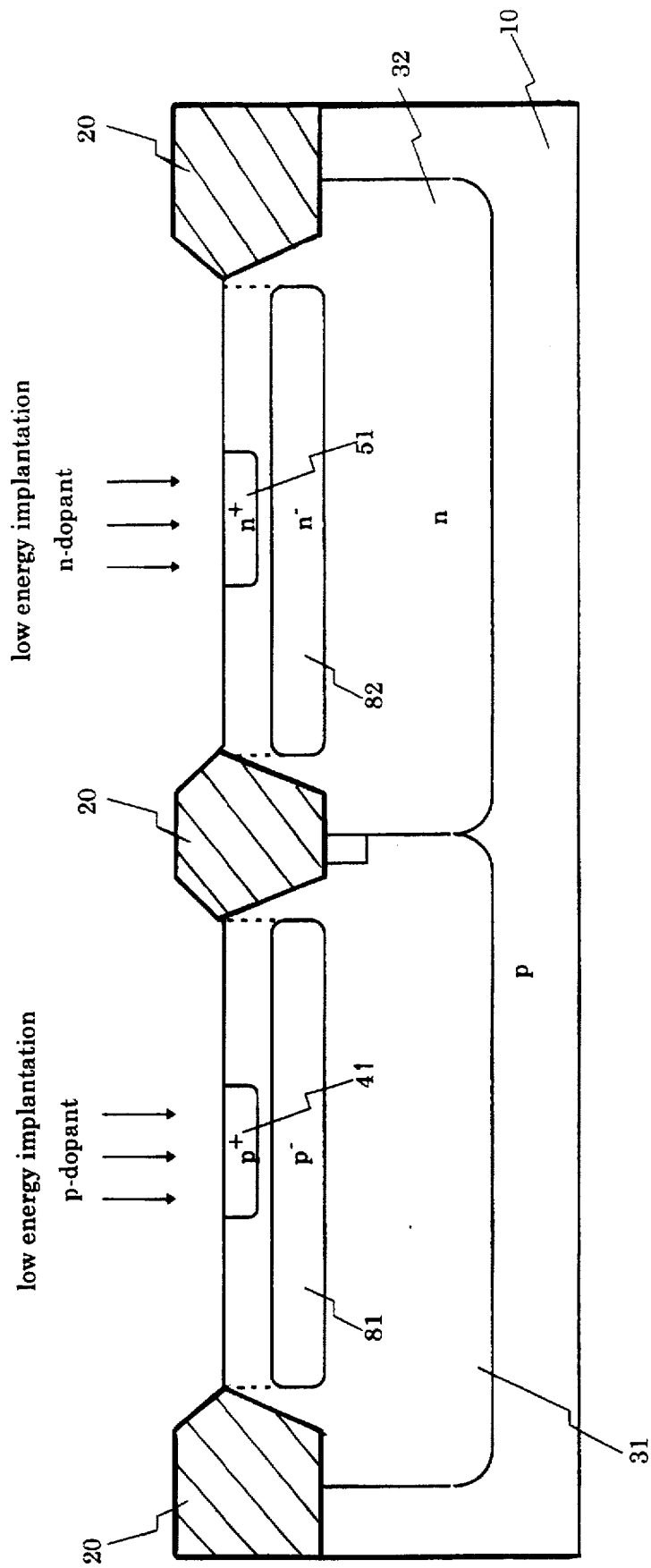

With reference to FIG. 26B, a p-type impurity implantation selectively into a channel region of the p-type well region 31 is carried out at a low implantation energy to thereby form the p-type high impurity concentration channel region 41. An n-type impurity implantation selectively into a channel region of the n-type well region 32 is also carried out at a low implantation energy to thereby form the n-type high impurity concentration channel region 51.

Figure 26C:
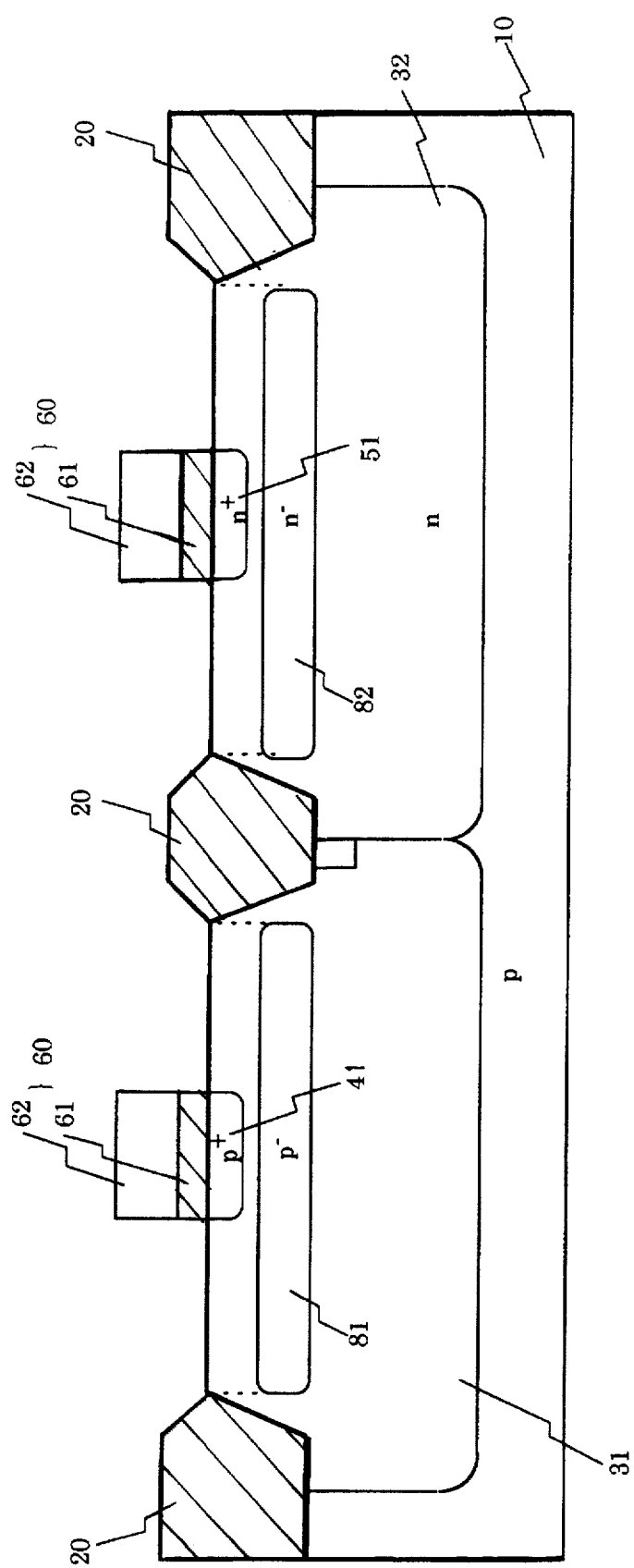

With reference to FIG. 26C, gate oxide films 61 are selectively formed on n-channel and p-channel regions in the p-type region of the substrate 10 and the n-type well region 32. Gate electrodes 62 are provided on the gate oxide films 61 to thereby form the gate structure 60.

Figure 26D:
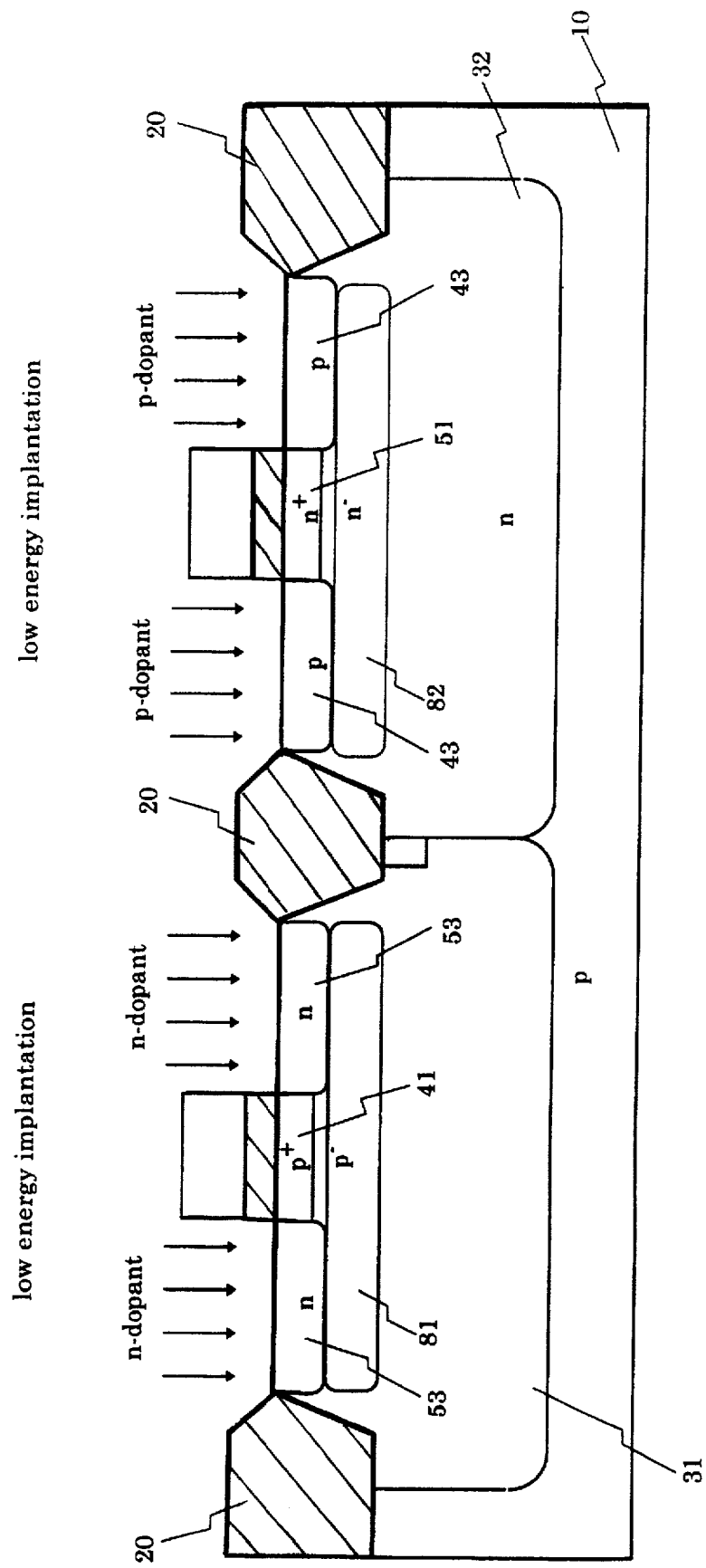

With reference to FIG. 26D, an n-type impurity implantation into the p-type region of the substrate 10 is carried out at a low implantation energy by using the gate structure 60 and the field oxide films 20 as masks to thereby form n-type lightly doped diffusion regions 53. A p-type impurity implantation into the n-type well region 32 is also carried out at a low implantation energy by using the gate structure 60 and the field oxide films 20 as masks to thereby form the p-type lightly doped diffusion regions 43.

Figure 26E:
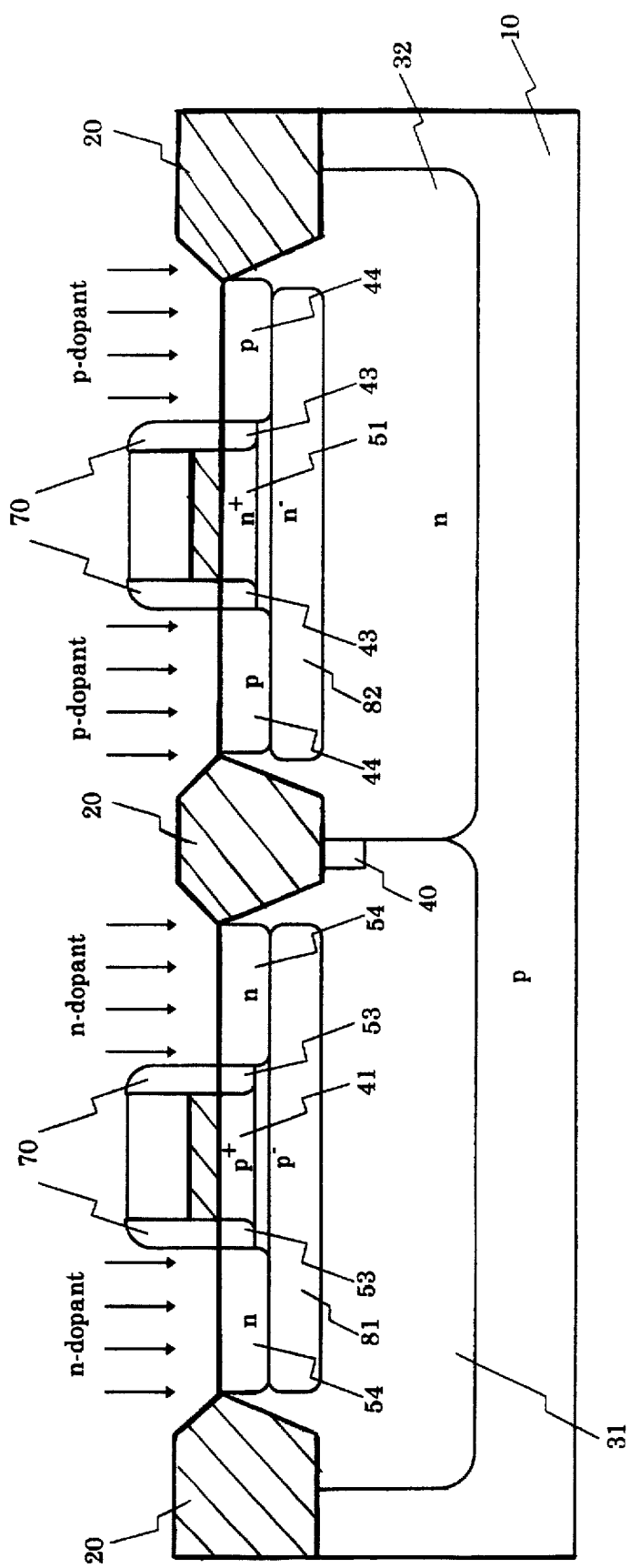

With reference to FIG. 26E, gate side wall oxide films 70 are formed on opposite side walls of each of the gate structures 60 on the p-type and n-type well region 31 and 32 respectively. An n-type impurity implantation into the n-type lightly doped diffusion regions 53 is carried out at a low implantation energy by using the gate structure 60 provided with the gate side wall oxide films 70 and the field oxide films 20 as masks to thereby form n-type source/drain diffusion regions 54 having bottoms in contact with a top of the single p-type low impurity concentration diffusion layer 81 to thereby reduce the p-n junction capacitance of the n-type source/drain diffusion regions 54. A p-type impurity implantation into the p-type lightly doped diffusion regions 43 is carried out at a low implantation energy by using the gate structure 60 provided with the gate side wall oxide films 70 and the field oxide films 20 as masks to thereby form p-type source/drain diffusion regions 44 having bottoms in contact with a top of the single n-type low impurity concentration diffusion layer 82 to thereby reduce the p-n junction capacitance of the n-type source/drain diffusion regions 44.

Figure 27:
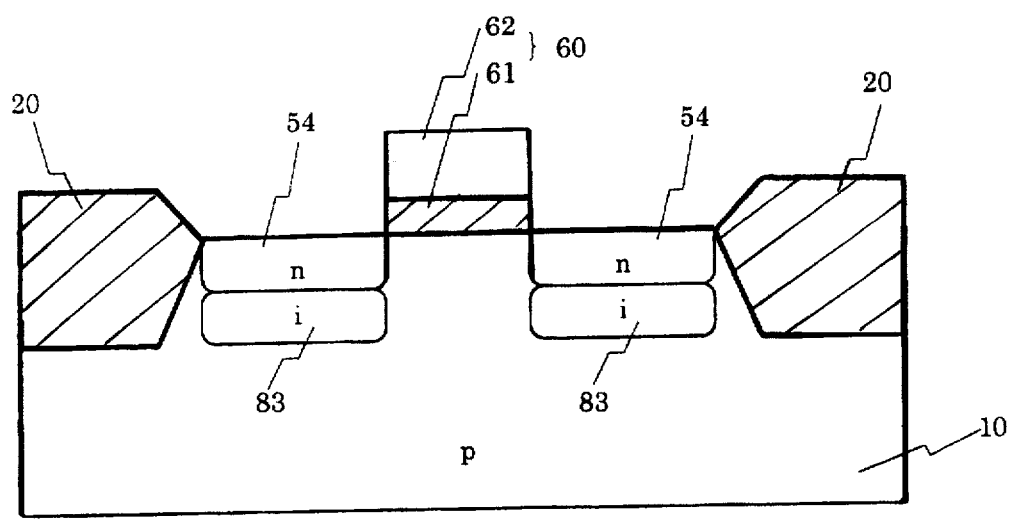
FIG. 27 is a cross sectional elevation view illustrative of a novel structure of a MOS field effect transistor in a twelfth embodiment according to the present invention.

A twelfth embodiment of the present invention will be described wherein another n-channel MOS field effect transistor is provided. A structure of the n-channel MOS field effect transistor is illustrated in FIG. 27. The n-channel MOS field effect transistor includes a p-type semiconductor substrate 10, field oxide films 20 selectively provided in a surface of the p-type semiconductor substrate 10, n-type source/drain diffusion regions 54 to define a channel region between them and a gate structure 60 provided on the channel region. The gate structure 60 comprises a gate oxide film provided on the channel region and a gate electrode 62 provided on the gate oxide film 61. There are further provided quasi-intrinsic semiconductor layers 83 just under the source/drain diffusion regions 54 wherein top portions of the quasi-intrinsic semiconductor layers 83 are in contact with bottoms of the n-type source/drain diffusion regions 54. The quasi-intrinsic semiconductor layers 83 are defined as layers having the same n-type and p-type impurity concentrations or having the same number of doners and accepters respectively providing electrons and holes serving as carriers, for which reason the layers show almost the same properties and performances as an intrinsic semiconductor layer. This means that the quasi-intrinsic semiconductor layers 83 act almost as the intrinsic semiconductor layers. The quasi-intrinsic semiconductor layers 83 generate no p-n junction interface to the n-type source/drain diffusion regions 54. As a result, the n-type source/drain diffusion regions 54 have an extremely small p-n junction capacitance which is generated between side portions of the source/drain diffusion regions 54 and the p-type semiconductor substrate 10. Then, the n-type source/drain diffusion regions 54 have an extremely small capacitance to thereby allow the n-channel MOS field effect transistor to show high speed and high frequency performances.

As a modification of this embodiment, in place of the quasi-intrinsic semiconductor layers 83, intrinsic semiconductor layers having no p-type impurity nor n-type impurity may be provided to reduce the capacitance of the source/drain diffusion regions 54.

Figure 28A:
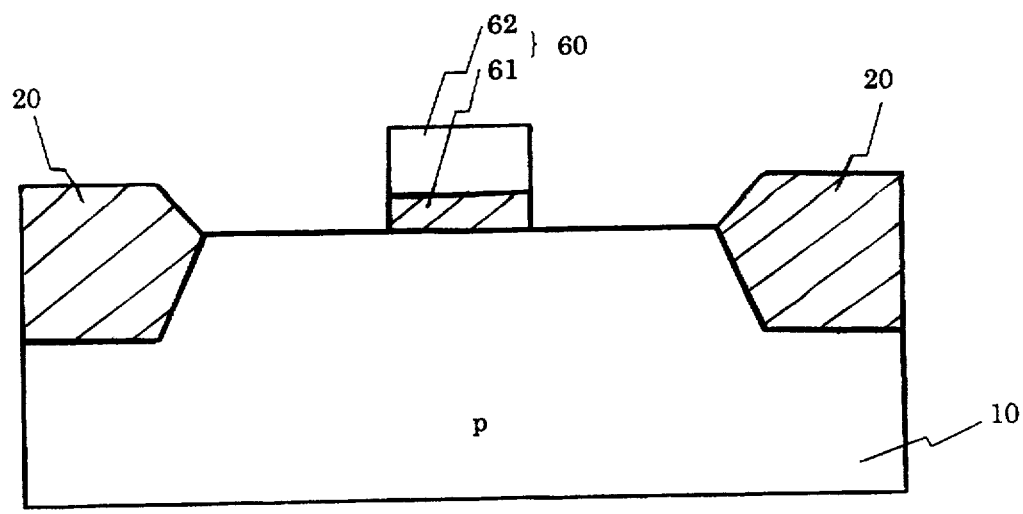
FIGS. 28A through 28C are cross sectional elevation views illustrative of MOS field effect transistors in sequential steps involved in a fabrication method thereof in a twelfth embodiment according to the present invention.

The above n-channel MOS field effect transistor may be fabricated as follows. With reference to FIG. 28A, field oxide films 20 are selectively formed in a surface of a p-type semiconductor substrate 10. A gate oxide film 61 is selectively formed on a channel region of the p-type semiconductor substrate 10. A gate electrode 62 is then provided on the gate oxide film 61 to thereby form a gate structure 60.

Figure 28B:
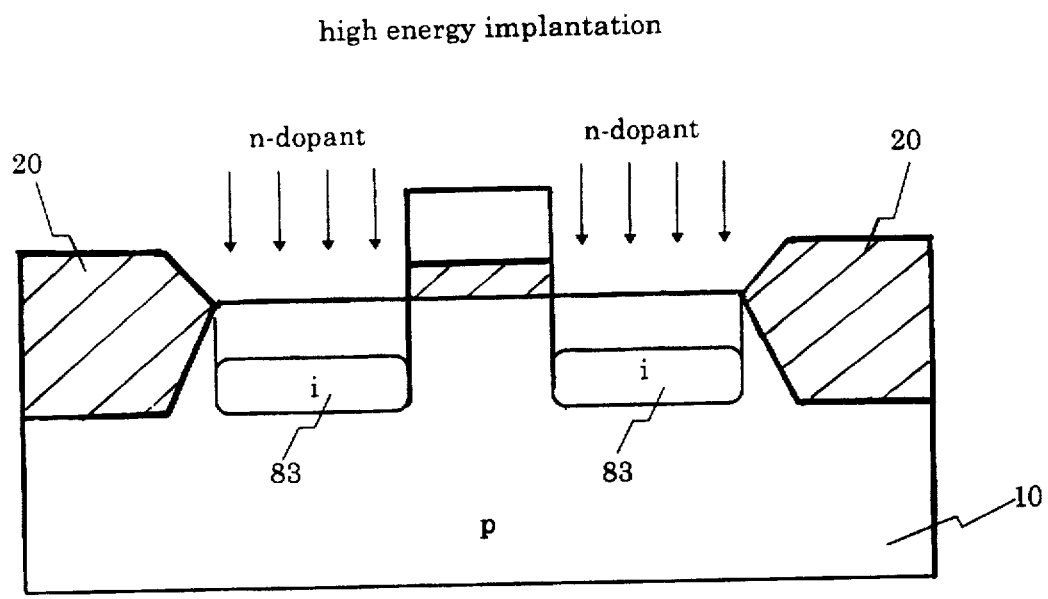

With reference to FIG. 28B, an n-type impurity implantation into a deep region of the p-type semiconductor substrate 10 is carried out by using the field oxide films 20 as a mask at a high implantation energy so that the n-type impurity concentration is increased and then become equal to the p-type impurity concentrations to thereby form quasi-intrinsic semiconductor layers 83.

Figure 28C:
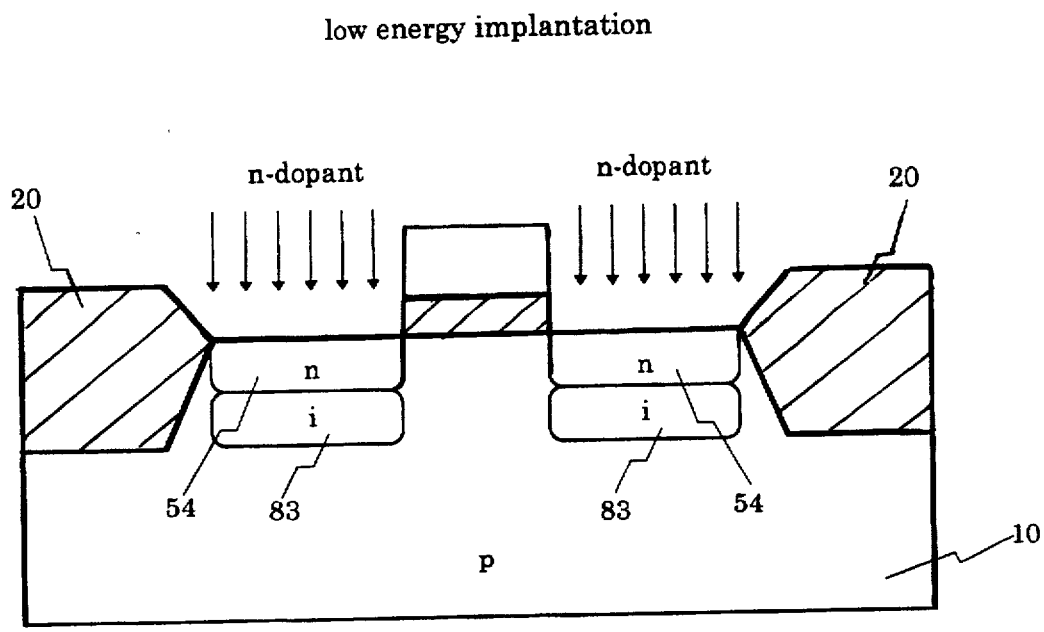

With reference to FIG. 28C, an n-type impurity implantation into a surface of the p-type semiconductor substrate 10 is carried out at a low implantation energy by using the gate structure 60 and the field oxide films 20 as masks to form the n-type source/drain diffusion regions 54 having bottoms in contact with top surfaces of the quasi-intrinsic semiconductor layers 83.

The above present invention of this embodiment may be applicable to the p-channel MOS field effect transistor by changing the conductivity type of the impurities.

As a moreover modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 29:
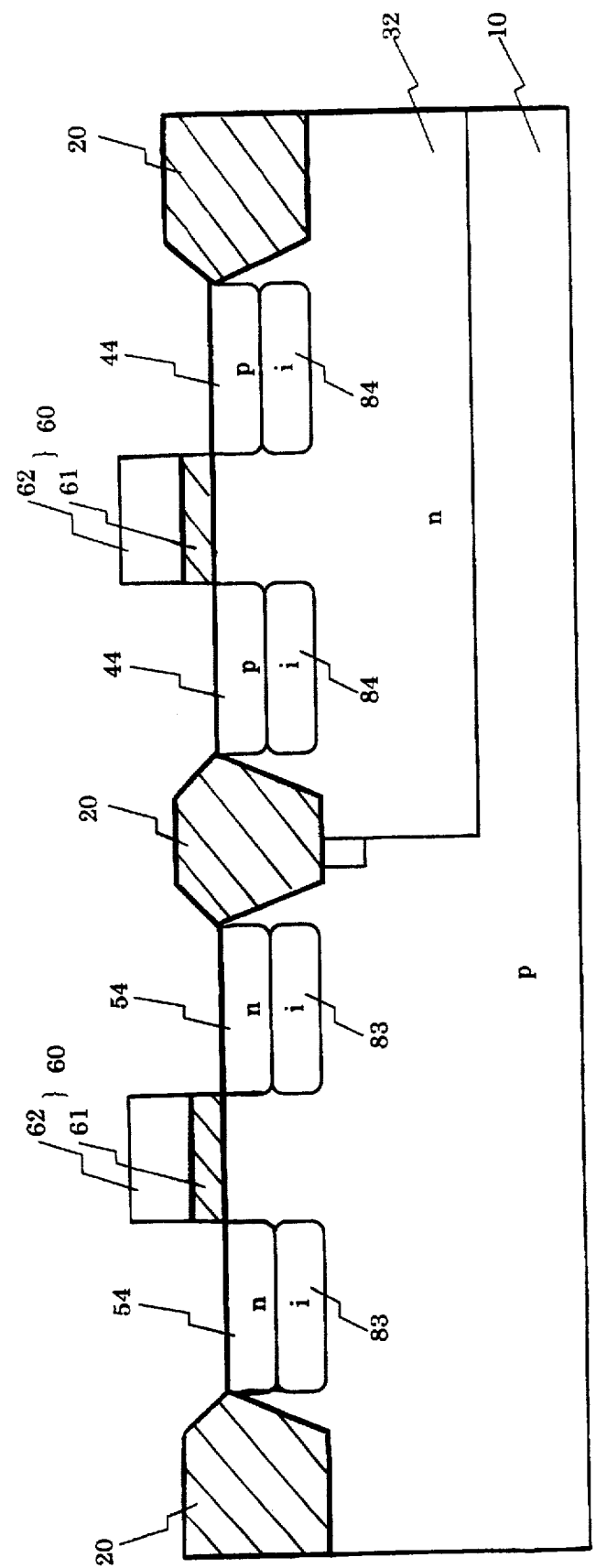
FIG. 29 is a cross sectional elevation view illustrative of a novel structure of a MOS field effect transistor in a thirteenth embodiment according to the present invention.

A thirteenth embodiment according to the present invention will be described wherein an improved CMOS device is provided. A structure of the CMOS device is illustrated in FIG. 29. A p-type semiconductor substrate 10 has an n-type well region 32. Field oxide films 20 are selectively provided in a surface of the substrate 10 to separate the n-type well region 32 from the p-type region of the substrate 10. An n-channel MOS field effect transistor is provided in the p-type region of the substrate 10. A p-channel MOS field effect transistor is provided in the n-type well region 32. The n-channel MOS field effect transistor has a gate structure 60 comprising a gate oxide film 61 and a gate electrode 62 and n-type source/drain diffusion regions 54. The p-channel MOS field effect transistor has a gate structure 60 comprising a gate oxide film 61 and a gate electrode 62 and p-type source/drain diffusion regions 44.

The n-channel and p-channel MOS field effect transistors are further provided quasi-intrinsic semiconductor layers 83 and 84 just under the n-type and p-type source/drain diffusion regions 54 and 44 respectively wherein top portions of the quasi-intrinsic semiconductor layers 83 and 84 are in contact with bottoms of the n-type and p-type source/drain diffusion regions 54 respectively. The quasi-intrinsic semiconductor layers 83 and 84 are defined as layers having the same n-type and p-type impurity concentrations or having the same number of doners and accepters respectively providing electrons and holes serving as carriers, for which reason the layers show almost the same properties and performances as an intrinsic semiconductor layer. This means that the quasi-intrinsic semiconductor layers 83 and 84 act almost as the intrinsic semiconductor layers. The quasi-intrinsic semiconductor layers 83 and 84 generate no p-n junction interface to each of the n-type and p-type source/drain diffusion regions 54. As a result, the n-type and p-type source/drain diffusion regions 54 and 44 have an extremely small p-n junction capacitance which is generated at side portions of the n-type and p-type source/drain diffusion regions 54 and 44. Then, the n-type and p-type source/drain diffusion regions 54 and 44 have extremely small capacitances to thereby allow the n-channel and p-channel MOS field effect transistors to show high speed and high frequency performances.

As a modification of this embodiment, in place of the quasi-intrinsic semiconductor layers 83 and 84, intrinsic semiconductor layers having no p-type impurity nor n-type impurity may be provided to reduce the capacitance of the n-type and p-type source/drain diffusion regions 54 and 44.

Figure 30A:
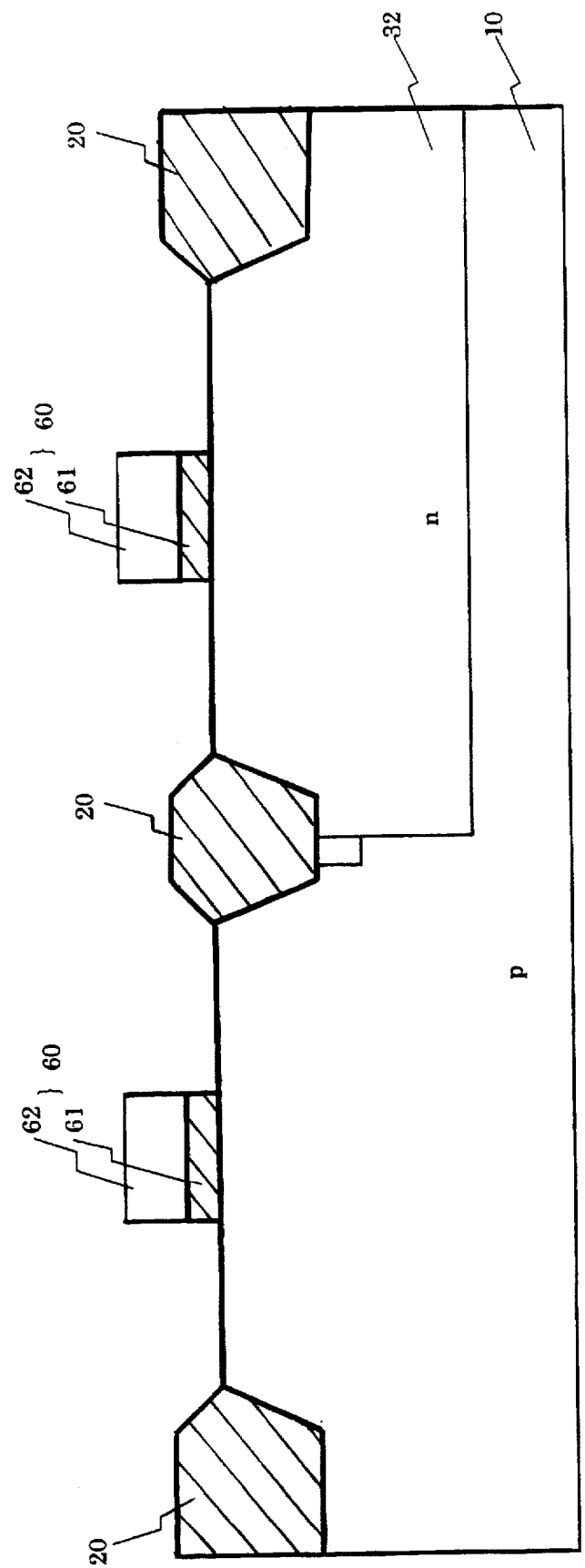
FIGS. 30A through 30C are cross sectional elevation views illustrative of MOS field effect transistors in sequential steps involved in a fabrication method thereof in a thirteenth embodiment according to the present invention.

The above CMOS device of this embodiment may be fabricated as follows. With reference to FIG. 30A, an n-type well region 32 is selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. Gate oxide films 61 are selectively formed on n-channel and p-channel regions in the p-type region of the substrate 10 and the n-type well region 32. Gate electrodes 62 are provided on the gate oxide films 61 to thereby form the gate structure 60.

Figure 30B:
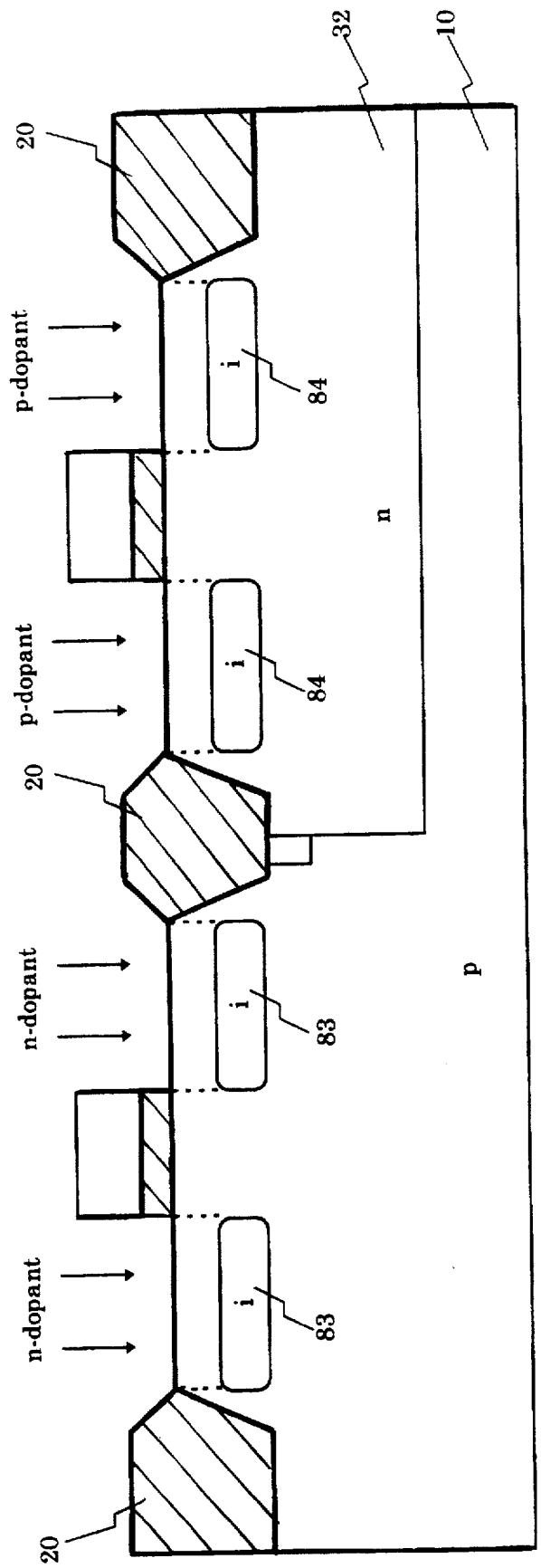

With reference to FIG. 30B, an n-type impurity implantation into a deep region of the p-type region of the semiconductor substrate 10 is carried out by using the gate structure 60 and the field oxide films 20 as masks at a high implantation energy so that the n-type impurity concentration is increased and then become equal to the p-type impurity concentrations to thereby form quasi-intrinsic semiconductor layers 83. A p-type impurity implantation into a deep region of the n-type well region 32 is carried out by using the gate structure 60 and the field oxide films 20 as masks at a high implantation energy so that the p-type impurity concentration is increased and then become equal to the n-type impurity concentrations to thereby form quasi-intrinsic semiconductor layers 84.

Figure 30C:
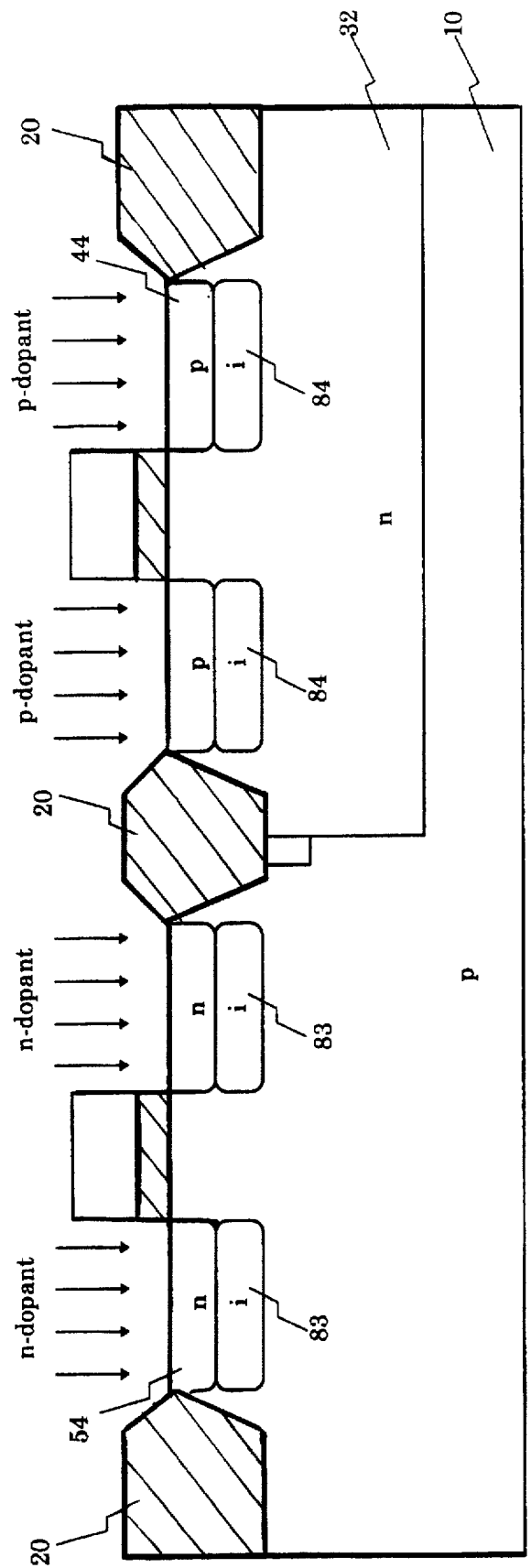

With reference to FIG. 30C, an n-type impurity implantation into the p-type region of the substrate 10 is carried out at a low implantation energy by using the gate structure 60 and the field oxide films 20 as masks to thereby form n-type source/drain diffusion regions 54. A p-type impurity implantation into the n-type well region 32 is carried out at a low implantation energy by using the gate structure 60 and the field oxide films 20 as masks to thereby form the p-type source/drain diffusion regions 44.

As a modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 31:
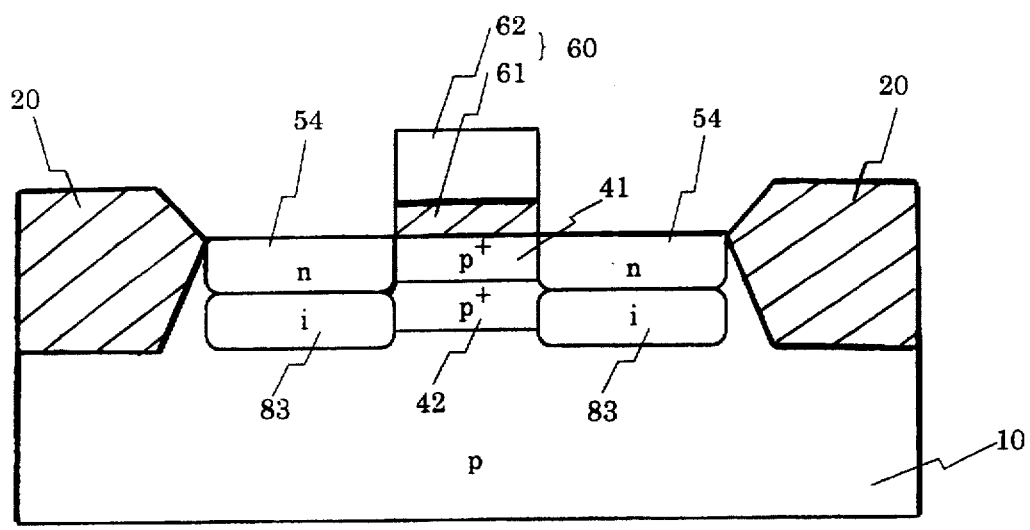
FIG. 31 is a cross sectional elevation view illustrative of a novel structure of a MOS field effect transistor in a fourteenth embodiment according to the present invention.

A fourteenth embodiment of the present invention will be described wherein another n-channel MOS field effect transistor is provided. A structure of the n-channel MOS field effect transistor is illustrated in FIG. 31. The n-channel MOS field effect transistor includes a p-type semiconductor substrate 10, field oxide films 20 selectively provided in a surface of the p-type semiconductor substrate 10, n-type source/drain diffusion regions 54, a p-type high impurity concentration channel region 41, a p-type high impurity concentration bottom region 42 junst under the p-type high impurity concentration channel region 41 and a gate structure 60 provided on the p-type high impurity concentration channel region 41. The gate structure 60 comprises a gate oxide film provided on the channel region and a gate electrode 62 provided on the gate oxide film 61. There are further provided quasi-intrinsic semiconductor layers 83 just under the source/drain diffusion regions 54 wherein top portions of the quasi-intrinsic semiconductor layers 83 are in contact with bottoms of the n-type source/drain diffusion regions 54.

As a modification of this embodiment, in place of the quasi-intrinsic semiconductor layers 83, intrinsic semiconductor layers having no p-type impurity nor n-type impurity may be provided to reduce the capacitance of the source/drain diffusion regions 54.

Figure 32A:
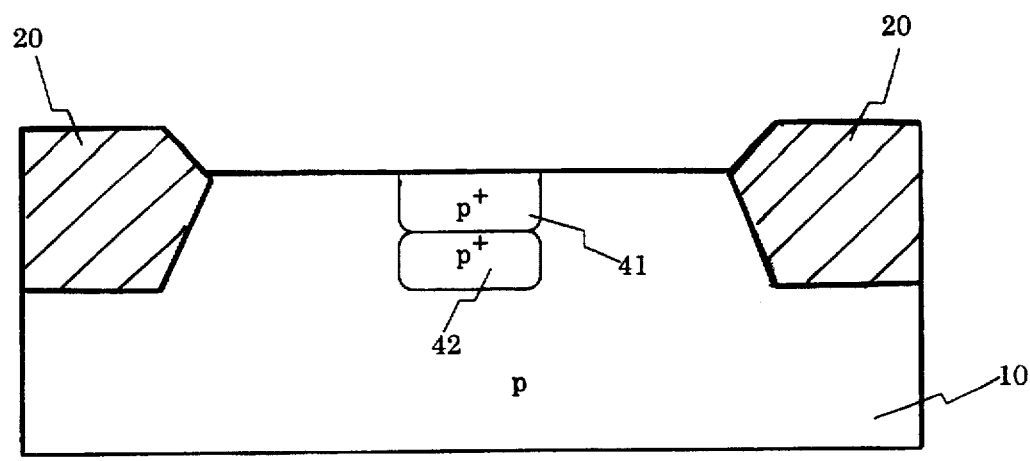
FIGS. 32A through 32D are cross sectional elevation views illustrative of MOS field effect transistors in sequential steps involved in a fabrication method thereof in a fourteenth embodiment according to the present invention.
Figure 32B:
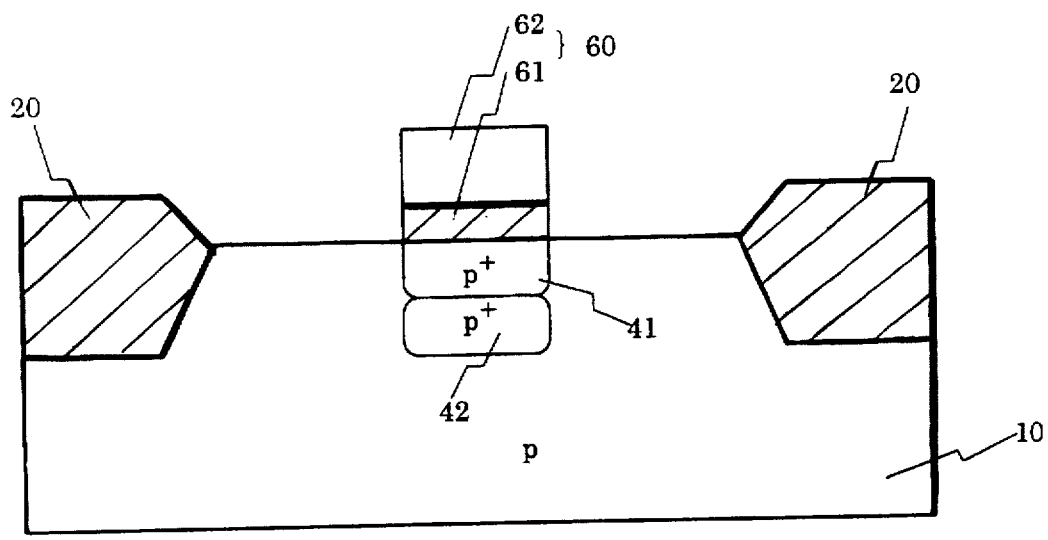

The above n-channel MOS field effect transistor may be fabricated as follows. With reference to FIG. 32A, field oxide films 20 are selectively formed in a surface of a p-type semiconductor substrate 10. Selective p-type impurity implantations into a channel region are carried out at different energies to thereby form a p-type high impurity concentration channel region 41 and a p-type high impurity concentration bottom region 42 just under the p-type high impurity concentration channel region 41. With reference to FIG. 32B, a gate oxide film 61 is selectively formed on a channel region of the p-type semiconductor substrate 10. A gate electrode 62 is then provided on the gate oxide film 61 to thereby form a gate structure 60.

Figure 32C:
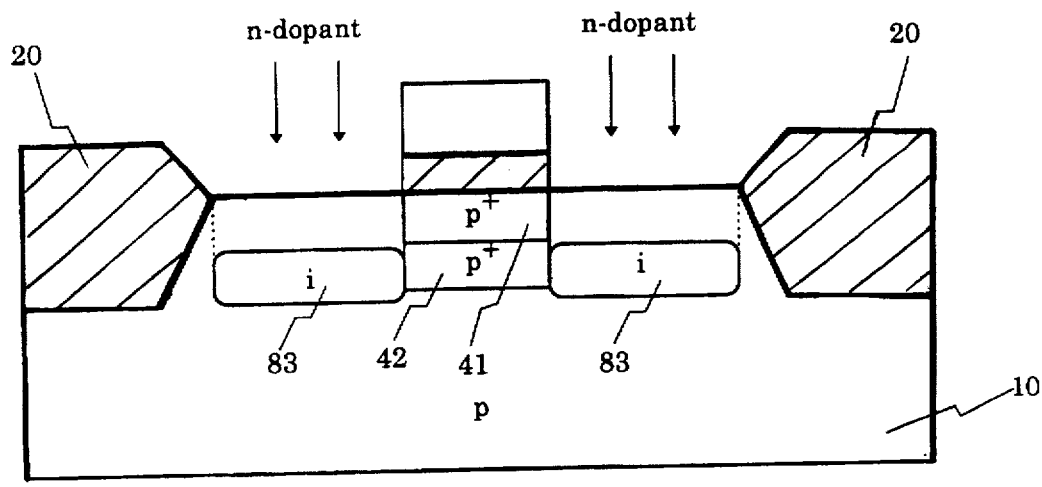

With reference to FIG. 32C, an n-type impurity implantation into a deep region of the p-type semiconductor substrate 10 is carried out by using the field oxide films 20 as a mask at a high implantation energy so that the n-type impurity concentration is increased and then become equal to the p-type impurity concentrations to thereby form quasi-intrinsic semiconductor layers 83.

Figure 32D:
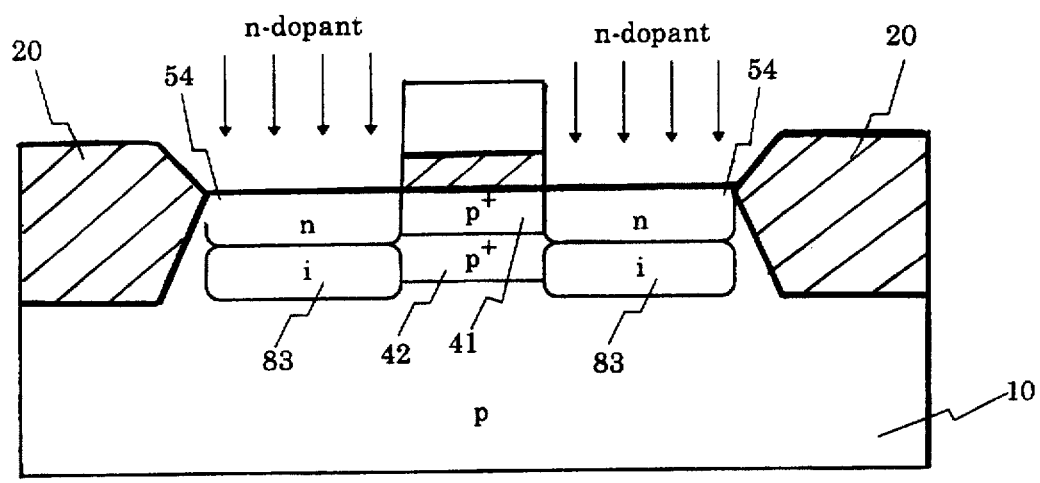

With reference to FIG. 32D, an n-type impurity implantation into a surface of the p-type semiconductor substrate 10 is carried out at a low implantation energy by using the gate structure 60 and the field oxide films 20 as masks to form the n-type source/drain diffusion regions 54 having bottoms in contact with top surfaces of the quasi-intrinsic semiconductor layers 83.

The above present invention of this embodiment may be applicable to the p-channel MOS field effect transistor by changing the conductivity type of the impurities.

As a moreover modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 33:
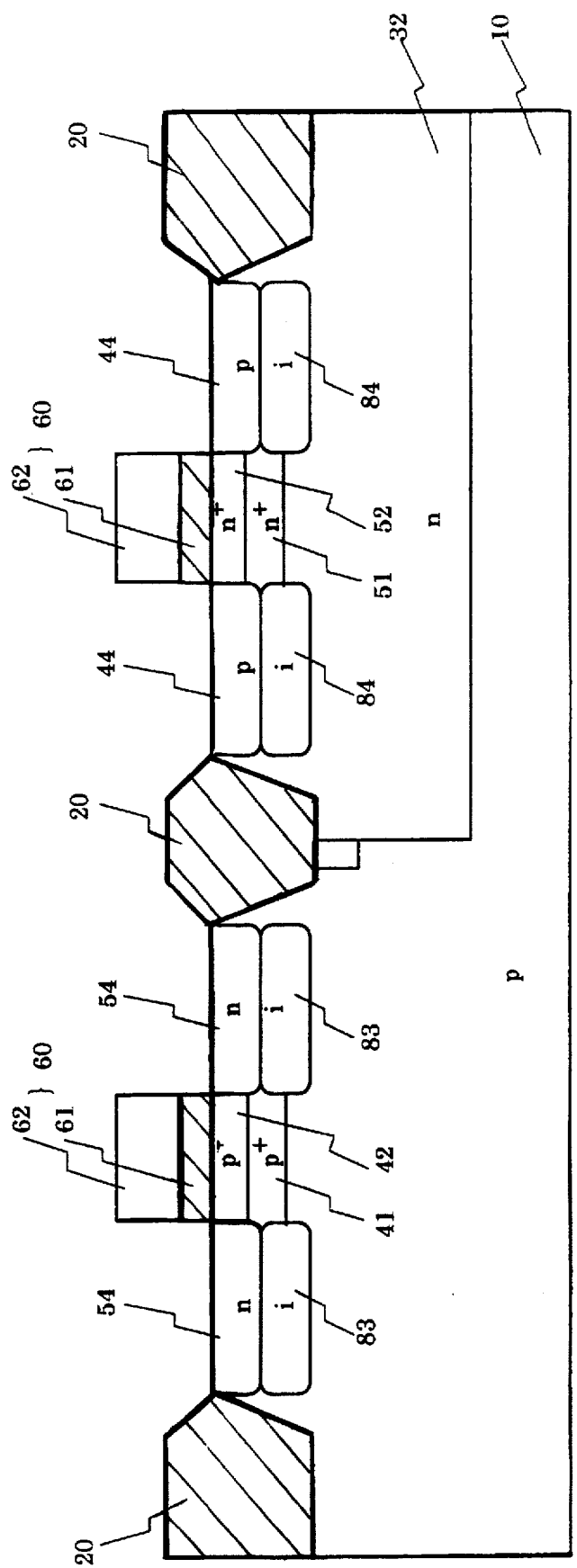
FIG. 33 is a cross sectional elevation view illustrative of a novel structure of a MOS field effect transistor in a fifteenth embodiment according to the present invention.

A fifteenth embodiment according to the present invention will be described wherein an improved CMOS device is provided. A structure of the CMOS device is illustrated in FIG. 33. A p-type semiconductor substrate 10 has an n-type well region 32. Field oxide films 20 are selectively provided in a surface of the substrate 10 to separate the n-type well region 32 from the p-type region of the substrate 10. An n-channel MOS field effect transistor is provided in the p-type region of the substrate 10. A p-channel MOS field effect transistor is provided in the n-type well region 32. The n-channel MOS field effect transistor has a gate structure 60 comprising a gate oxide film 61 and a gate electrode 62, a p-type high impurity concentration channel region 42, a p-type high impurity concentration bottom region 41 just under the p-type high impurity concentration channel region 42 and n-type source/drain diffusion regions 54. The p-channel MOS field effect transistor has a gate structure 60 comprising a gate oxide film 61 and a gate electrode 62, an n-type high impurity concentration channel region 52, an n-type high impurity concentration bottom region 51 just under the n-type high impurity concentration channel region 52 and p-type source/drain diffusion regions 44.

The n-channel and p-channel MOS field effect transistors are further provided with quasi-intrinsic semiconductor layers 83 and 84 just under the n-type and p-type source/drain diffusion regions 54 and 44 respectively wherein top portions of the quasi-intrinsic semiconductor layers 83 and 84 are in contact with bottoms of the n-type and p-type source/drain diffusion regions 54 and 44 respectively. The quasi-intrinsic semiconductor layers 83 and 84 are defined as layers having the same n-type and p-type impurity concentrations or having the same number of doners and accepters respectively providing electrons and holes serving as carriers, for which reason the layers show almost the same properties and performances as an intrinsic semiconductor layer. This means that the quasi-intrinsic semiconductor layers 83 and 84 act almost as the intrinsic semiconductor layers. The quasi-intrinsic semiconductor layers 83 and 84 generate no p-n junction interface to each of the n-type and p-type source/drain diffusion regions 54. As a result, the n-type and p-type source/drain diffusion regions 54 and 44 have an extremely small p-n junction capacitance which is generated at side portions of the n-type and p-type source/drain diffusion regions 54 and 44. Then, the n-type and p-type source/drain diffusion regions 54 and 44 have extremely small capacitances to thereby allow the n-channel and p-channel MOS field effect transistors to show high speed and high frequency performances.

As a modification of this embodiment, in place of the quasi-intrinsic semiconductor layers 83 and 84, intrinsic semiconductor layers having no p-type impurity nor n-type impurity may be provided to reduce the capacitance of the n-type and p-type source/drain diffusion regions 54 and 44.

Figure 34A:
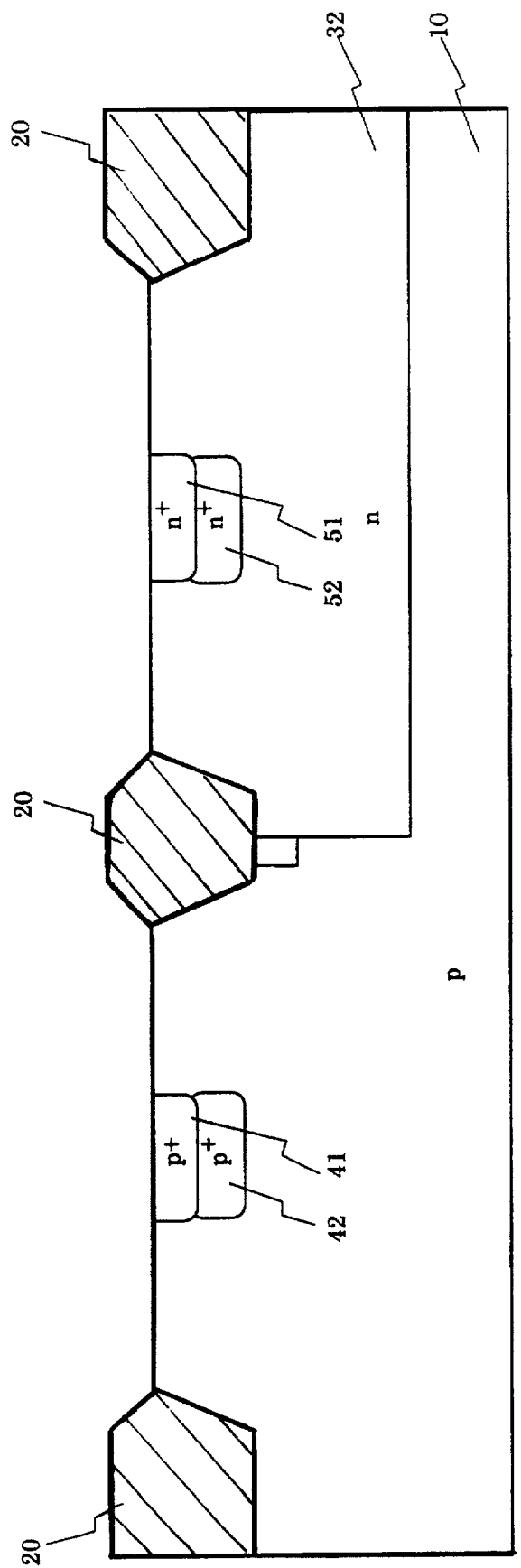
FIGS. 34A through 34D are cross sectional elevation views illustrative of MOS field effect transistors in sequential steps involved in a fabrication method thereof in a fifteenth embodiment according to the present invention.

The above CMOS device of this embodiment may be fabricated as follows. With reference to FIG. 34A, an n-type well region 32 is selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. Selective p-type and n-type impurity implantations into channel regions in the p-type region of he substrate 10 and the n-type well region 32 respectively are carried out at different energies to thereby form the p-type high impurity concentration channel and bottom regions 41 and 42 in the p-type region of the substrate 10 as well as to form the n-type high impurity concentration channel and bottom regions 51 and 52 in the n-type well region 32.

Figure 34B:
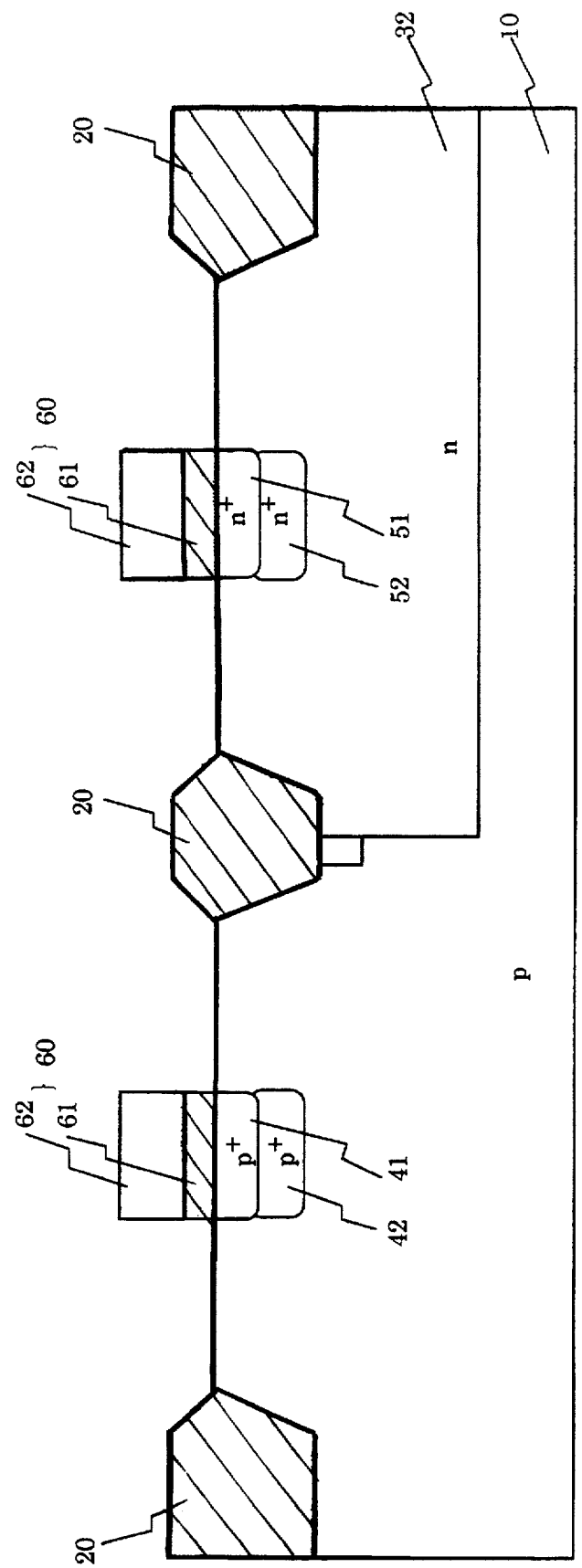

With reference to FIG. 34B, gate oxide films 61 are selectively formed on n-channel and p-channel regions in the p-type region of the substrate 10 and the n-type well region 32. Gate electrodes 62 are provided on the gate oxide films 61 to thereby form the gate structure 60.

Figure 34C:
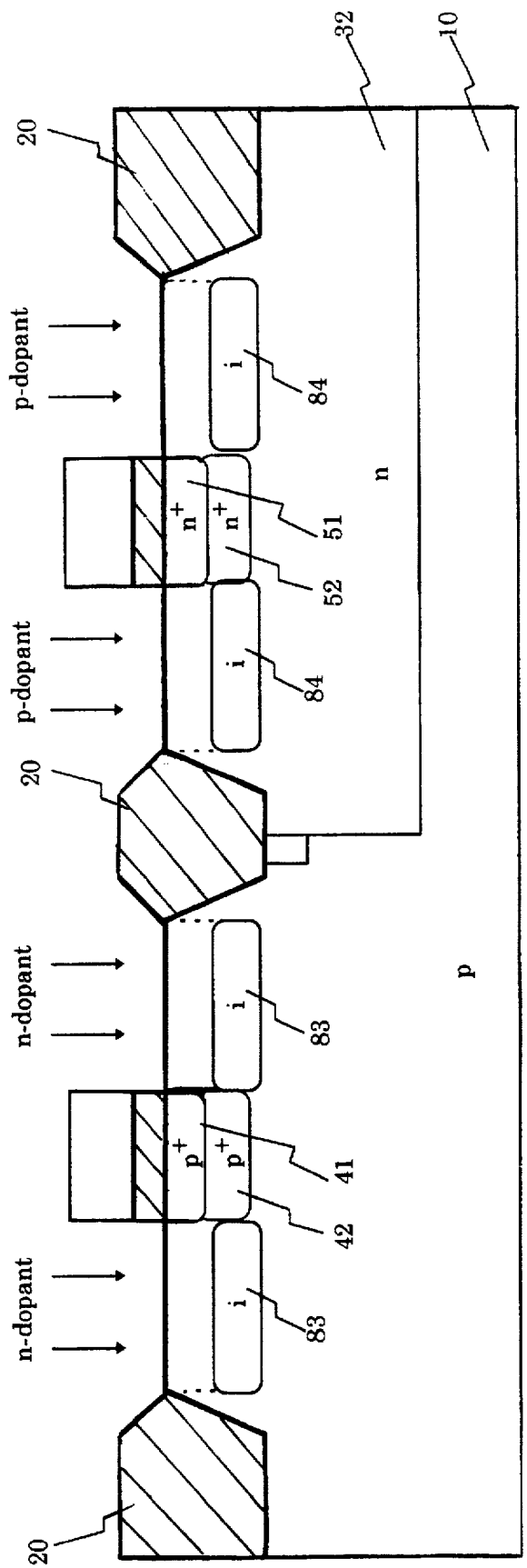

With reference to FIG. 34C, an n-type impurity implantation into a deep region of the p-type region of the semiconductor substrate 10 is carried out by using the gate structure 60 and the field oxide films 20 as masks at a high implantation energy so that the n-type impurity concentration is increased and then become equal to the p-type impurity concentrations to thereby form quasi-intrinsic semiconductor layers 83. A p-type impurity implantation into a deep region of the n-type well region 32 is carried out by using the gate structure 60 and the field oxide films 20 as masks at a high implantation energy so that the p-type impurity concentration is increased and then become equal to the n-type impurity concentrations to thereby form quasi-intrinsic semiconductor layers 84.

Figure 34D:
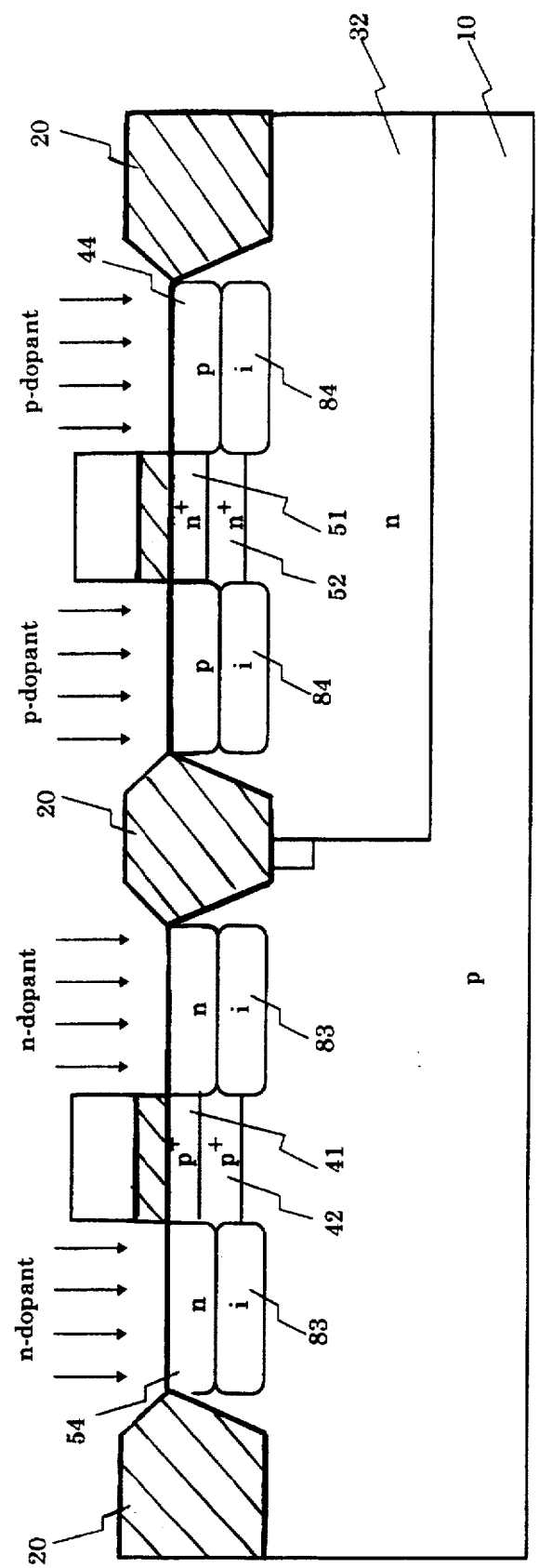

With reference to FIG. 34D, an n-type impurity implantation into the p-type region of the substrate 10 is carried out at a low implantation energy by using the gate structure 60 and the field oxide films 20 as masks to thereby form n-type source/drain diffusion regions 54. A p-type impurity implantation into the n-type well region 32 is carried out at a low implantation energy by using the gate structure 60 and the field oxide films 20 as masks to thereby form the p-type source/drain diffusion regions 44.

As a modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 35A:
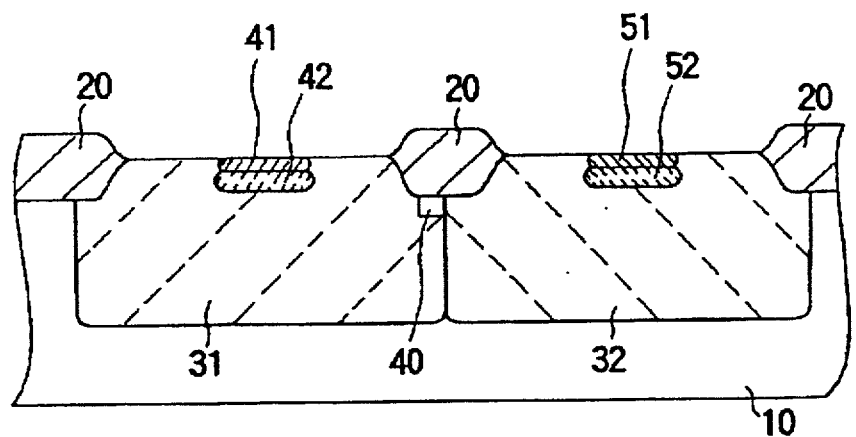
FIGS. 35A through 35C are cross sectional elevation views illustrative of MOS field effect transistors in sequential steps involved in a fabrication method thereof in a sixteenth embodiment according to the present invention.

A sixteenth embodiment according to the present invention will be described wherein an improved CMOS device is provided. A structure of the CMOS device is illustrated in FIG. 35C. A p-type semiconductor substrate 10 has a p-type well region 31 and an n-type well region 32. Field oxide films 20 are selectively provided in a surface of the substrate 10 to separate the n-type well region 32 from the p-type region of the substrate 10. An n-channel MOS field effect transistor is provided in the p-type well region 31. A p-channel MOS field effect transistor is provided in the n-type well region 32. The n-channel MOS field effect transistor has a gate structure 60 comprising a gate oxide film 61 and a gate electrode 62, gate side wall oxide films 70 provided on opposite sides of the gate structure 60, a p-type high impurity concentration channel region 42, a p-type high impurity concentration bottom region 41 just under the p-type high impurity concentration channel region 42 and n-type source/drain diffusion regions 54. Further, n-type lightly doped diffusion regions 53 are provided just under the gate side wall oxide films 70 and insides of the n-type source/drain diffusion regions 54. The p-channel MOS field effect transistor has a gate structure 60 comprising a gate oxide film 61 and a gate electrode 62, gate side wall oxide films 70 provided on the opposite sides of the gate structure 60, an n-type high impurity concentration channel region 52, an n-type high impurity concentration bottom region 51 just under the n-type high impurity concentration channel region 52 and p-type source/drain diffusion regions 44. Further, p-type lightly doped diffusion regions 43 are provided just under the gate side side wall oxide films 70.

The n-channel and p-channel MOS field effect transistors are further provided quasi-intrinsic semiconductor layers 83 and 84 just under the n-type and p-type source/drain diffusion regions 54 and 44 respectively wherein top portions of the quasi-intrinsic semiconductor layers 83 and 84 are in contact with bottoms of the n-type and p-type source/drain diffusion regions 54 respectively. The quasi-intrinsic semiconductor layers 83 and 84 are defined as layers having the same n-type and p-type impurity concentrations or having the same number of doners and accepters respectively providing electrons and holes serving as carriers, for which reason the layers show almost the same properties and performances as an intrinsic semiconductor layer. This means that the quasi-intrinsic semiconductor layers 83 and 84 act almost as the intrinsic semiconductor layers. The quasi-intrinsic semiconductor layers 83 and 84 generate no p-n junction interface to each of the n-type and p-type source/drain diffusion regions 54. As a result, the n-type and p-type source/drain diffusion regions 54 and 44 have an extremely small p-n junction capacitance which is generated at side portions of the n-type and p-type source/drain diffusion regions 54 and 44. Then, the n-type and p-type source/drain diffusion regions 54 and 44 have extremely small capacitances to thereby allow the n-channel and p-channel MOS field effect transistors to show high speed and high frequency performances.

As a modification of this embodiment, in place of the quasi-intrinsic semiconductor layers 83 and 84, intrinsic semiconductor layers having no p-type impurity nor n-type impurity may be provided to reduce the capacitance of the n-type and p-type source/drain diffusion regions 54 and 44.

The above CMOS device of this embodiment may be fabricated as follows. With reference to FIG. 35A, p-type and n-type well regions 31 and 32 are selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. Selective p-type and n-type impurity implantations into channel regions in the p-type well region 31 and the n-type well region 32 respectively are carried out at different energies to thereby form the p-type high impurity concentration channel and bottom regions 41 and 42 in the p-type well region 31 as well as to form the n-type high impurity concentration channel and bottom regions 51 and 52 in the n-type well region 32.

Figure 35B:
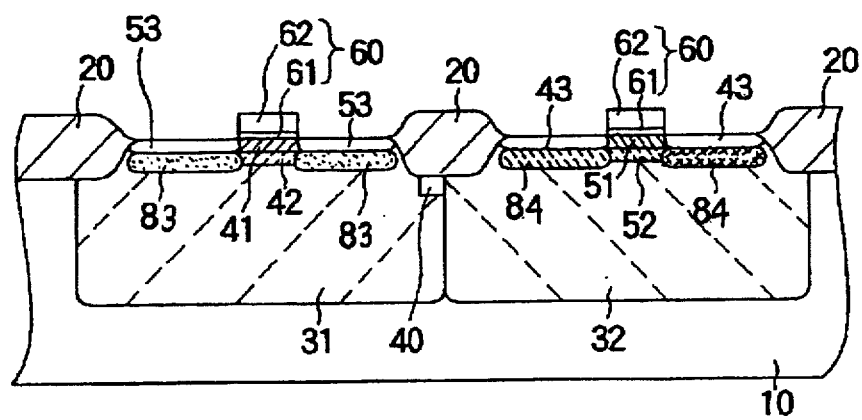
Figure 35C:
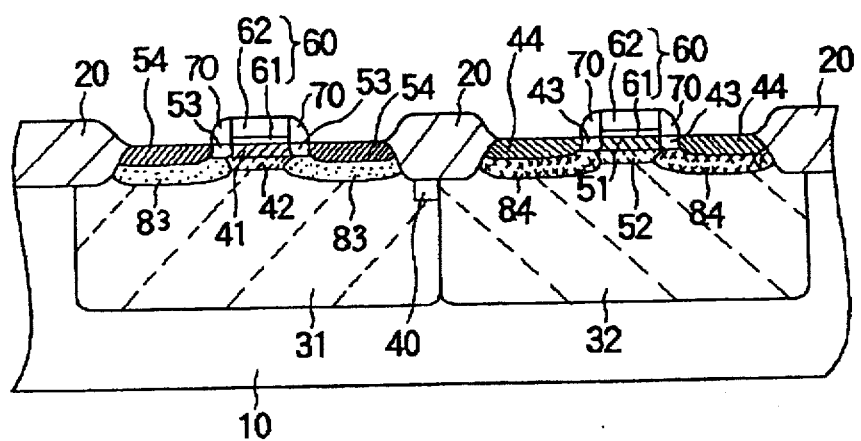

With reference to FIG. 35B, gate oxide films 61 are selectively formed on n-channel and p-channel regions in the p-type and n-type well regions 31 and 32. Gate electrodes 62 are provided on the gate oxide films 61 to thereby form the gate structure 60. An n-type impurity implantation into a deep region of the p-type well region 31 is carried out by using the gate structure 60 and the field oxide films 20 as masks at a high implantation energy so that the n-type impurity concentration is increased and then become equal to the p-type impurity concentrations to thereby form quasi-intrinsic semiconductor layers 83. A p-type impurity implantation into a deep region of the n-type well region 32 is carried out by using the gate structure 60 and the field oxide films 20 as masks at a high implantation energy so that the p-type impurity concentration is increased and then become equal to the n-type impurity concentrations to thereby form quasi-intrinsic semiconductor layers 84. After or before the above high energy impurity implantation processes, an n-type impurity implantation into the p-type well region 31 is carried out at a low implantation energy by using the gate structure 60 and the field oxide films 20 as masks to thereby form n-type lightly doped diffusion regions 53 as well as a p-type impurity implantation into the n-type well region 32 is carried out at a low implantation energy by using the gate structure 60 and the field oxide films 20 as masks to thereby form the p-type lightly doped diffusion regions 43.

With reference to FIG. 35C, gate side wall oxide films 70 are formed on opposite sides of each of the gate structures 60 provided on the p-type and n-type well regions 31 and 32. An n-type impurity implantation into the n-type lightly doped diffusion regions 53 is carried out at a low implantation energy by using the gate structure 60 with the gate side wall oxide films 70 and the field oxide films 20 as masks to thereby form n-type source/drain diffusion diffusion regions 54 as well as a p-type impurity implantation into the p-type lightly doped diffusion regions 43 is carried out at a low implantation energy by using the gate structure 60 with the gate side wall oxide films 70 and the field oxide films 20 as masks to thereby form the p-type source/drain diffusion regions 44.

Figure 36A:
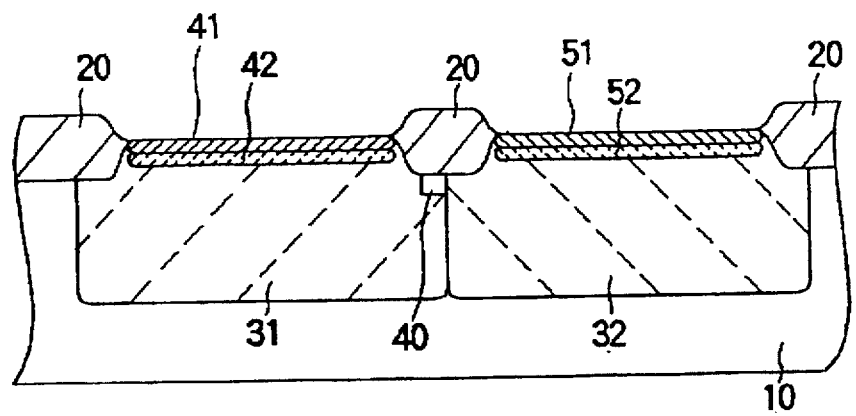
FIGS. 36A through 36C are cross sectional elevation views illustrative of MOS field effect transistors in sequential steps involved in a fabrication method thereof in a seventeenth embodiment according to the present invention.
Figure 36B:
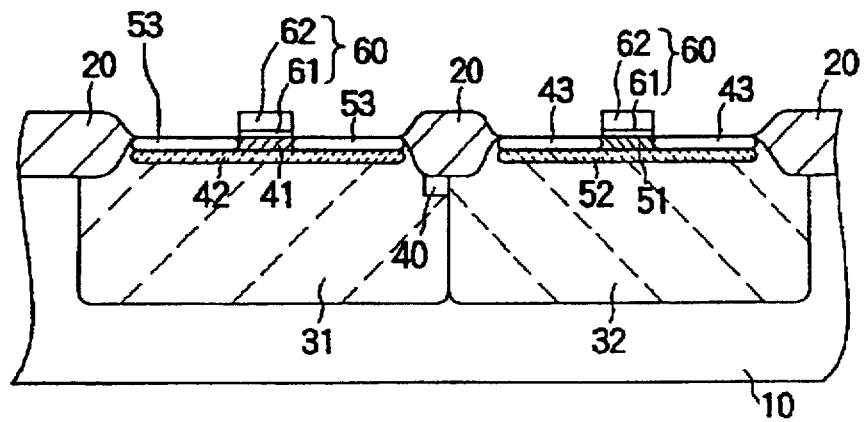
Figure 36C:
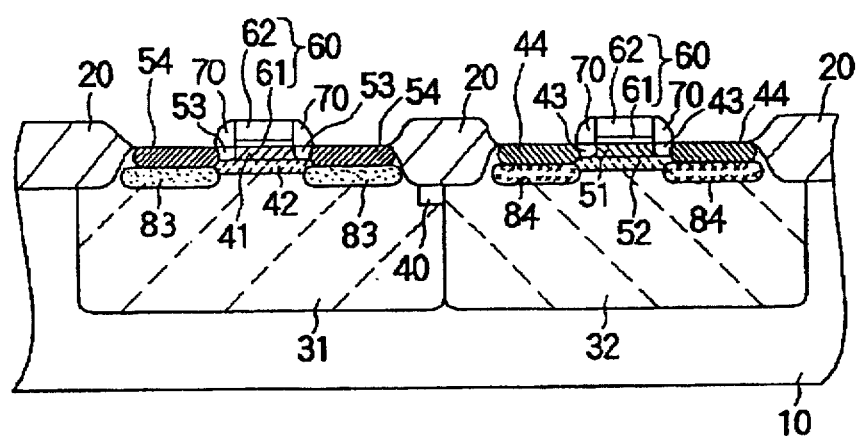

A seventeenth embodiment according to the present invention will be described wherein another improved CMOS device is provided. A structure of the CMOS device is illustrated in FIG. 36C, form which the structure is almost the same as the CMOS device of the sixteenth embodiment. The descriptions of the structure of the CMOS device in this embodiment will be omitted.

The above CMOS device of this embodiment may be fabricated as follows. With reference to FIG. 36A, p-type and n-type well regions 31 and 32 are selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. Non-selective p-type and n-type impurity implantations into channel regions in the p-type well region 31 and the n-type well region 32 respectively are carried out at different energies to thereby form the p-type high impurity concentration channel and bottom regions 41 and 42 in the p-type well region 31 as well as to form the n-type high impurity concentration channel and bottom regions 51 and 52 in the n-type well region 32.

With reference to FIG. 35B, gate oxide films 61 are selectively formed on n-channel and p-channel regions in the p-type region of the substrate 10 and the n-type well region 32. Gate electrodes 62 are provided on the gate oxide films 61 to thereby form the gate structure 60. An n-type impurity implantation into the p-type high impurity concentration channel region 41 is carried out by using the gate structure 60 and the field oxide films 20 as masks at a low implantation energy to thereby form n-type lightly doped diffusion regions 53. A p-type impurity implantation into the n-type high impurity concentration channel region 51 is carried out by using the gate structure 60 and the field oxide films 20 as masks at a low implantation energy to thereby form p-type lightly doped diffusion regions 43.

With reference to FIG. 36C, gate side wall oxide films 70 are formed on opposite sides of each of the gate structures 60 provided on the p-type and n-type well regions 31 and 32. An n-type impurity implantation into the n-type lightly doped diffusion regions 53 is carried out at a low implantation energy by using the gate structure 60 with the gate side wall oxide films 70 and the field oxide films 20 as masks to thereby form n-type source/drain diffusion diffusion regions 54 as well as a p-type impurity implantation into the p-type lightly doped diffusion regions 43 is carried out at a low implantation energy by using the gate structure 60 with the gate side wall oxide films 70 and the field oxide films 20 as masks to thereby form the p-type source/drain diffusion regions 44. Further, an n-type impurity implantation into the p-type high impurity concentration bottom region 42 is carried out at a high implantation energy by using the gate structure 60 with the gate side wall oxide films 70 and the field oxide films 20 as masks so that the n-type impurity concentration is increased and then become equal to the p-type impurity concentrations to thereby form quasi-intrinsic semiconductor layers 83. A p-type impurity implantation into the n-type high impurity concentration bottom region 52 is carried out at a high implantation energy by using the gate structure 60 with the gate side wall oxide films 70 and the field oxide films 20 as masks so that the n-type impurity concentration is increased and then become equal to the p-type impurity concentrations to thereby form quasi-intrinsic semiconductor layers 83.

Figure 37:
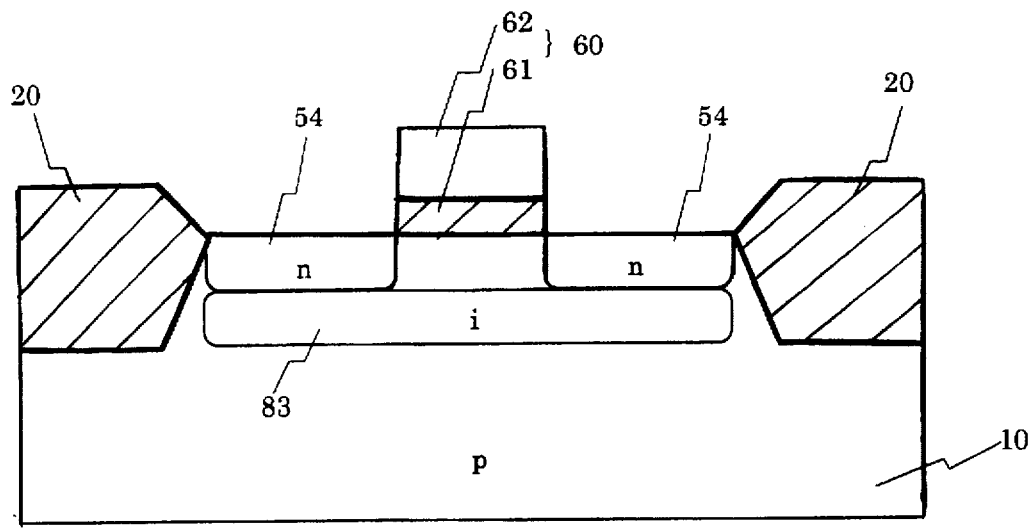
FIG. 37 is a cross sectional elevation view illustrative of a novel structure of a MOS field effect transistor in an eighteenth embodiment according to the present invention.

An eighteenth embodiment of the present invention will be described wherein another n-channel MOS field effect transistor is provided. A structure of the n-channel MOS field effect transistor is illustrated in FIG. 37. The n-channel MOS field effect transistor includes a p-type semiconductor substrate 10, field oxide films 20 selectively provided in a surface of the p-type semiconductor substrate 10, n-type source/drain diffusion regions 54 to define a channel region between them and a gate structure 60 provided on the channel region. The gate structure 60 comprises a gate oxide film provided on the channel region and a gate electrode 62 provided on the gate oxide film 61. There is further provided a quasi-intrinsic semiconductor layer 83 extending under the source/drain diffusion regions 54 wherein a top portion of the single quasi-intrinsic semiconductor layer 83 is in contact with bottoms of the n-type source/drain diffusion regions 54.

As a modification of this embodiment, in place of the quasi-intrinsic semiconductor layers 83, intrinsic semiconductor layers having no p-type impurity nor n-type impurity may be provided to reduce the capacitance of the source/drain diffusion regions 54.

Figure 38A:
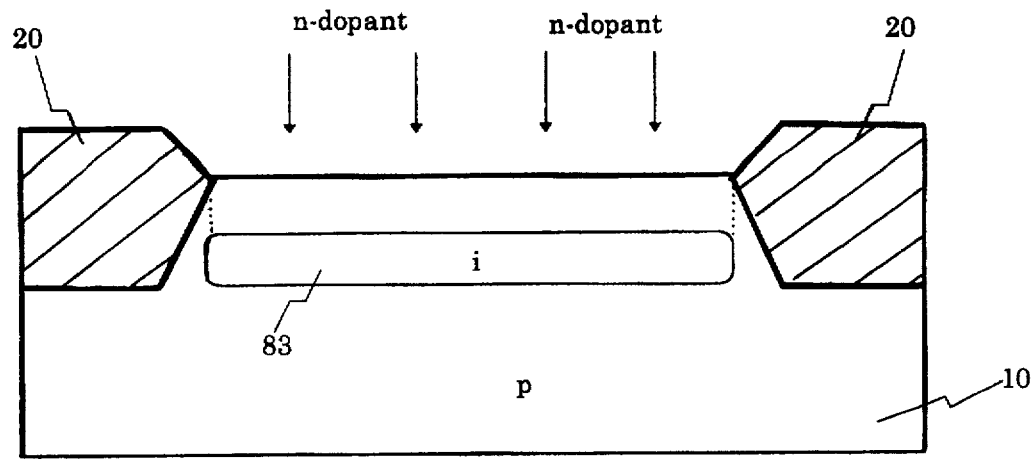
FIGS. 38A through 38C are cross sectional elevation views illustrative of MOS field effect transistors in sequential steps involved in a fabrication method thereof in an eighteenth embodiment according to the present invention.

The above n-channel MOS field effect transistor may be fabricated as follows. With reference to FIG. 38A, field oxide films 20 are selectively formed in a surface of a p-type semiconductor substrate 10. An n-type impurity implantation into a deep region of the p-type semiconductor substrate 10 is carried out by using the field oxide films 20 as a mask at a high implantation energy so that the n-type impurity concentration is increased and then become equal to the p-type impurity concentrations to thereby form a single quasi-intrinsic semiconductor layer 83.

Figure 38B:
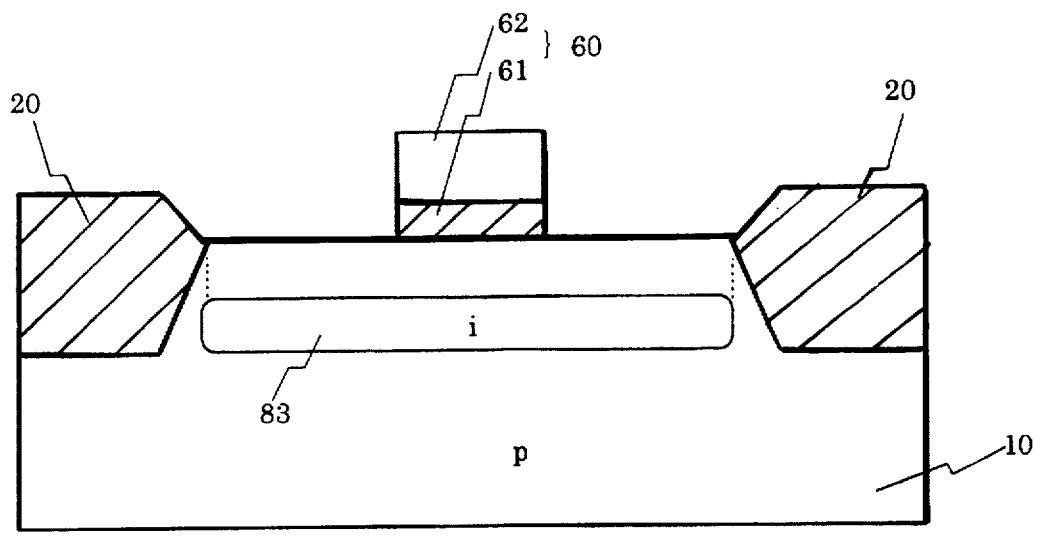

With reference to FIG. 38B, a gate oxide film 61 is selectively formed on a channel region of the p-type semiconductor substrate 10. A gate electrode 62 is then provided on the gate oxide film 61 to thereby form a gate structure 60.

Figure 38C:
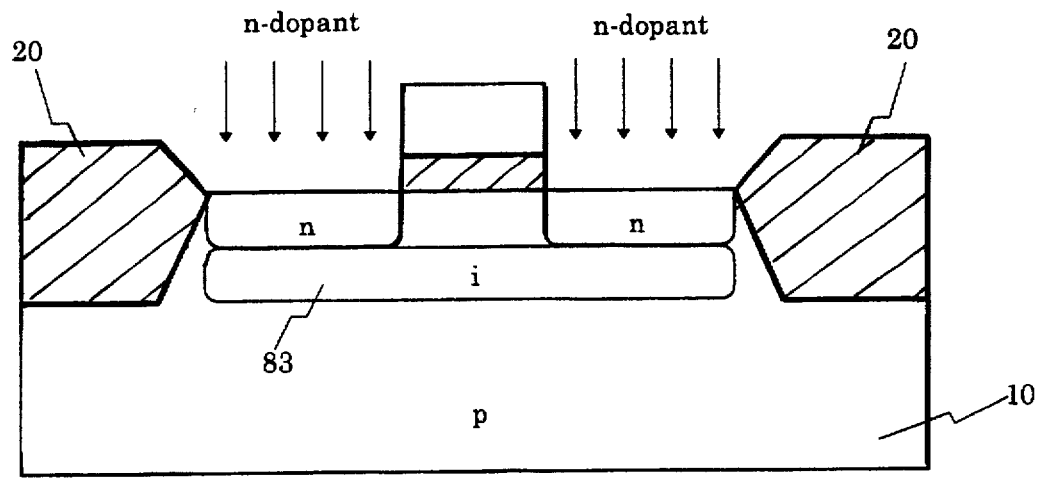

With reference to FIG. 38C, an n-type impurity implantation into a surface of the p-type semiconductor substrate 10 is carried out at a low implantation energy by using the gate structure 60 and the field oxide films 20 as masks to form the n-type source/drain diffusion regions 54 having bottoms in contact with a top surface of the single quasi-intrinsic semiconductor layer 83.

The above present invention of this embodiment may be applicable to the p-channel MOS field effect transistor by changing the conductivity type of the impurities.

As a moreover modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 39:
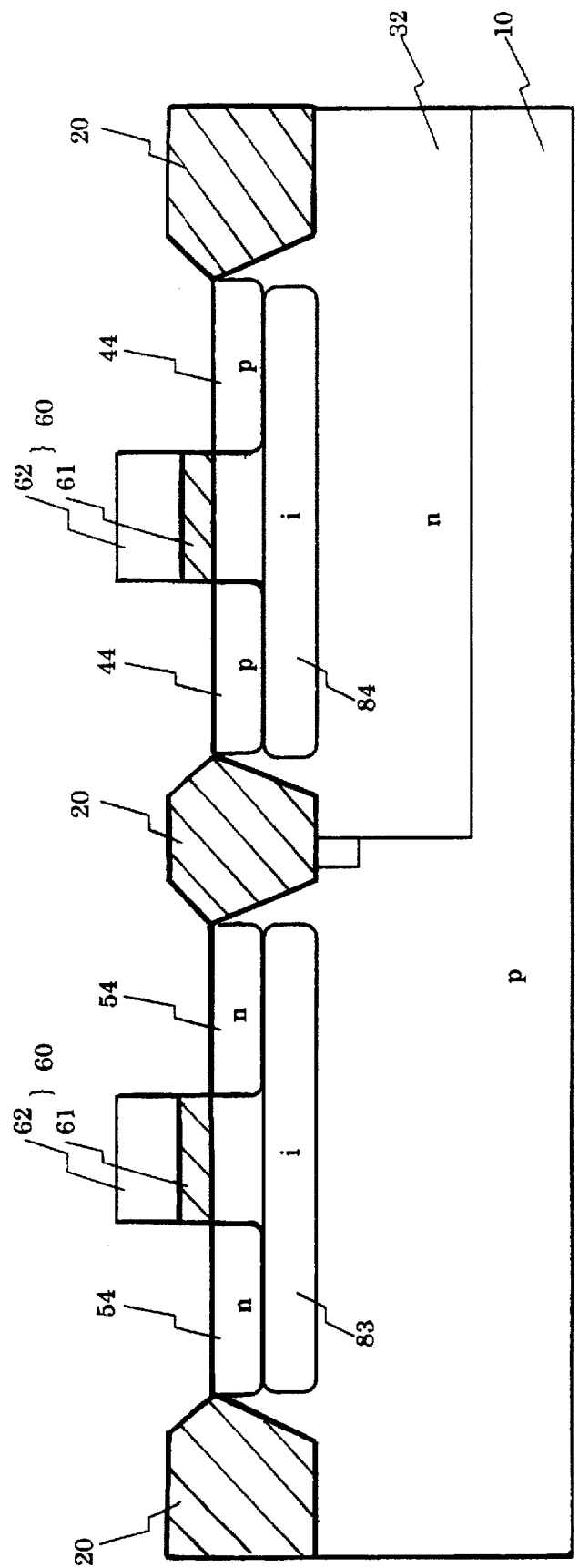
FIG. 39 is a cross sectional elevation view illustrative of a novel structure of a MOS field effect transistor in a nineteenth embodiment according to the present invention.

A nineteenth embodiment according to the present invention will be described wherein an improved CMOS device is provided. A structure of the CMOS device is illustrated in FIG. 39. A p-type semiconductor substrate 10 has an n-type well region 32. Field oxide films 20 are selectively provided in a surface of the substrate 10 to separate the n-type well region 32 from the p-type region of the substrate 10. An n-channel MOS field effect transistor is provided in the p-type region of the substrate 10. A p-channel MOS field effect transistor is provided in the n-type well region 32. The n-channel MOS field effect transistor has a gate structure 60 comprising a gate oxide film 61 and a gate electrode 62 and n-type source/drain diffusion regions 54. The p-channel MOS field effect transistor has a gate structure 60 comprising a gate oxide film 61 and a gate electrode 62 and p-type source/drain diffusion regions 44.

The n-channel and p-channel MOS field effect transistors are further provided with quasi-intrinsic semiconductor layers 83 and 84 just under the n-type and p-type source/drain diffusion regions 54 and 44 respectively wherein top portions of the quasi-intrinsic semiconductor layers 83 and 84 are in contact with bottoms of the n-type and p-type source/drain diffusion regions 54 and 44 respectively.

As a modification of this embodiment, in place of the quasi-intrinsic semiconductor layers 83 and 84, intrinsic semiconductor layers having no p-type impurity nor n-type impurity may be provided to reduce the capacitance of the n-type and p-type source/drain diffusion regions 54 and 44.

The above CMOS device of this embodiment may be fabricated as follows. With reference to FIG. 40A, an n-type well region 32 is selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. An n-type impurity implantation into a deep region of the p-type region of the semiconductor substrate 10 is carried out by using the gate structure 60 and the field oxide films 20 as masks at a high implantation energy so that the n-type impurity concentration is increased and then become equal to the p-type impurity concentrations to thereby form a single quasi-intrinsic semiconductor layer 83. A p-type impurity implantation into a deep region of the n-type well region 32 is carried out by using the gate structure 60 and the field oxide films 20 as masks at a high implantation energy so that the p-type impurity concentration is increased and then become equal to the n-type impurity concentrations to thereby form a single quasi-intrinsic semiconductor layer 84.

Figure 40B:
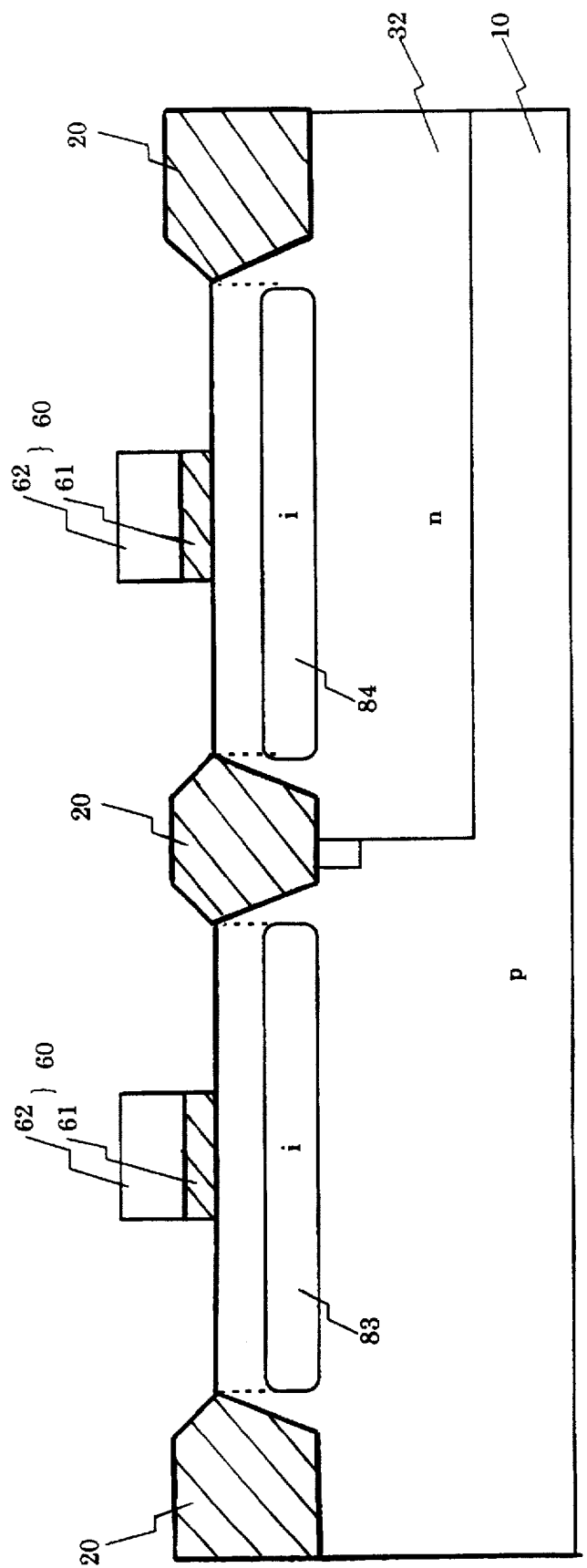

With reference to FIG. 40B, gate oxide films 61 are selectively formed on n-channel and p-channel regions in the p-type region of the substrate 10 and the n-type well region 32. Gate electrodes 62 are provided on the gate oxide films 61 to thereby form the gate structure 60.

With reference to FIG. 40C, an n-type impurity implantation into the p-type region of the substrate 10 is carried out at a low implantation energy by using the gate structure 60 and the field oxide films 20 as masks to thereby form n-type source/drain diffusion regions 54. A p-type impurity implantation into the n-type well region 32 is carried out at a low implantation energy by using the gate structure 60 and the field oxide films 20 as masks to thereby form the p-type source/drain diffusion regions 44.

As a modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 41:
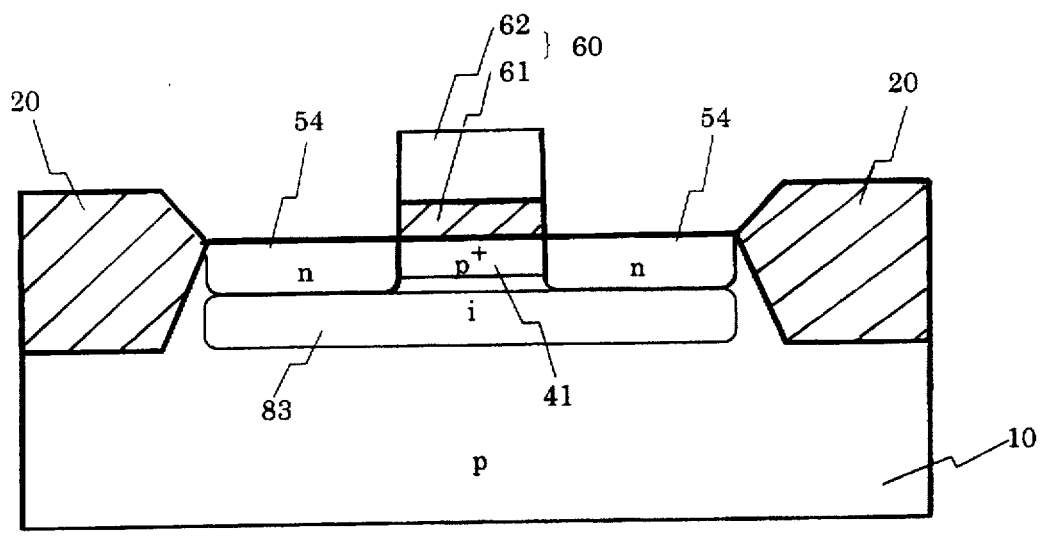
FIG. 41 is a cross sectional elevation view illustrative of a novel structure of a MOS field effect transistor in a twentieth embodiment according to the present invention.

A twentieth embodiment of the present invention will be described wherein another n-channel MOS field effect transistor is provided. A structure of the n-channel MOS field effect transistor is illustrated in FIG. 41. The n-channel MOS field effect transistor includes a p-type semiconductor substrate 10, field oxide films 20 selectively provided in a surface of the p-type semiconductor substrate 10, n-type source/drain diffusion regions 54, a p-type high impurity concentration channel region 41, a p-type high impurity concentration bottom region 42 junst under the p-type high impurity concentration channel region 41 and a gate structure 60 provided on the p-type high impurity concentration channel region 41. The gate structure 60 comprises a gate oxide film provided on the channel region and a gate electrode 62 provided on the gate oxide film 61. There is further provided a quasi-intrinsic semiconductor layer 83 extending under the source/drain diffusion regions 54 wherein a top portion of the single quasi-intrinsic semiconductor layer 83 is in contact with bottoms of the n-type source/drain diffusion regions 54.

As a modification of this embodiment, in place of the quasi-intrinsic semiconductor layers 83, intrinsic semiconductor layers having no p-type impurity nor n-type impurity may be provided to reduce the capacitance of the source/drain diffusion regions 54.

Figure 42A:
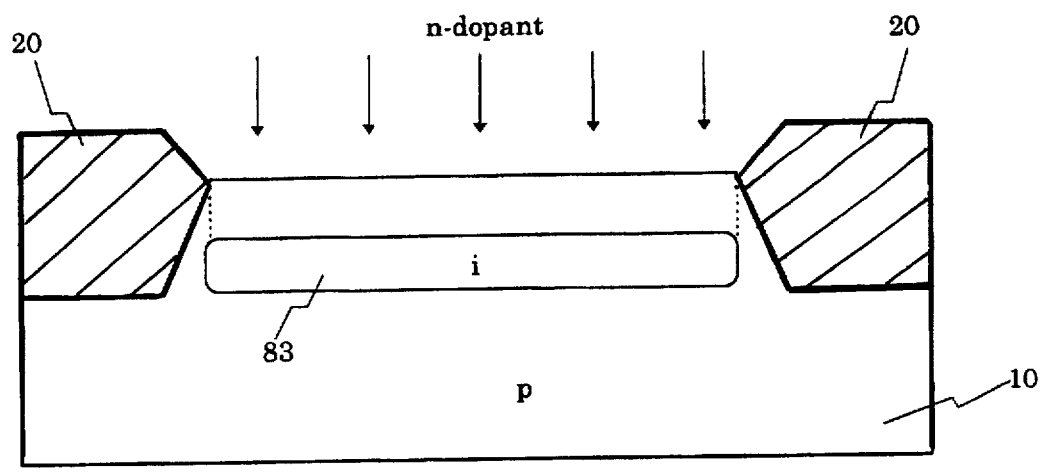
FIGS. 42A through 42D are cross sectional elevation views illustrative of MOS field effect transistors in sequential steps involved in a fabrication method thereof in a twentieth embodiment according to the present invention.

The above n-channel MOS field effect transistor may be fabricated as follows. With reference to FIG. 42A, field oxide films 20 are selectively formed in a surface of a p-type semiconductor substrate 10. An n-type impurity implantation into a deep region of the p-type semiconductor substrate 10 is carried out by using the field oxide films 20 as a mask at a high implantation energy so that the n-type impurity concentration is increased and then become equal to the p-type impurity concentrations to thereby form a single quasi-intrinsic semiconductor layer 83.

Figure 42B:
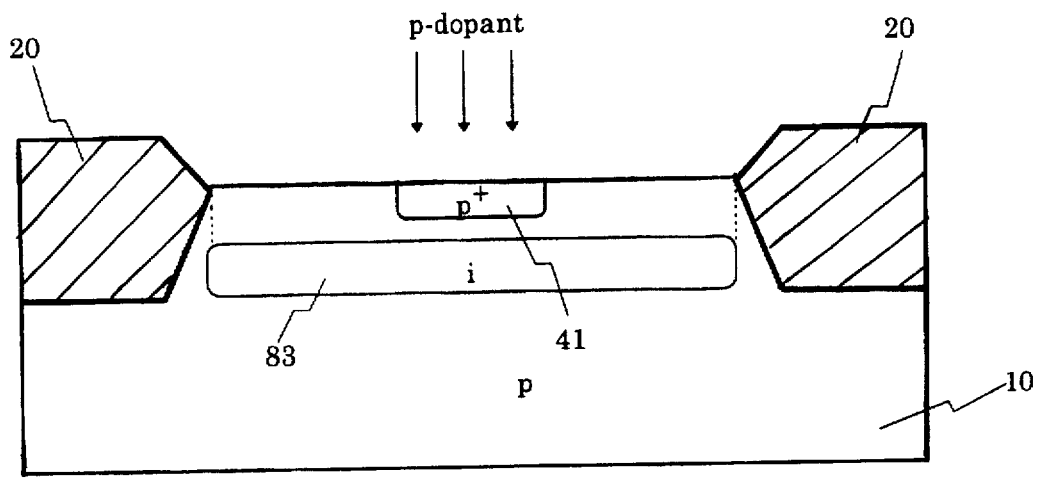

With reference to FIG. 42B, a selective p-type impurity implantations into a channel region is carried out at a low implantation energy to thereby form a p-type high impurity concentration channel region 41.

Figure 42C:
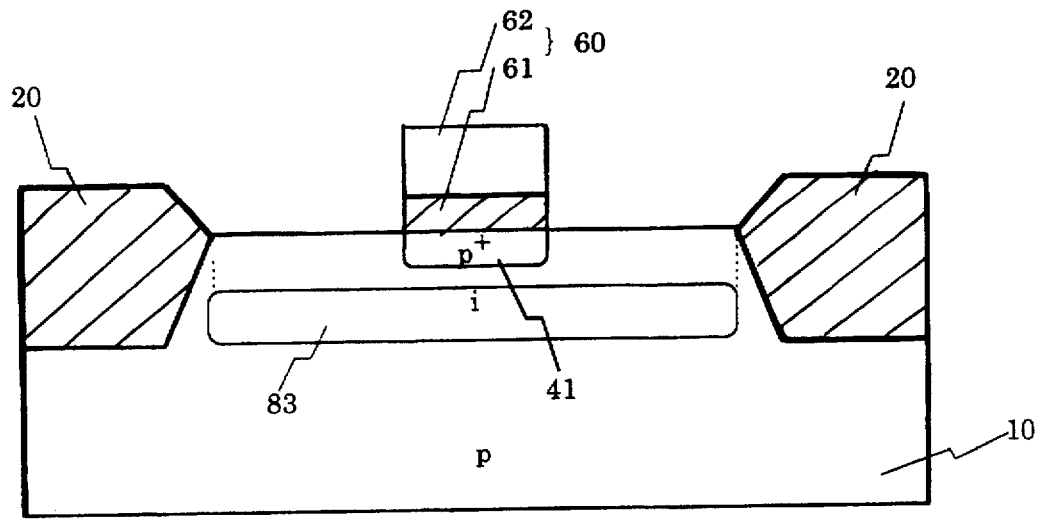

With reference to FIG. 42C, a gate oxide film 61 is selectively formed on the p-type high a channel region of the p-type semiconductor substrate 10. A gate electrode 62 is then provided on the gate oxide film 61 to thereby form a gate structure 60.

Figure 42D:
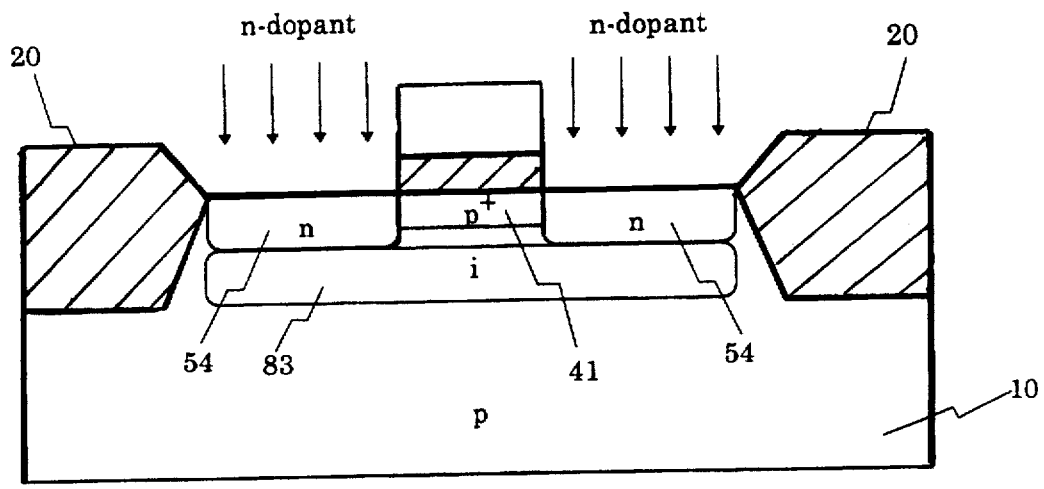

With reference to FIG. 42D, an n-type impurity implantation into a surface of the p-type semiconductor substrate 10 is carried out at a low implantation energy by using the gate structure 60 and the field oxide films 20 as masks to form the n-type source/drain diffusion regions 54 having bottoms in contact with top surfaces of the single quasi-intrinsic semiconductor layer 83.

The above present invention of this embodiment may be applicable to the p-channel MOS field effect transistor by changing the conductivity type of the impurities.

As a moreover modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 43:
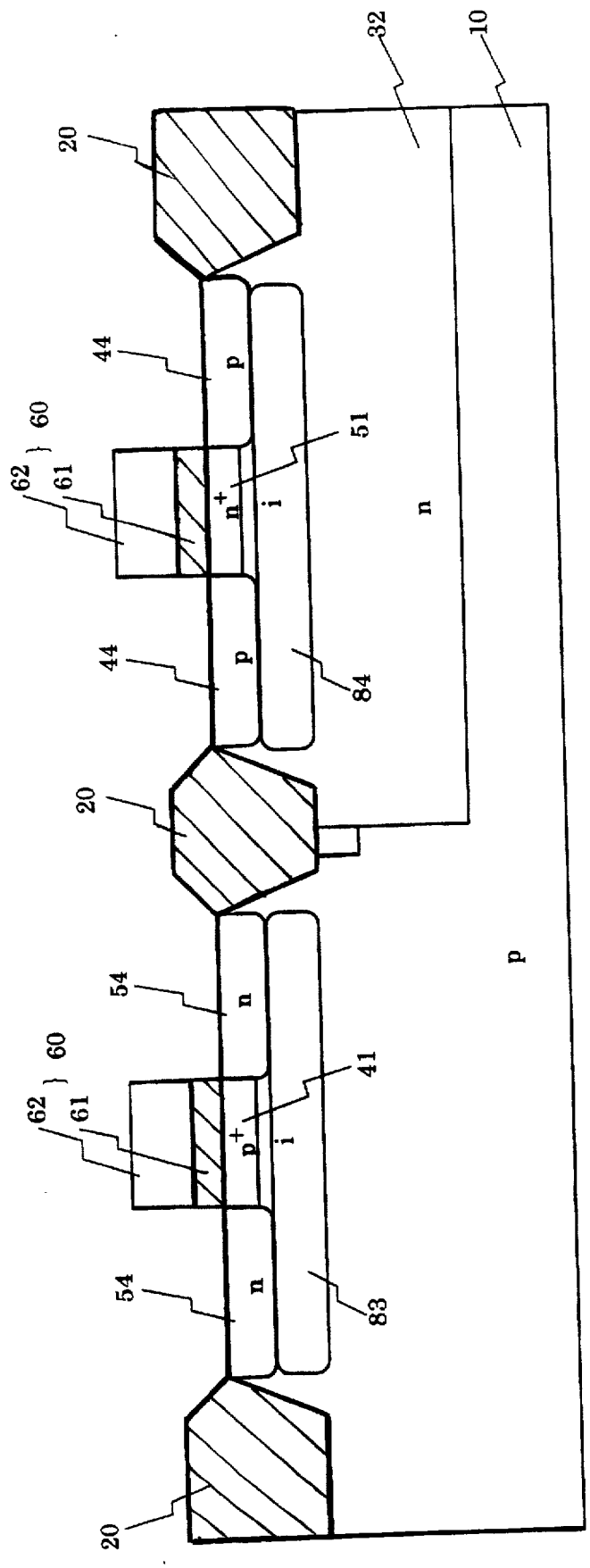
FIG. 43 is a cross sectional elevation view illustrative of a novel structure of a MOS field effect transistor in a twenty first embodiment according to the present invention.

A twenty first embodiment according to the present invention will be described wherein an improved CMOS device is provided. A structure of the CMOS device is illustrated in FIG. 43. A p-type semiconductor substrate 10 has an n-type well region 32. Field oxide films 20 are selectively provided in a surface of the substrate 10 to separate the n-type well region 32 from the p-type region of the substrate 10. An n-channel MOS field effect transistor is provided in the p-type region of the substrate 10. A p-channel MOS field effect transistor is provided in the n-type well region 32. The n-channel MOS field effect transistor has a gate structure 60 comprising a gate oxide film 61 and a gate electrode 62, a p-type high impurity concentration channel region 41 and n-type source/drain diffusion regions 54. The p-channel MOS field effect transistor has a gate structure 60 comprising a gate oxide film 61 and a gate electrode 62, an n-type high impurity concentration channel region 51 and p-type source/drain diffusion regions 44.

The n-channel and p-channel MOS field effect transistors are further provided with quasi-intrinsic semiconductor layers 83 and 84 extending under the n-type and p-type source/drain diffusion regions 54 and 44 respectively wherein top portions of the quasi-intrinsic semiconductor layers 83 and 84 are in contact with bottoms of the n-type and p-type source/drain diffusion regions 54 and 44 respectively.

As a modification of this embodiment, in place of the quasi-intrinsic semiconductor layers 83 and 84, intrinsic semiconductor layers having no p-type impurity nor n-type impurity may be provided to reduce the capacitance of the n-type and p-type source/drain diffusion regions 54 and 44.

The above CMOS device of this embodiment may be fabricated as follows. With reference to FIG. 44A, an n-type well region 32 is selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. An n-type impurity implantation into a deep region of the p-type region of the semiconductor substrate 10 is carried out by using the field oxide films 20 as a mask at a high implantation energy so that the n-type impurity concentration is increased and then become equal to the p-type impurity concentrations to thereby form a single quasi-intrinsic semiconductor layer 83. A p-type impurity implantation into a deep region of the n-type well region 32 is carried out by using the field oxide films 20 as a mask at a high implantation energy so that the p-type impurity concentration is increased and then become equal to the n-type impurity concentrations to thereby form a quasi-intrinsic semiconductor layer 84.

Figure 44B:
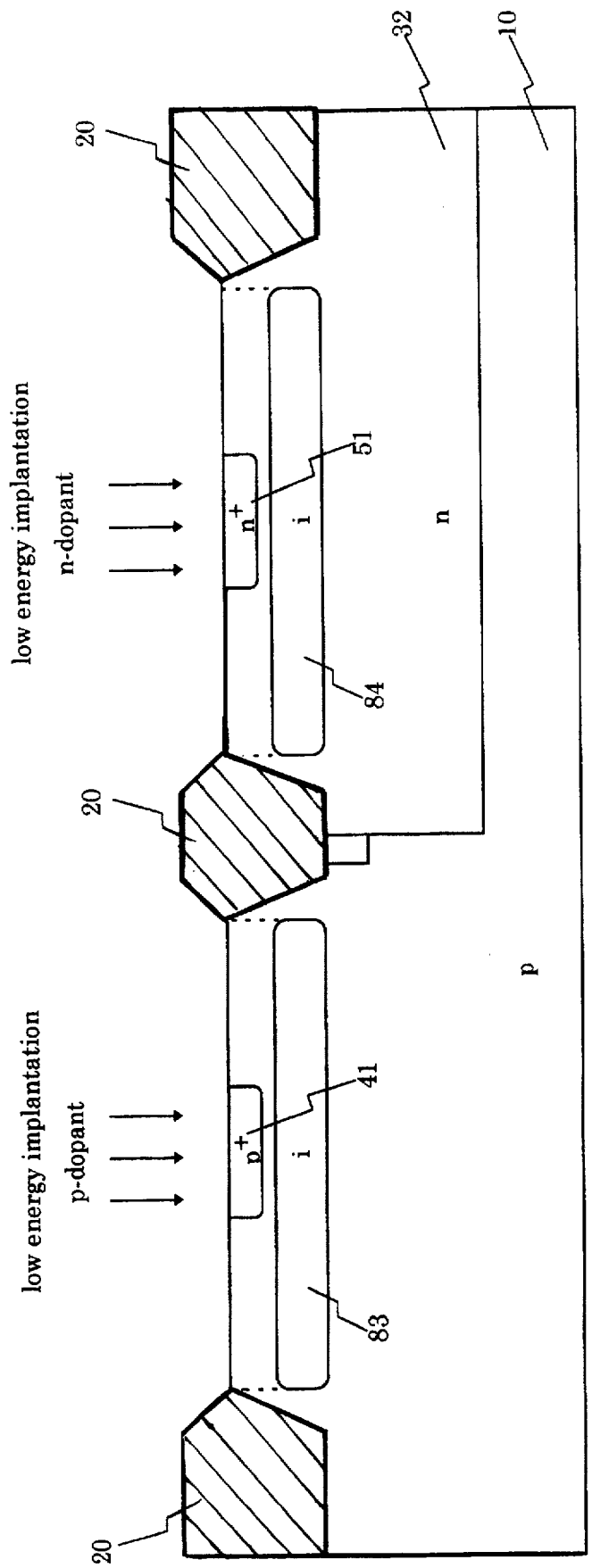

With reference to FIG. 44B, selective p-type and n-type impurity implantations into channel regions in the p-type region of the substrate 10 and the n-type well region 32 respectively are carried out at a low implantation energy to thereby form a p-type high impurity concentration channel region 41 in the p-type region of the substrate 10 as well as to form the n-type high impurity concentration channel region 51 in the n-type well region 32.

Figure 44C:
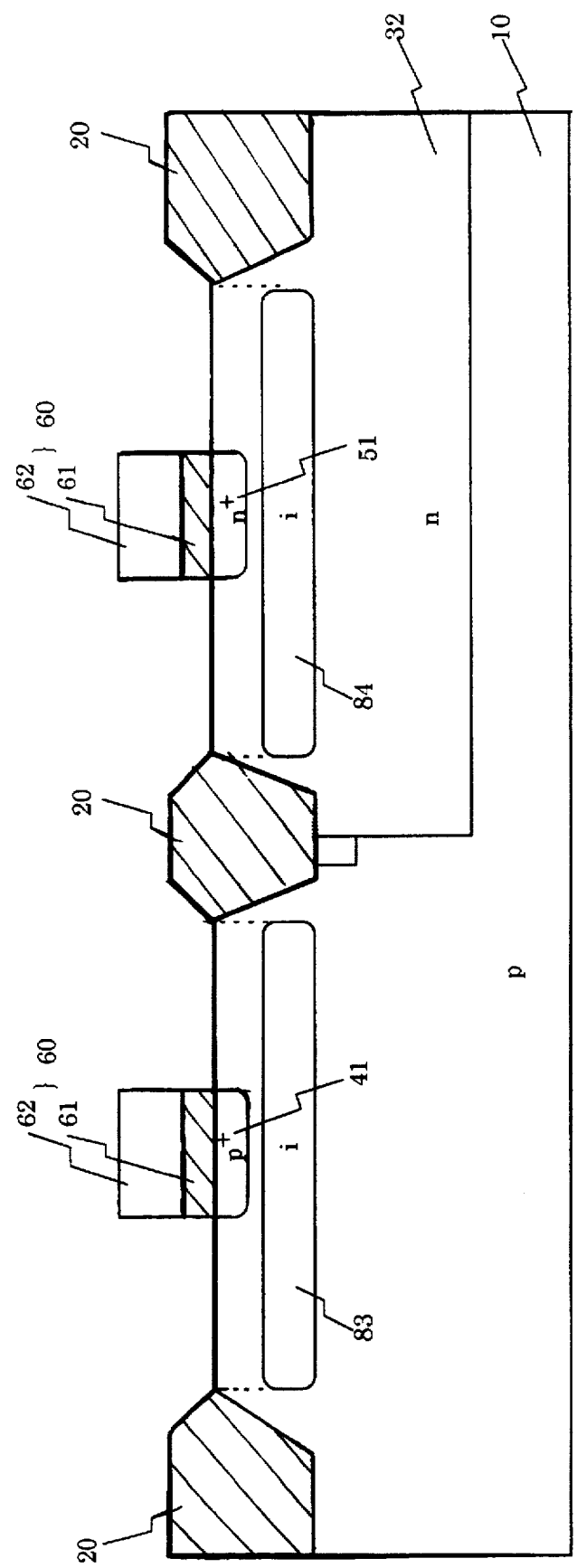

With reference to FIG. 44C, gate oxide films 61 are selectively formed on n-channel and p-channel regions in the p-type region of the substrate 10 and the n-type well region 32. Gate electrodes 62 are provided on the gate oxide films 61 to thereby form the gate structure 60.

Figure 44D:
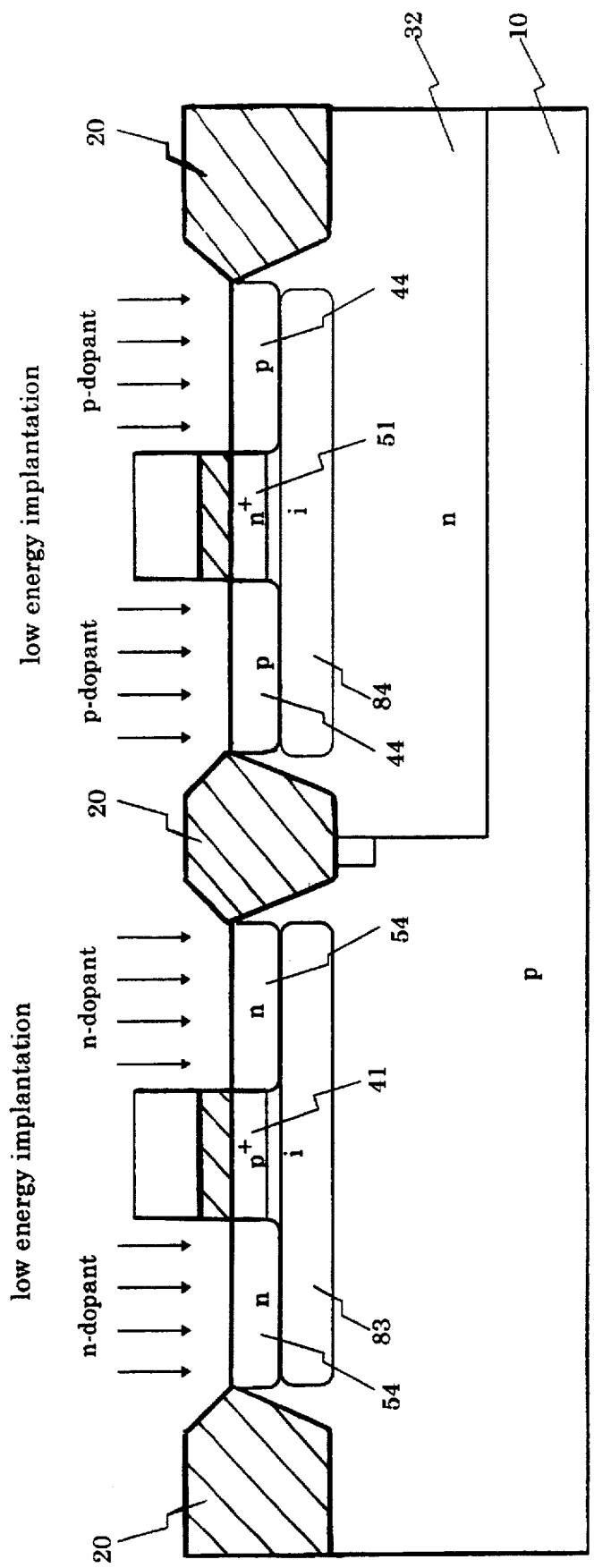

With reference to FIG. 44D, an n-type impurity implantation into the p-type region of the substrate 10 is carried out at a low implantation energy by using the gate structure 60 and the field oxide films 20 as masks to thereby form n-type source/drain diffusion regions 54. A p-type impurity implantation into the n-type well region 32 is carried out at a low implantation energy by using the gate structure 60 and the field oxide films 20 as masks to thereby form the p-type source/drain diffusion regions 44.

As a modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 45:
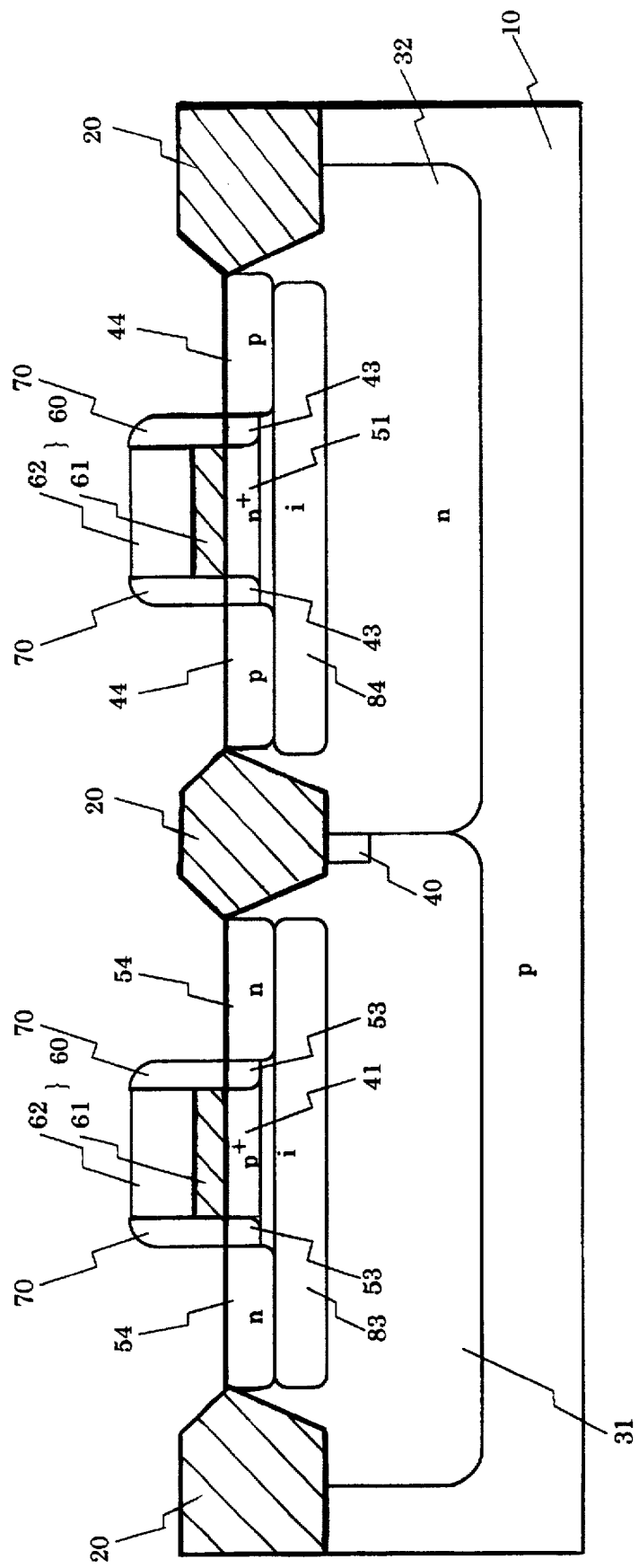
FIG. 45 is a cross sectional elevation view illustrative of a novel structure of a MOS field effect transistor in a twenty second embodiment according to the present invention.

A twenty second embodiment according to the present invention will be described wherein an improved CMOS device is provided. A structure of the CMOS device is illustrated in FIG. 45. A p-type semiconductor substrate 10 has a p-type well region 31 and an n-type well region 32. Field oxide films 20 are selectively provided in a surface of the substrate 10 to separate the n-type well region 32 from the p-type region of the substrate 10. An n-channel MOS field effect transistor is provided in the p-type well region 31. A p-channel MOS field effect transistor is provided in the n-type well region 32. The n-channel MOS field effect transistor has a gate structure 60 comprising a gate oxide film 61 and a gate electrode 62, gate side wall oxide films 70 provided on opposite sides of the gate structure 60, a p-type high impurity concentration channel region 41 and n-type source/drain diffusion regions 54. Further, n-type lightly doped diffusion regions 53 are provided just under the gate side wall oxide films 70 and insides of the n-type source/drain diffusion regions 54. The p-channel MOS field effect transistor has a gate structure 60 comprising a gate oxide film 61 and a gate electrode 62, gate side wall oxide films 70 provided on the opposite sides of the gate structure 60, an n-type high impurity concentration channel region 51 and p-type source/drain diffusion regions 44. Further, p-type lightly doped diffusion regions 43 are provided just under the gate side side wall oxide films 70.

The n-channel and p-channel MOS field effect transistors are further provided with quasi-intrinsic semiconductor layers 83 and 84 extending under the n-type and p-type source/drain diffusion regions 54 and 44 respectively wherein top portions of the quasi-intrinsic semiconductor layers 83 and 84 are in contact with bottoms of the n-type and p-type source/drain diffusion regions 54 respectively.

As a modification of this embodiment, in place of the quasi-intrinsic semiconductor layers 83 and 84, intrinsic semiconductor layers having no p-type impurity nor n-type impurity may be provided to reduce the capacitance of the n-type and p-type source/drain diffusion regions 54 and 44.

Figure 46A:
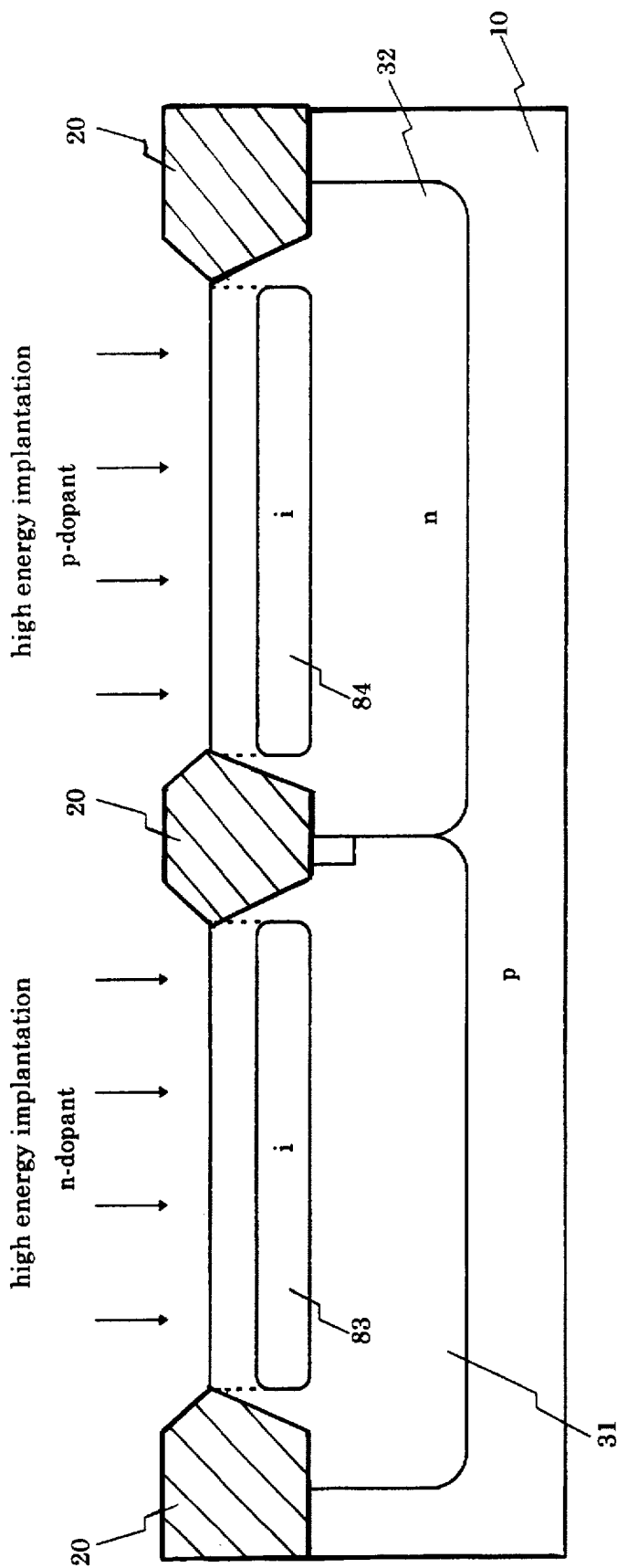
FIGS. 46A through 46E are cross sectional elevation views illustrative of MOS field effect transistors in sequential steps involved in a fabrication method thereof in a twenty second embodiment according to the present invention.

The above CMOS device of this embodiment may be fabricated as follows. With reference to FIG. 46A, p-type and n-type well regions 31 and 32 are selectively formed in a p-type semiconductor substrate 10. A channel stopper is provided on an edge of the n-type well region 32. Field oxide films 20 are selectively formed in a surface of the substrate 10 to separate the n-type well region 32 from the p-type region of the substrate 10. An n-type impurity implantation into a deep region of the p-type well region 31 is carried out by using the field oxide films 20 as a mask at a high implantation energy so that the n-type impurity concentration is increased and then become equal to the p-type impurity concentrations to thereby form a single quasi-intrinsic semiconductor layer 83. A p-type impurity implantation into a deep region of the n-type well region 32 is carried out by using the field oxide films 20 as a mask at a high implantation energy so that the p-type impurity concentration is increased and then become equal to the n-type impurity concentrations to thereby form a single quasi-intrinsic semiconductor layer 84.

Figure 46B:
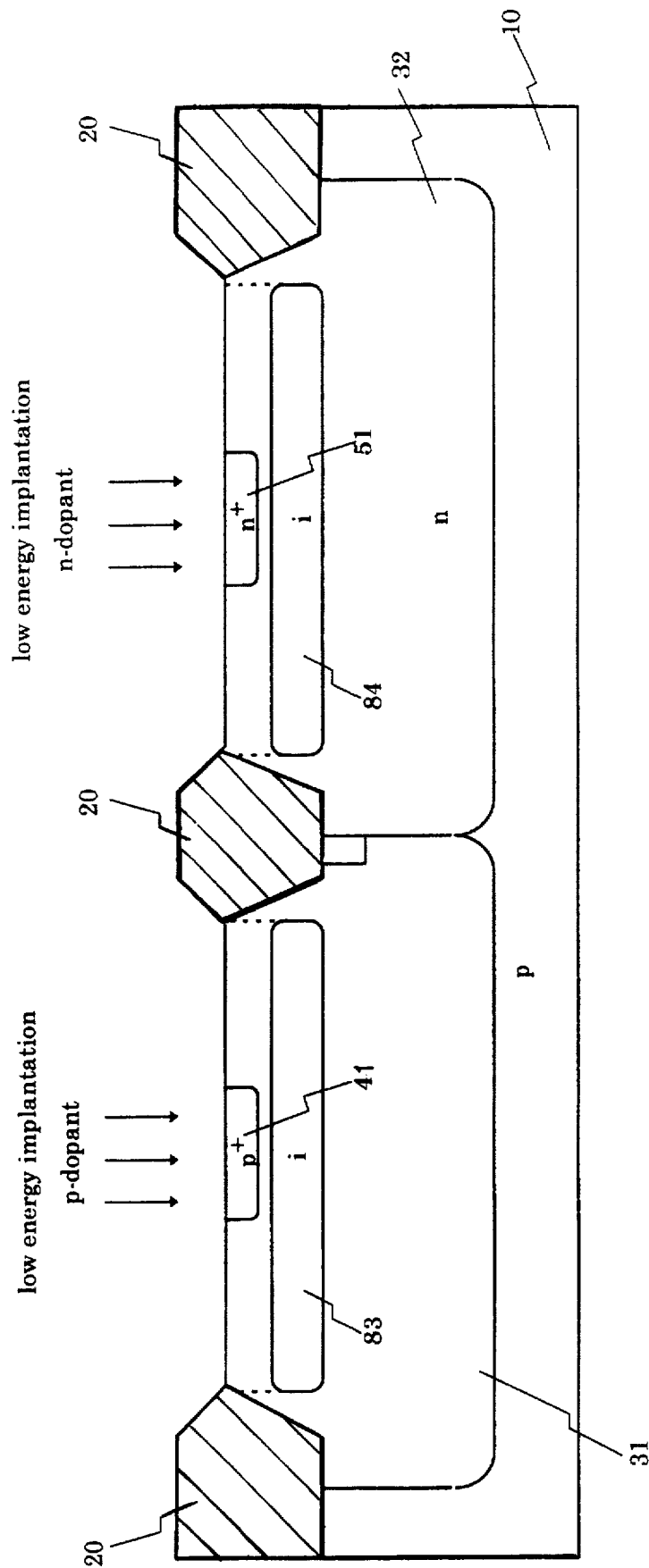

With reference to FIG. 46B, selective p-type and n-type impurity implantations into channel regions in the p-type well region 31 and the n-type well region 32 respectively are carried out at a low implantation energy to thereby form p-type and n-type high impurity concentration channel regions 41 and 51 in the p-type and n-type well regions 31 and 32 respectively.

Figure 46C:
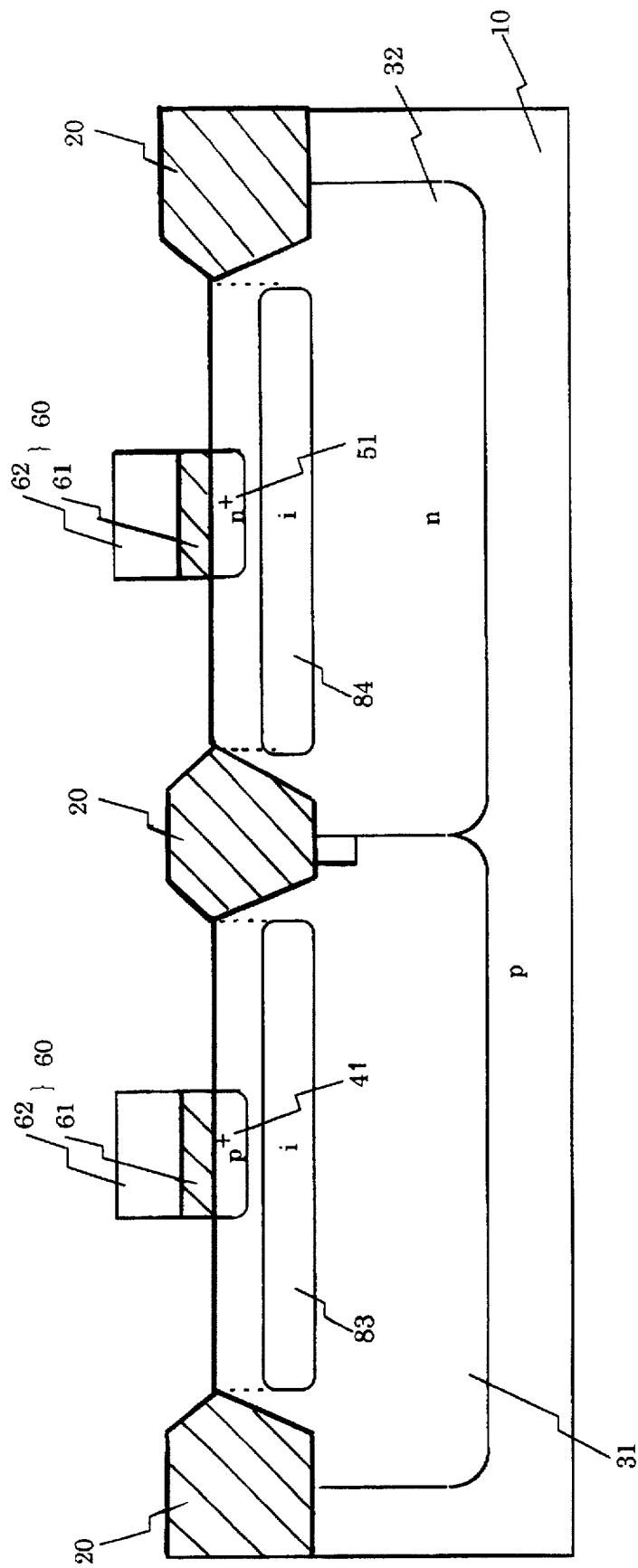

With reference to FIG. 46C, gate oxide films 61 are selectively formed on n-channel and p-channel regions in the p-type and n-type well regions 31 and 32. Gate electrodes 62 are provided on the gate oxide films 61 to thereby form the gate structure 60.

Figure 46D:
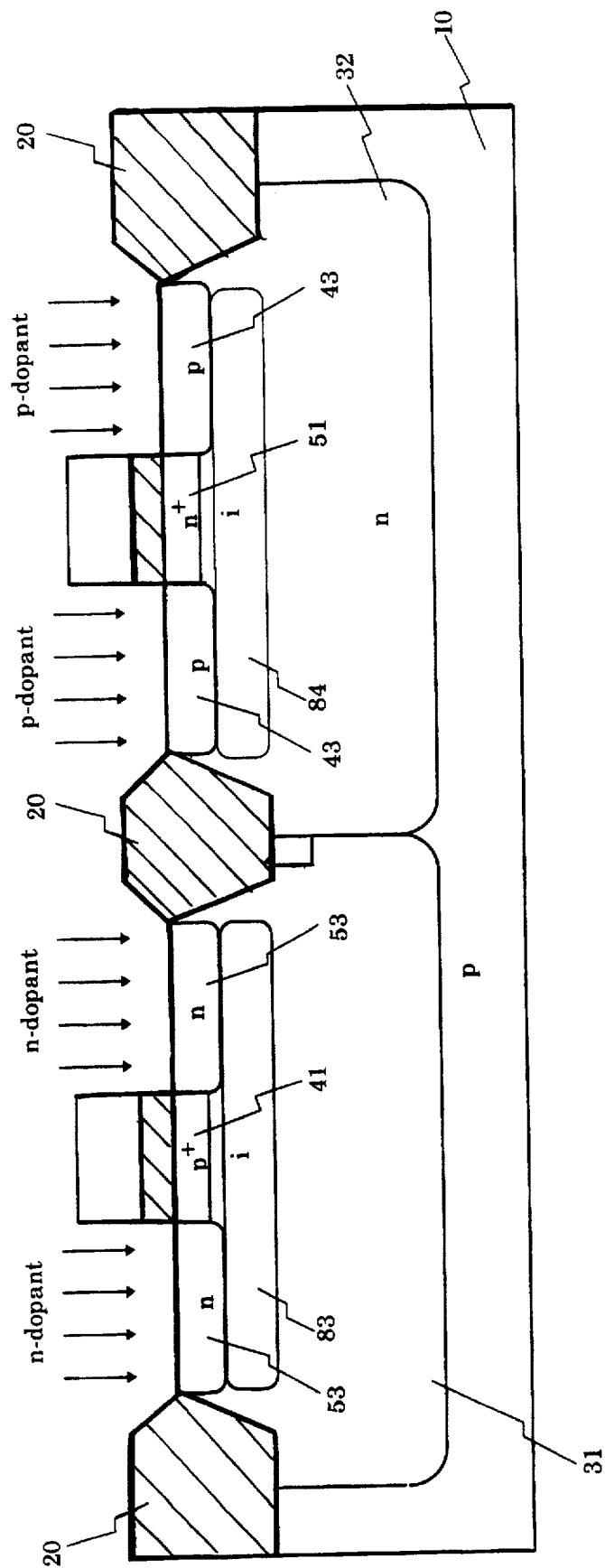

With reference to FIG. 46D, an n-type impurity implantation into the p-type well region 31 is carried out at a low implantation energy by using the gate structure 60 and the field oxide films 20 as masks to thereby form n-type lightly doped diffusion regions 53 as well as a p-type impurity implantation into the n-type well region 32 is carried out at a low implantation energy by using the gate structure 60 and the field oxide films 20 as masks to thereby form the p-type lightly doped diffusion regions 43.

Figure 46E:
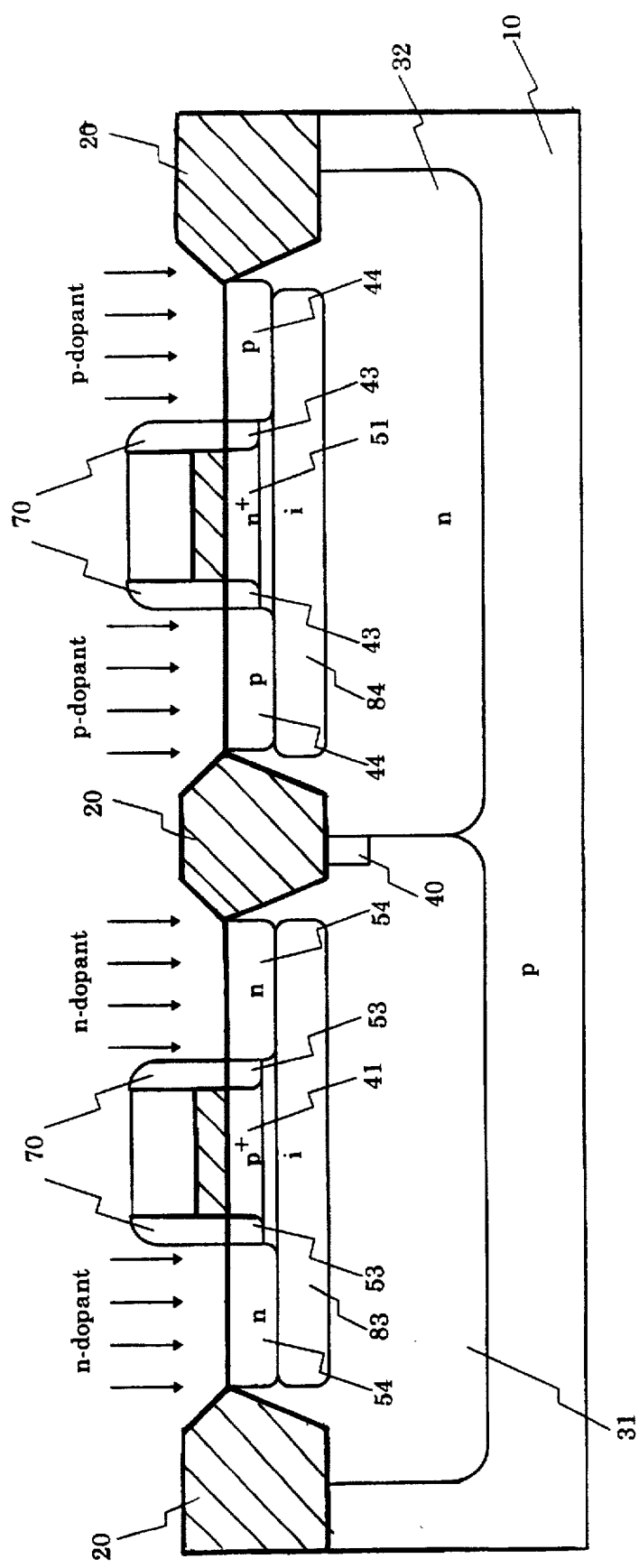

With reference to FIG. 46E, gate side wall oxide films 70 are formed on opposite sides of each of the gate structures 60 provided on the p-type and n-type well regions 31 and 32. An n-type impurity implantation into the n-type lightly doped diffusion regions 53 is carried out at a low implantation energy by using the gate structure 60 with the gate side wall oxide films 70 and the field oxide films 20 as masks to thereby form n-type source/drain diffusion diffusion regions 54 as well as a p-type impurity implantation into the p-type lightly doped diffusion regions 43 is carried out at a low implantation energy by using the gate structure 60 with the gate side wall oxide films 70 and the field oxide films 20 as masks to thereby form the p-type source/drain diffusion regions 44.

Figure 47:
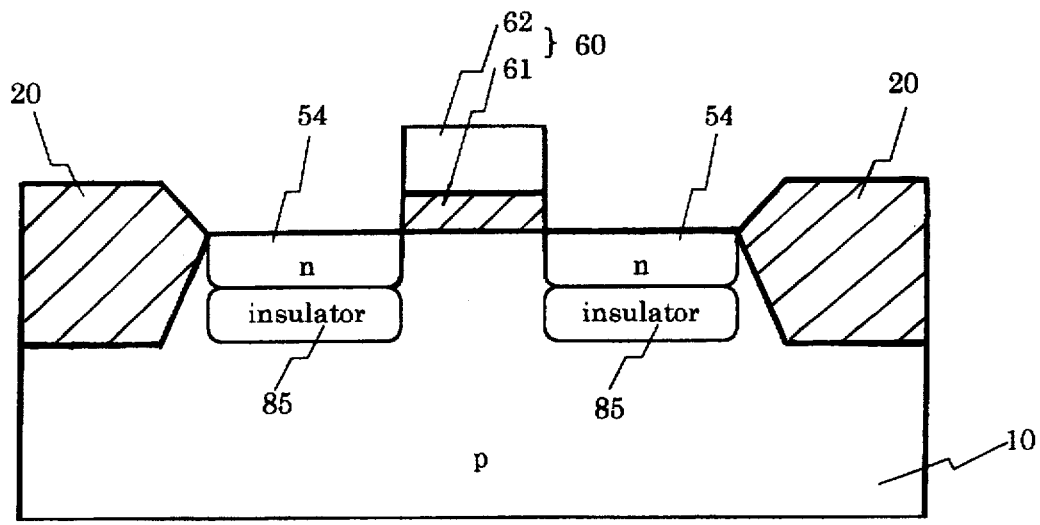
FIG. 47 is a cross sectional elevation view illustrative of a novel structure of a MOS field effect transistor in a twenty third embodiment according to the present invention.

A twenty third embodiment according to the present invention will be described with reference to FIG. 47 wherein another improved n-channel MOS field effect transistor is provided. Field oxide films 20 are selectively formed in a surface of the p-type semiconductor substrate 10. A gate structure 60 comprising a gate oxide film 61 and a gate electrode 62 is provided on a channel region between n-type source/drain diffusion regions 54. Insulation layers 85 are further provided just under the n-type source/drain diffusion regions 54 wherein top portions of the insulation layers 85 are in contact with bottoms of the n-type source/drain diffusion regions 54 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances.

The above present invention of this embodiment may be applicable to the p-channel MOS field effect transistor by changing the conductivity type of the impurities.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 48:
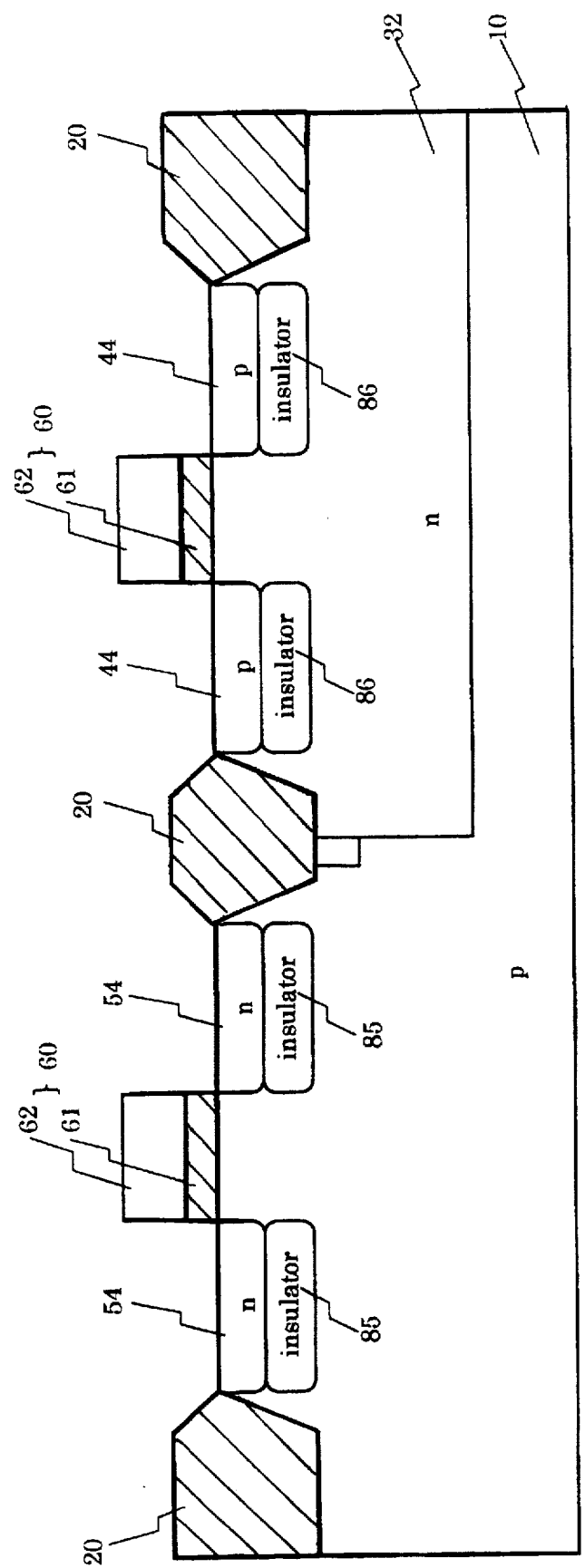
FIG. 48 is a cross sectional elevation view illustrative of a novel structure of a MOS field effect transistor in a twenty fourth embodiment according to the present invention.

A twenty fourth embodiment according to the present invention will be described with reference to FIG. 48 wherein another improved CMOS device is provided. A p-type semiconductor substrate 10 has an n-type well region 32. Field oxide films 20 are selectively formed in a surface of the p-type semiconductor substrate 10 to separate the n-type well region 32 from the p-type region of the substrate 10. Gate structures 60, each of which comprises a gate oxide film 61 and a gate electrode 62, are provided on channel regions in the p-type region of the substrate 10 and the n-type well region 10. Further, n-type source/drain diffusion regions 54 are provided in the p-type region of the substrate 10 and the p-type source/drain diffusion regions 44 are provided in the n-type well region 32. Insulation layers 85 are further provided just under the n-type source/drain diffusion regions 54 wherein top portions of the insulation layers 85 are in contact with bottoms of the n-type source/drain diffusion regions 54 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances. Insulation layers 86 are furthermore provided just under the p-type source/drain diffusion regions 44 wherein top portions of the insulation layers 86 are in contact with bottoms of the p-type source/drain diffusion regions 44 thereby no p-n junction capacitance is formed on the interfaces between the p-type source/drain diffusion regions 44 and the insulation layers 86. As a result, a capacitance of the p-type source/drain diffusion regions 44 is considerably reduced to allow the p-channel MOS field effect transistor to show high speed and high frequency performances.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 49:
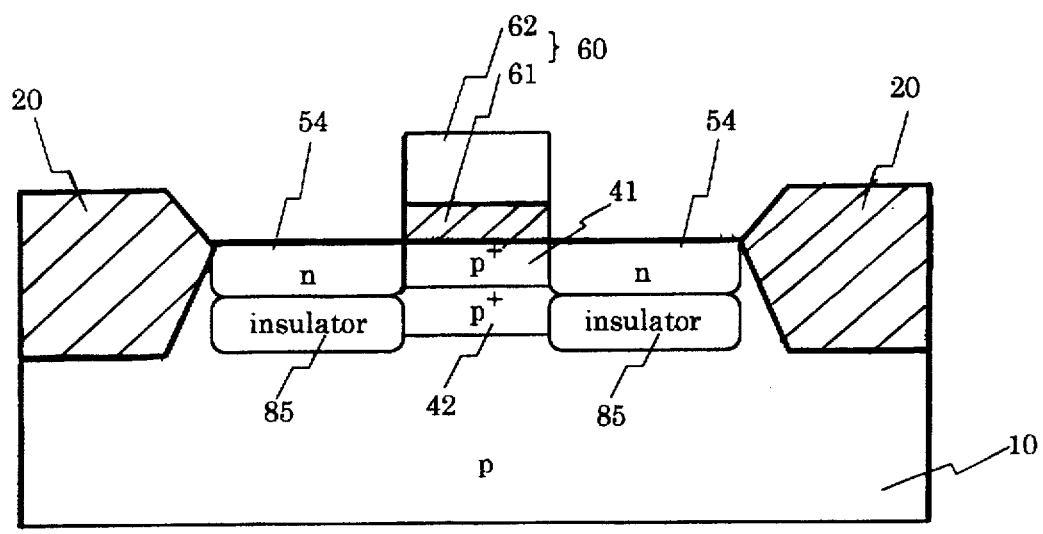
FIG. 49 is a cross sectional elevation view illustrative of a novel structure of a MOS field effect transistor in a twenty fifth embodiment according to the present invention.

A twenty fifth embodiment according to the present invention will be described with reference to FIG. 49 wherein another improved n-channel MOS field effect transistor is provided. Field oxide films 20 are selectively formed in a surface of the p-type semiconductor substrate 10. A p-type high impurity concentration channel region 41 is provided on a channel region of the p-type semiconductor substrate 10. A p-type high impurity concentration bottom region 42 is provided just under the p-type high impurity concentration channel region 41 to electrically connect the p-type high impurity concentration channel region 41 to the p-type semiconductor substrate 10 which is further provided with a control electrode not illustrated for receiving a control voltage application by which the substrate voltage and the channel potential may be controlled. A gate structure 60 comprising a gate oxide film 61 and a gate electrode 62 is provided on the p-type high impurity concentration channel region 41. Further, n-type source/drain diffusion regions 54 are provided. Insulation layers 85 are furthermore provided just under the n-type source/drain diffusion regions 54 wherein top portions of the insulation layers 85 are in contact with bottoms of the n-type source/drain diffusion regions 54 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances.

The above present invention of this embodiment may be applicable to the p-channel MOS field effect transistor by changing the conductivity type of the impurities.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 50:
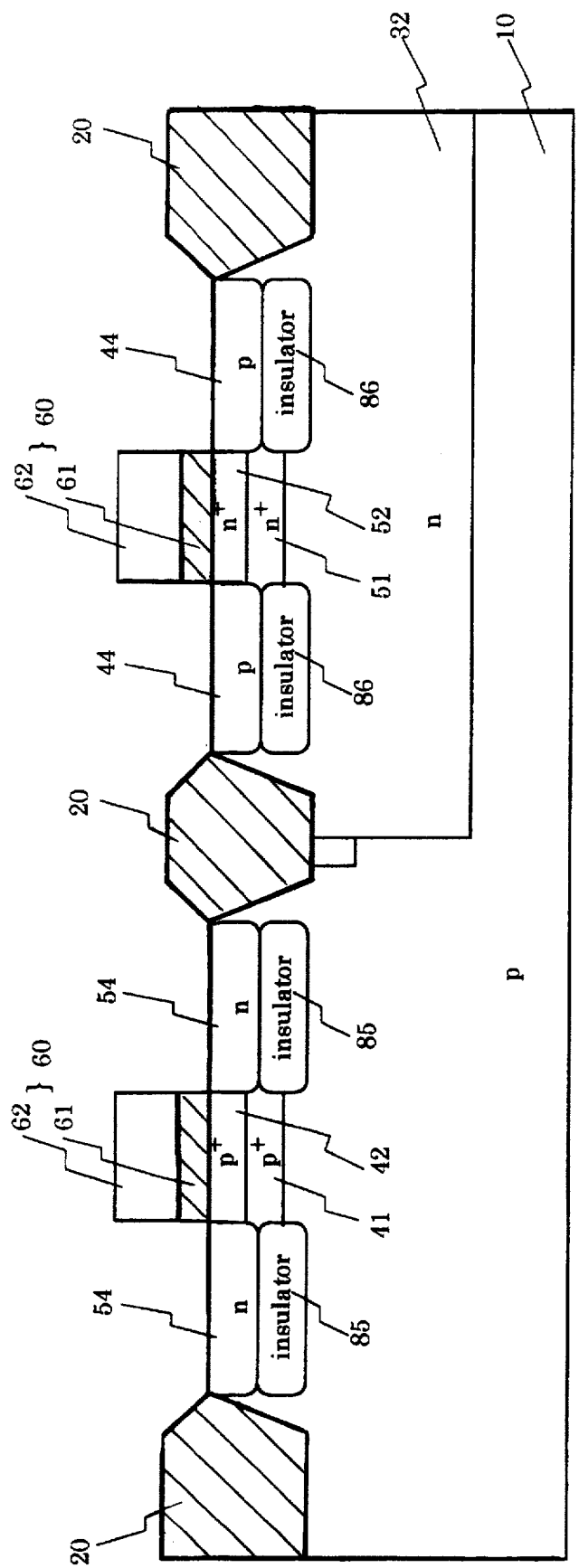
FIG. 50 is a cross sectional elevation view illustrative of a novel structure of a MOS field effect transistor in a twenty sixth embodiment according to the present invention.

A twenty sixth embodiment according to the present invention will be described with reference to FIG. 50 wherein another improved CMOS device is provided. A p-type semiconductor substrate 10 has an n-type well region 32. Field oxide films 20 are selectively formed in a surface of the p-type semiconductor substrate 10 to separate the n-type well region 32 from the p-type region of the substrate 10. A p-type high impurity concentration channel region 41 is provided on a channel region of the p-type semiconductor substrate 10. A p-type high impurity concentration bottom region 42 is provided just under the p-type high impurity concentration channel region 41 to electrically connect the p-type high impurity concentration channel region 41 to the p-type semiconductor substrate 10 which is further provided with a control electrode not illustrated for receiving a control voltage application by which the substrate voltage and the channel potential may be controlled. Similarly, an n-type high impurity concentration channel region 51 is provided on a channel region of the n-type well region 32. An n-type high impurity concentration bottom region 52 is provided just under the n-type high impurity concentration channel region 52. Gate structures 60, each of which comprises a gate oxide film 61 and a gate electrode 62, are provided on the p-type and n-type high impurity concentration channel regions 41 and 51. Further, n-type source/drain diffusion regions 54 are provided in the p-type region of the substrate 10 and the p-type source/drain diffusion regions 44 are provided in the n-type well region 32. Insulation layers 85 are further provided just under the n-type source/drain diffusion regions 54 wherein top portions of the insulation layers 85 are in contact with bottoms of the n-type source/drain diffusion regions 54 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances. Insulation layers 86 are furthermore provided just under the p-type source/drain diffusion regions 44 wherein top portions of the insulation layers 86 are in contact with bottoms of the p-type source/drain diffusion regions 44 thereby no p-n junction capacitance is formed on the interfaces between the p-type source/drain diffusion regions 44 and the insulation layers 86. As a result, a capacitance of the p-type source/drain diffusion regions 44 is considerably reduced to allow the p-channel MOS field effect transistor to show high speed and high frequency performances.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 51:
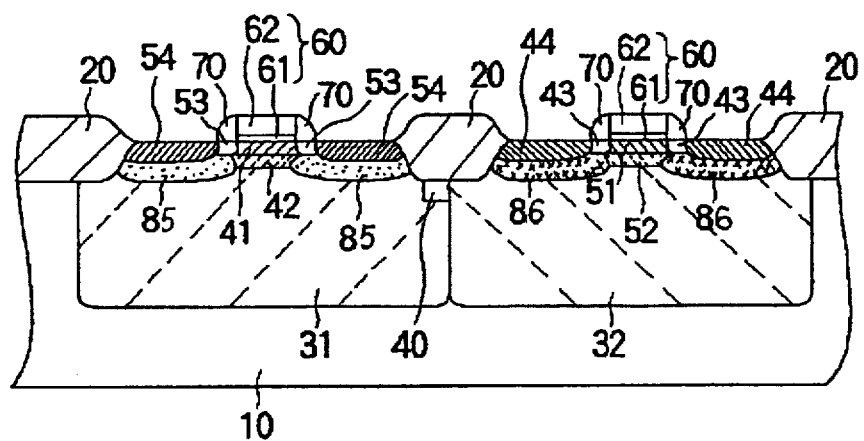
FIG. 51 is a cross sectional elevation view illustrative of a novel structure of a MOS field effect transistor in a twenty seventh embodiment according to the present invention.

A twenty seventh embodiment according to the present invention will be described with reference to FIG. 51 wherein another improved CMOS device is provided. A p-type semiconductor substrate 10 has p-type and n-type well regions 31 and 32. Field oxide films 20 are selectively formed in a surface of the p-type semiconductor substrate 10 to separate the n-type well region 32 from the p-type well region 31. A p-type high impurity concentration channel region 41 is provided on a channel region of the p-type well region 31. A p-type high impurity concentration bottom region 42 is provided just under the p-type high impurity concentration channel region 41. Similarly, an n-type high impurity concentration channel region 51 is provided on a channel region of the n-type well region 32. An n-type high impurity concentration bottom region 52 is provided just under the n-type high impurity concentration channel region 51. Gate structures 60, each of which comprises a gate oxide film 61 and a gate electrode 62, are provided on the p-type and n-type high impurity concentration channel regions 41 and 51. Gate side wall oxide films 70 are provided on opposite sides of each of the gate structures 60 in the p-type and n-type well regions 31 and 32. Further, n-type source/drain diffusion regions 54 are provided in the p-type well region 31 and the p-type source/drain diffusion regions 44 are provided in the n-type well region 32. Furthermore, n-type lightly doped diffusion regions 53 are provided just under the gate side wall oxide films 70 and insides of the n-type source/drain diffusion regions 54 in the p-type well region 31 as well as p-type lightly doped diffusion regions 43 are provided just under the gate side wall oxide films 70 and insides of the p-type source/drain diffusion regions 44 in the n-type well region 32. Insulation layers 85 are further provided to extend not only under the n-type source/drain diffusion regions 54 but also under the n-type lightly doped diffusion regions 53 wherein top portions of the insulation layers 85 are in contact with bottoms of the n-type source/drain diffusion regions 54 and also contact with bottoms of the n-type lightly doped diffusion regions 53 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances. Insulation layers 86 are furthermore provided to extend not only under the p-type source/drain diffusion regions 44 but also under the p-type lightly doped diffusion regions 43 wherein top portions of the insulation layers 86 are in contact with bottoms of the p-type source/drain diffusion regions 44 and also contact with bottoms of the p-type lightly doped diffusion regions 43 thereby no p-n junction capacitance is formed on the interfaces between the p-type source/drain diffusion regions 44 and the insulation layers 86. As a result, a capacitance of the p-type source/drain diffusion regions 44 is considerably reduced to allow the p-channel MOS field effect transistor to show high speed and high frequency performances.

Figure 52:
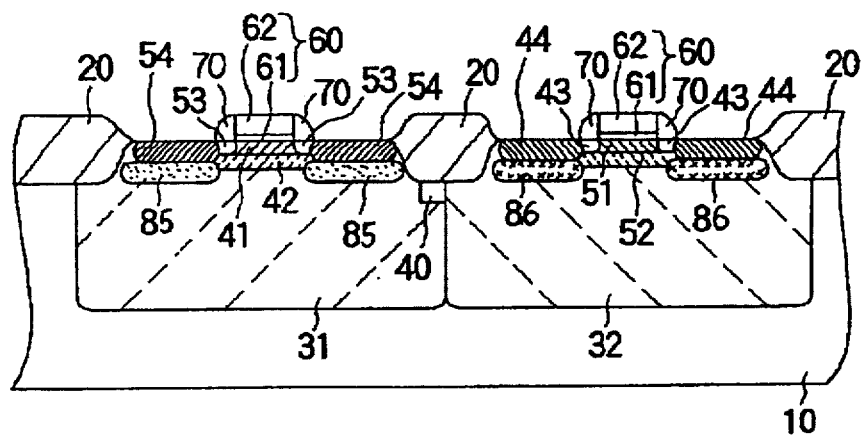
FIG. 52 is a cross sectional elevation view illustrative of a novel structure of a MOS field effect transistor in a twenty eighth embodiment according to the present invention.

A twenty eighth embodiment according to the present invention will be described with reference to FIG. 52 wherein another improved CMOS device is provided. A p-type semiconductor substrate 10 has p-type and n-type well regions 31 and 32. Field oxide films 20 are selectively formed in a surface of the p-type semiconductor substrate 10 to separate the n-type well region 32 from the p-type well region 31. A p-type high impurity concentration channel region 41 is provided on a channel region of the p-type well region 31. Similarly, an n-type high impurity concentration channel region 51 is provided on a channel region of the n-type well region 32. Gate structures 60, each of which comprises a gate oxide film 61 and a gate electrode 62, are provided on the p-type and n-type high impurity concentration channel regions 41 and 51. Gate side wall oxide films 70 are provided on opposite sides of each of the gate structures 60 in the p-type and n-type well regions 31 and 32. Further, n-type source/drain diffusion regions 54 are provided in the p-type well region 31 and the p-type source/drain diffusion regions 44 are provided in the n-type well region 32. Furthermore, n-type lightly doped diffusion regions 53 are provided just under the gate side wall oxide films 70 and insides the n-type source/drain diffusion regions 54 in the p-type well region 31 as well as p-type lightly doped diffusion regions 43 are provided just under the gate side wall oxide films 70 and insides of the p-type source/drain diffusion regions 44 in the n-type well region 32. A p-type high impurity concentration bottom region 42 is provided to extend not only under the p-type high impurity concentration channel region 41 but also under the n-type lightly doped diffusion regions 53. An n-type high impurity concentration bottom region 52 is provided to extend not only under the n-type high impurity concentration channel region 51 but also under the p-type lightly doped diffusion regions 43. Insulation layers 85 are further provided to extend just under the n-type source/drain diffusion regions 54 wherein top portions of the insulation layers 85 are in contact with bottoms of the n-type source/drain diffusion regions 54 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances. Insulation layers 86 are furthermore provided to extend just under the p-type source/drain diffusion regions 44 wherein top portions of the insulation layers 86 are in contact with bottoms of the p-type source/drain diffusion regions 44 thereby no p-n junction capacitance is formed on the interfaces between the p-type source/drain diffusion regions 44 and the insulation layers 86. As a result, a capacitance of the p-type source/drain diffusion regions 44 is considerably reduced to allow the p-channel MOS field effect transistor to show high speed and high frequency performances.

Figure 53:
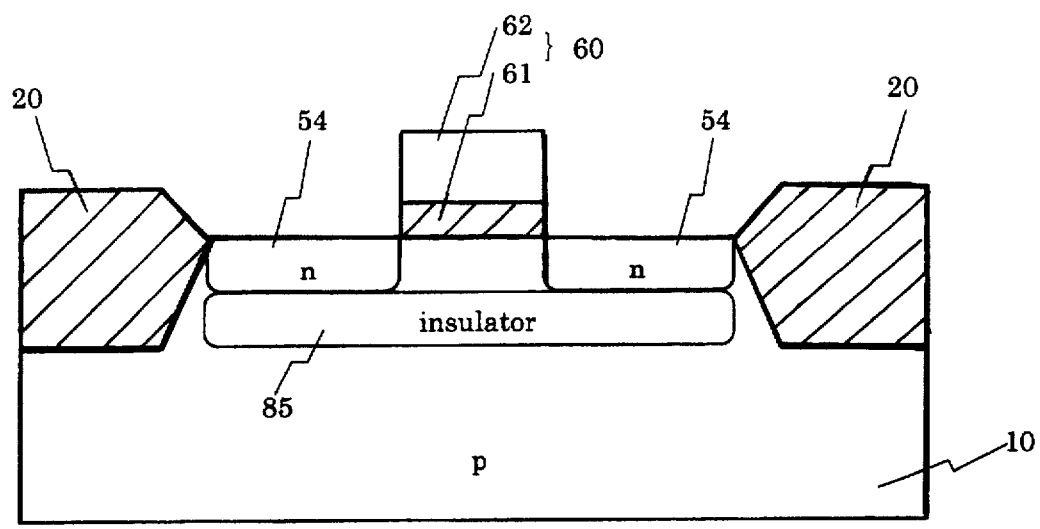
FIG. 53 is a cross sectional elevation view illustrative of a novel structure of a MOS field effect transistor in a twenty ninth embodiment according to the present invention.

A twenty ninth embodiment according to the present invention will be described with reference to FIG. 53 wherein another improved n-channel MOS field effect transistor is provided. Field oxide films 20 are selectively formed in a surface of the p-type semiconductor substrate 10. A gate structure 60 comprising a gate oxide film 61 and a gate electrode 62 is provided on a channel region between n-type source/drain diffusion regions 54. A single insulation layer 85 is further provided to extend under the n-type source/drain diffusion regions 54 wherein a top portion of the single insulation layer 85 is in contact with bottoms of the n-type source/drain diffusion regions 54 thereby no p-n junction capacitance is formed on the interfaces between the n-type source/drain diffusion regions 54 and the insulation layer 85. As a result, a capacitance of the n-type source/drain diffusion regions 54 is considerably reduced to allow the n-channel MOS field effect transistor to show high speed and high frequency performances.

The above present invention of this embodiment may be applicable to the p-channel MOS field effect transistor by changing the conductivity type of the impurities.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 54:
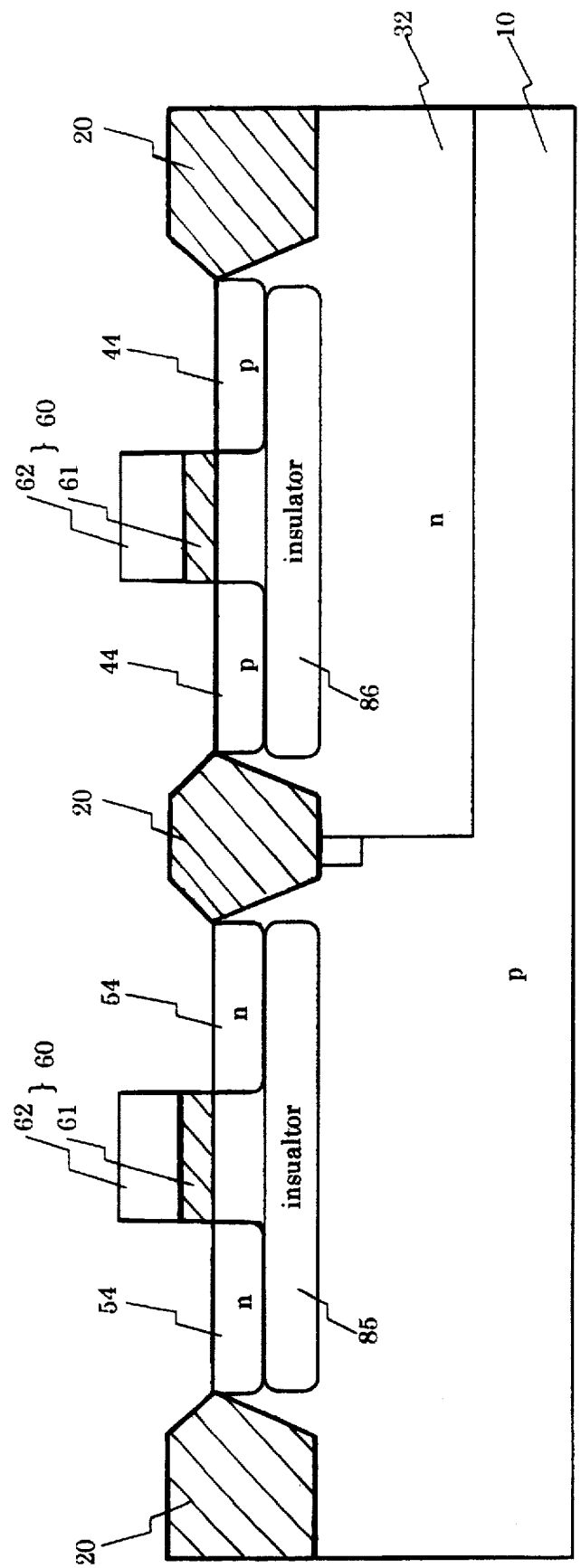
FIG. 54 is a cross sectional elevation view illustrative of a novel structure of a MOS field effect transistor in a thirtieth embodiment according to the present invention.

A thirtieth embodiment according to the present invention will be described with reference to FIG. 54 wherein another improved CMOS device is provided. A p-type semiconductor substrate 10 has an n-type well region 32. Field oxide films 20 are selectively formed in a surface of the p-type semiconductor substrate 10 to separate the n-type well region 32 from the p-type region of the substrate 10. Gate structures 60, each of which comprises a gate oxide film 61 and a gate electrode 62, are provided on channel regions in the p-type region of the substrate 10 and the n-type well region 10. Further, n-type source/drain diffusion regions 54 are provided in the p-type region of the substrate 10 and the p-type source/drain diffusion regions 44 are provided in the n-type well region 32. A single insulation layer 85 is further provided to extend under the n-type source/drain diffusion regions 54 wherein a top portion of the single insulation layer 85 is in contact with bottoms of the n-type source/drain diffusion regions 54 thereby no p-n junction capacitance is formed on the interfaces between the n-type source/drain diffusion regions 54 and the insulation layer 85. As a result, a capacitance of the n-type source/drain diffusion regions 54 is considerably reduced to allow the n-channel MOS field effect transistor to show high speed and high frequency performances. A single insulation layer 86 is furthermore provided to extend under the p-type source/drain diffusion regions 44 wherein a top portion of the insulation layer 86 is in contact with bottoms of the p-type source/drain diffusion regions 44 thereby no p-n junction capacitance is formed on the interfaces between the p-type source/drain diffusion regions 44 and the insulation layer 86. As a result, a capacitance of the p-type source/drain diffusion regions 44 is considerably reduced to allow the p-channel MOS field effect transistor to show high speed and high frequency performances.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 55:
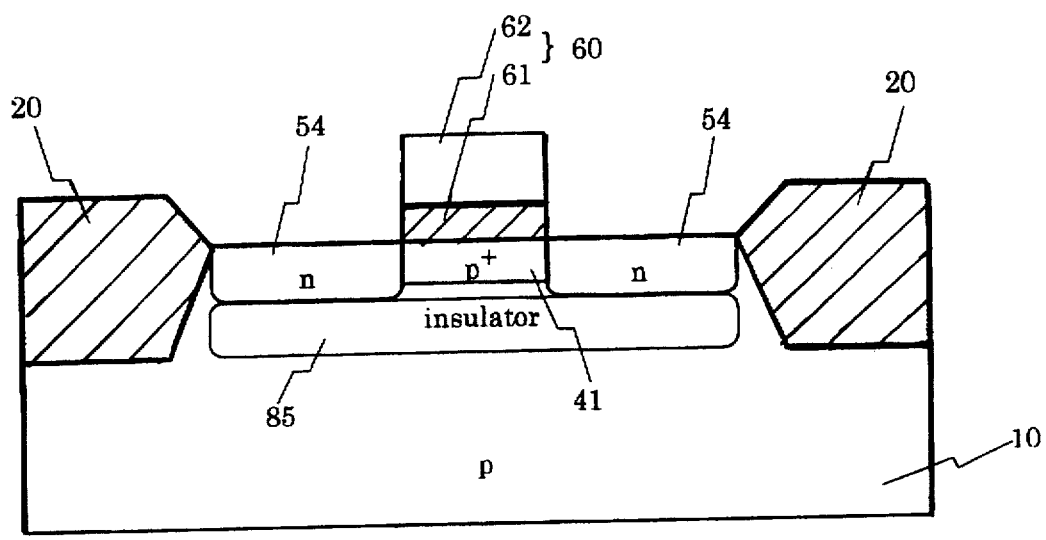
FIG. 55 is a cross sectional elevation view illustrative of a novel structure of a MOS field effect transistor in a thirty first embodiment according to the present invention.

A thirty first embodiment according to the present invention will be described with reference to FIG. 55 wherein another improved n-channel MOS field effect transistor is provided. Field oxide films 20 are selectively formed in a surface of the p-type semiconductor substrate 10. A p-type high impurity concentration channel region 41 is provided on a channel region of the p-type semiconductor substrate 10. A gate structure 60 comprising a gate oxide film 61 and a gate electrode 62 is provided on the p-type high impurity concentration channel region 41. Further, n-type source/drain diffusion regions 54 are provided. A single insulation layer 85 is furthermore provided to extend under the n-type source/drain diffusion regions 54 wherein a top portion of the insulation layer 85 is in contact with bottoms of the n-type source/drain diffusion regions 54 thereby no p-n junction capacitance is formed on the interfaces between the n-type source/drain diffusion regions 54 and the insulation layers 85. As a result, a capacitance of the n-type source/drain diffusion regions 54 is considerably reduced to allow the n-channel MOS field effect transistor to show high speed and high frequency performances.

The above present invention of this embodiment may be applicable to the p-channel MOS field effect transistor by changing the conductivity type of the impurities.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 56:
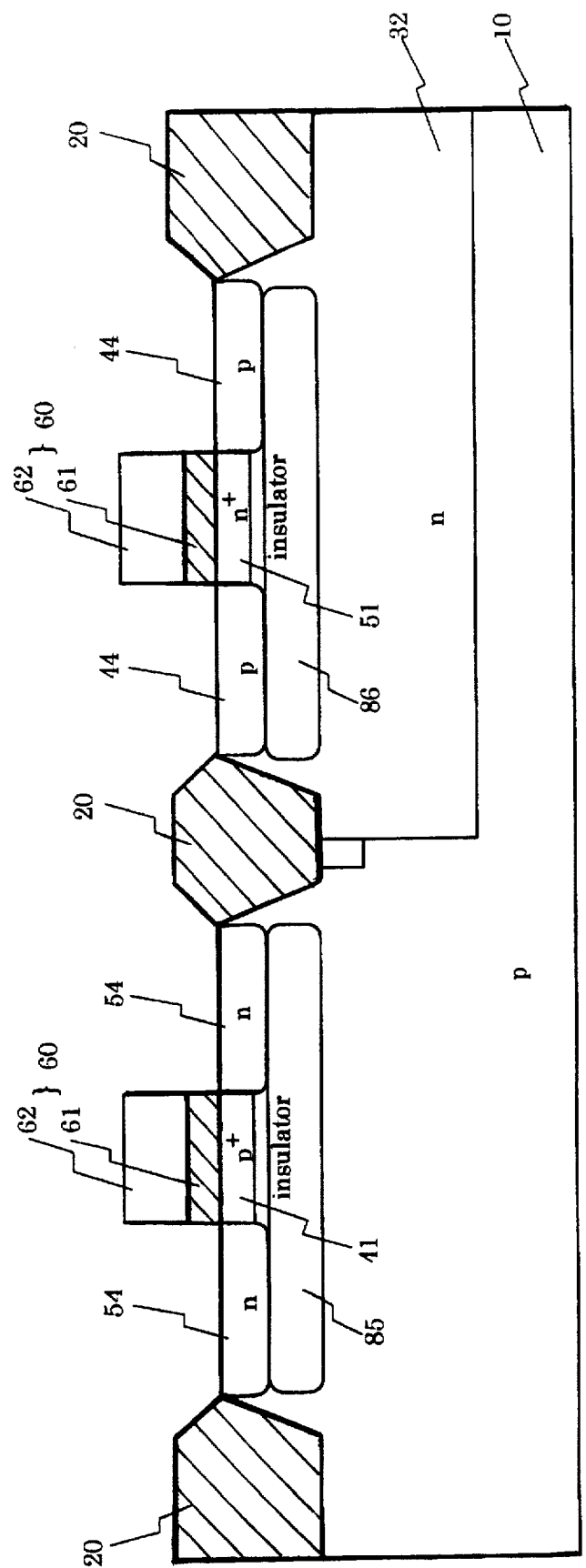
FIG. 56 is a cross sectional elevation view illustrative of a novel structure of a MOS field effect transistor in a thirty second embodiment according to the present invention.

A thirty second embodiment according to the present invention will be described with reference to FIG. 56 wherein another improved CMOS device is provided. A p-type semiconductor substrate 10 has an n-type well region 32. Field oxide films 20 are selectively formed in a surface of the p-type semiconductor substrate 10 to separate the n-type well region 32 from the p-type region of the substrate 10. A p-type high impurity concentration channel region 41 is provided on a channel region of the p-type semiconductor substrate 10. Similarly, an n-type high impurity concentration channel region 51 is provided on a channel region of the n-type well region 32. Gate structures 60, each of which comprises a gate oxide film 61 and a gate electrode 62, are provided on the p-type and n-type high impurity concentration channel regions 41 and 51. Further, n-type source/drain diffusion regions 54 are provided in the p-type region of the substrate 10 and the p-type source/drain diffusion regions 44 are provided in the n-type well region 32. A single insulation layer 85 is further provided to extend under the n-type source/drain diffusion regions 54 wherein a top portion of the single insulation layer 85 is in contact with bottoms of the n-type source/drain diffusion regions 54 thereby no p-n junction capacitance is formed on the interfaces between the n-type source/drain diffusion regions 54 and the insulation layer 85. As a result, a capacitance of the n-type source/drain diffusion regions 54 is considerably reduced to allow the n-channel MOS field effect transistor to show high speed and high frequency performances. A single insulation layer 86 is furthermore provided to extend under the p-type source/drain diffusion regions 44 wherein a top portion of the single insulation layer 86 is in contact with bottoms of the p-type source/drain diffusion regions 44 thereby no p-n junction capacitance is formed on the interfaces between the p-type source/drain diffusion regions 44 and the insulation layer 86. As a result, a capacitance of the p-type source/drain diffusion regions 44 is considerably reduced to allow the p-channel MOS field effect transistor to show high speed and high frequency performances.

As a further modification of this embodiment, the gate structure 60 may advantageously include gate side wall oxide films under which lightly doped diffusion regions having the same conductivity type as the source/drain diffusion regions are provided for relaxation of field concentration between the gate electrode and the source/drain diffusion regions.

Figure 57:
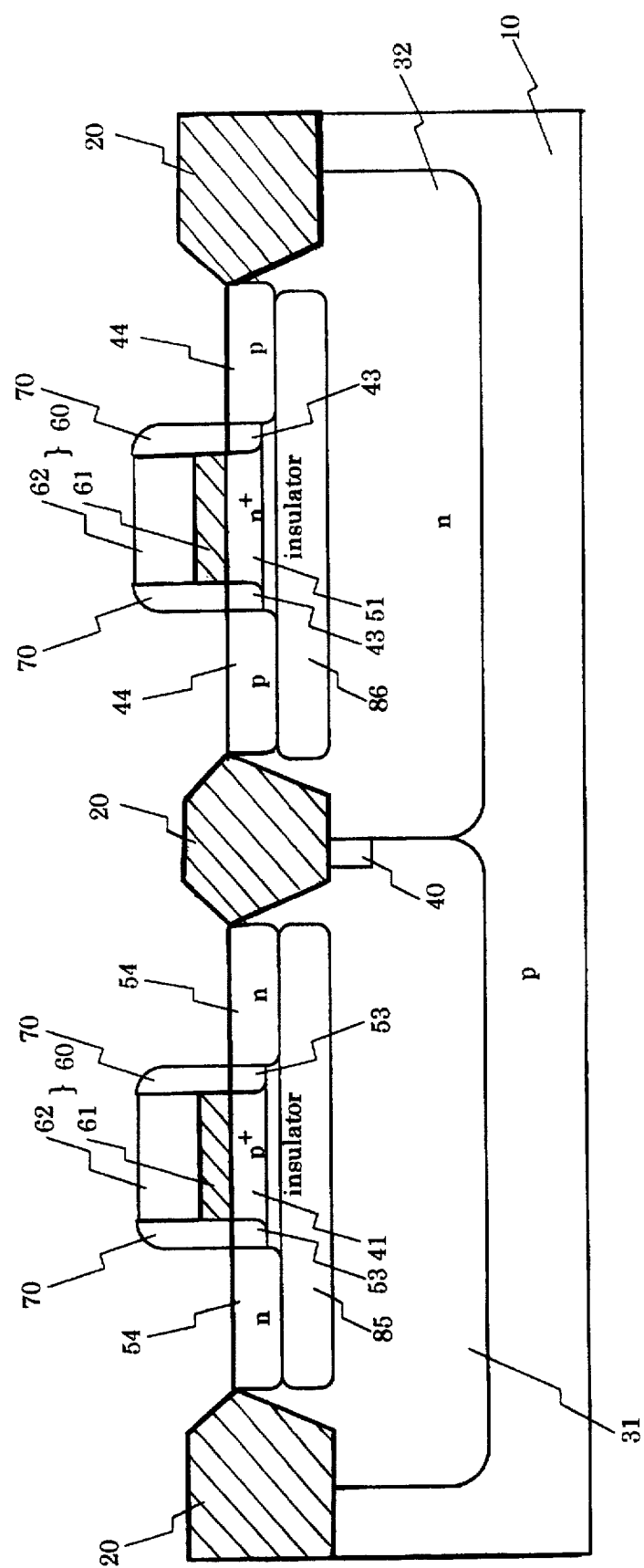
FIG. 57 is a cross sectional elevation view illustrative of a novel structure of a MOS field effect transistor in a thirty third embodiment according to the present invention.

A thirty third embodiment according to the present invention will be described with reference to FIG. 57 wherein another improved CMOS device is provided. A p-type semiconductor substrate 10 has p-type and n-type well regions 31 and 32. Field oxide films 20 are selectively formed in a surface of the p-type semiconductor substrate 10 to separate the n-type well region 32 from the p-type well region 31. A p-type high impurity concentration channel region 41 is provided on a channel region of the p-type well region 31. Similarly, an n-type high impurity concentration channel region 51 is provided on a channel region of the n-type well region 32. Gate structures 60, each of which comprises a gate oxide film 61 and a gate electrode 62, are provided on the p-type and n-type high impurity concentration channel regions 41 and 51. Gate side wall oxide films 70 are provided on opposite sides of each of the gate structures 60 in the p-type and n-type well regions 31 and 32. Further, n-type source/drain diffusion regions 54 are provided in the p-type well region 31 and the p-type source/drain diffusion regions 44 are provided in the n-type well region 32. Furthermore, n-type lightly doped diffusion regions 53 are provided just under the gate side wall oxide films 70 and insides the n-type source/drain diffusion regions 54 in the p-type well region 31 as well as p-type lightly doped diffusion regions 43 are provided just under the gate side wall oxide films 70 and insides the p-type source/drain diffusion regions 44 in the n-type well region 32. A single insulation layer 85 is further provided to extend under the n-type source/drain diffusion regions 54 wherein a top portion of the single insulation layer 85 is in contact with bottoms of the n-type source/drain diffusion regions 54 thereby no p-n junction capacitance is formed on the interfaces between the n-type source/drain diffusion regions 54 and the insulation layer 85. As a result, a capacitance of the n-type source/drain diffusion regions 54 is considerably reduced to allow the n-channel MOS field effect transistor to show high speed and high frequency performances. A single insulation layer 86 is furthermore provided to extend under the p-type source/drain diffusion regions 44 wherein a top portion of the single insulation layer 86 is in contact with bottoms of the p-type source/drain diffusion regions 44 thereby no p-n junction capacitance is formed on the interfaces between the p-type source/drain diffusion regions 44 and the insulation layer 86. As a result, a capacitance of the p-type source/drain diffusion regions 44 is considerably reduced to allow the p-channel MOS field effect transistor to show high speed and high frequency performances.

All of the present inventions described above would be applicable to various semiconductor devices other than the MOS field effect transistors, such as semiconductor devices including at least a semiconductor bulk region within which diffusion regions doped with the same or different impurities are formed wherein diffusion regions are provided with electrodes for receiving alternating voltages, provided that a capacitance of the diffusion regions is required to be small for allowing the device to show high speed and high frequency performances. The semiconductor device to which the present inventions are applicable, may include source/drain diffusion regions so highly doped with different impurities of different conductivity types as to be degenerated, a channel region made of an intrinsic semiconductor sandwiched between the source/drain diffusion regions, a gate structure provided over the channel region to apply an electric field to the same to switch the channel region into degenerated state so that a degenerated p-n junction allowing a tunneling process is formed between the channel region in the degenerated state and one of the source/drain diffusion regions. Such devices are often required to show extremely high speed and high frequency performances. The low impurity concentration layers, the quasi-intrinsic semiconductor layers or the insulating layers may be provided under the degenerated source/drain diffusion regions wherein tops of the low impurity concentration layers, the quasi-intrinsic semiconductor layers or the insulating layers are in contact with bottoms of the source/drain diffusion regions thereby a capacitance of the source/drain diffusion regions is considerable reduced.

Whereas modifications of the present invention will no doubt be apparent to a person having ordinary skill in the art, to which the invention pertains, it is to be understood that embodiments shown and described by way of illustrations are by no means intended to be considered in a limiting sense. Accordingly, it is to be intended to cover by claims all modifications of the present invention which fall within the spirit and scope of the present invention.

What is claimed is:

1. A source/drain diffusion region structure in a field effect transistor comprising:

source/drain diffusion regions being doped with an impurity of a first conductivity type at a first impurity concentration, said source/drain diffusion regions being provided in a surface of a semiconductor bulk region doped with an impurity of a second conductivity type at a second impurity concentration lower than said first impurity concentration, said source and drain diffusion regions being provided separately from one another so as to define, between said source/drain diffusion regions, a channel region over which a gate electrode is provided through a gate insulating film;

separate capacitance reduction layers provided under said respective source/drain diffusion regions so as to be in contact with entire bottoms of said source/drain diffusion regions, said capacitance reduction layers being doped with an impurity of said second conductivity type at a third impurity concentration which is at least lower than said second impurity concentration of said semiconductor bulk region thereby to reduce a parasitic capacitance between said source/drain diffusion regions and said semiconductor bulk region.

2. The structure as claimed in claim 1, wherein said capacitance reduction layers are in contact with at least entire parts of said bottoms of said source/drain diffusion regions.

3. The structure as claimed in claim 1, wherein said third impurity concentration is set at zero to form said capacitance reduction layers in intrinsic or quasi-intrinsic semiconductor layers.

4. The structure as claimed in claim 1, wherein said third impurity concentration is set higher than zero to form said capacitance reduction layers in low impurity concentration diffusion layers.

5. The structure as claimed in claim 4, wherein:

said first conductivity type is n-type and said second conductivity type is p-type and wherein:

said first impurity concentration of said source/drain diffusion regions is $1 \times 10^{20}$ atoms/cm$^3$ and said third impurity concentration of said capacitance reduction layers is $1 \times 10^{15}$ atoms/cm$^3$ to thereby form a space charge region with a width of 0.6 micrometers between said source/drain diffusion regions and said low impurity concentration diffusion layers.

6. The structure as claimed in claim 5, wherein said second impurity concentration of said semiconductor bulk region is $8 \times 10^{12}$ atoms/cm$^3$.

7. The structure as claimed in claim 4, wherein:

said first conductivity type is p-type and said second conductivity type is n-type and wherein:

said first impurity concentration of said source/drain diffusion regions is $1 \times 10^{20}$ atoms/cm$^3$ and said third impurity concentration of said capacitance reduction layers is $1 \times 10^{16}$ atoms/cm$^3$ to thereby form a space charge region with a width of 0.3 micrometers between said source/drain diffusion regions and said low impurity concentration diffusion layers.

8. The structure as claimed in claim 7, wherein said second impurity concentration of said semiconductor bulk region is $8 \times 10^{12}$ atoms/cm$^3$.

9. The structure as claimed in claim 1, wherein said capacitance reduction layers are provided separately from each other to extend only on entire parts of said bottoms of said source/drain diffusion regions so as to true up both edges of each of said capacitance reduction layers and each of said source/drain diffusion regions.

10. The structure as claimed in claim 1, wherein said semiconductor bulk region comprises a semiconductor substrate.

11. The structure as claimed in claim 1, wherein said semiconductor bulk region comprises a semiconductor well region formed in a semiconductor substrate.

12. The structure as claimed in claim 1, wherein said semiconductor bulk region comprises a semiconductor well region formed in a semi-insulating substrate.

13. The structure as claimed in claim 1, wherein said semiconductor bulk region is formed on an insulating substrate.

14. The structure as claimed in claim 1, further comprising a high impurity diffusion region being provided between said source/drain diffusion regions to include at least said channel region, said high impurity diffusion region being doped with an impurity of said second conductivity type at a fourth impurity concentration at least higher than said second impurity concentration of said semiconductor bulk region.

15. The structure as claimed in claim 14, further comprising:

gate side walls comprising insulating films provided on side walls of said gate electrode; and lightly doped regions just under said gate side walls and between said channel region and inside edges of said source/drain diffusion regions.

16. The structure as claimed in claim 15, wherein said capacitance reduction layers are formed separately from each other to extend not only on entire parts of said bottoms of said source/drain diffusion regions but also on bottoms of said lightly doped regions.

17. A MOS field effect transistor comprising:

a semiconductor substrate doped with an impurity of a first conductivity type at a first impurity concentration;

source/drain diffusion regions being doped with an impurity of a second conductivity type at a second impurity concentration higher than said first impurity concentration of said semiconductor substrate, said source/drain diffusion regions being provided separately from each other in a surface region of said semiconductor substrate to define a channel region between said source/drain diffusion regions;

a gate insulating film provided to extend at least on said channel region;

a gate electrode provided on said gate insulating film and rightly over said channel region; and separate capacitance reduction layers provided under said respective source/drain diffusion regions so as to be in contact with entire bottoms of said source/drain diffusion regions, said capacitance reduction layers being doped with an impurity of said second conductivity type at a third impurity concentration which is at least lower than said first impurity concentration of said semiconductor substrate thereby to reduce a parasitic capacitance between said source/drain diffusion regions and said semiconductor substrate.

18. The structure as claimed in claim 17, wherein said capacitance reduction layers are in contact with at least entire parts of said bottoms of said source/drain diffusion regions.

19. The structure as claimed in claim 17, wherein said third impurity concentration is set at zero to form said capacitance reduction layers in intrinsic or quasi-intrinsic semiconductor layers.

20. The structure as claimed in claim 17, wherein said third impurity concentration is set higher than zero to form said capacitance reduction layers in low impurity concentration diffusion layers.

21. The structure as claimed in claim 20, wherein:

said first conductivity type is p-type and said second conductivity type is n-type and wherein:

said second impurity concentration of said source/drain diffusion regions is $1 \times 10^{20}$ atoms/cm$^3$ and said third impurity concentration of said capacitance reduction layers is $1 \times 10^{15}$ atoms/cm$^3$ to thereby form a space charge region with a width of 0.6 micrometers between said source/drain diffusion regions and said low impurity concentration diffusion layers.

22. The structure as claimed in claim 21, wherein said first impurity concentration of said semiconductor substrate is $8 \times 10^{12}$ atoms/cm$^3$.

23. The structure as claimed in claim 20, wherein:

said first conductivity type is n-type and said second conductivity type is p-type and wherein:

said second impurity concentration of said source/drain diffusion regions is $1 \times 10^{20}$ atoms/cm$^3$ and said third impurity concentration of said capacitance reduction layers is $1 \times 10^{16}$ atoms/cm$^3$ to thereby form a space charge region with a width of 0.3 micrometers between said source/drain diffusion regions and said low impurity concentration diffusion layers.

24. The structure as claimed in claim 23, wherein said first impurity concentration of said semiconductor substrate is $8 \times 10^{12}$ atoms/cm$^3$.

25. The structure as claimed in claim 17, wherein said capacitance reduction layers are provided separately from each other to extend only on entire parts of said bottoms of said source/drain diffusion regions so as to true up both edges of each of said capacitance reduction layers and each of said source/drain diffusion regions.

26. The structure as claimed in claim 17, further comprising a high impurity diffusion region being provided between said source/drain diffusion regions to include at least said channel region, said high impurity diffusion region being doped with an impurity of said second conductivity type at a fourth impurity concentration at least higher than said second impurity concentration of said semiconductor substrate.

27. The structure as claimed in claim 26, further comprising:

gate side walls comprising insulating films provided on side walls of said gate electrode; and lightly doped regions just under said gate side walls and between said channel region and inside edges of said source/drain diffusion regions.

28. The structure as claimed in claim 27, wherein said capacitance reduction layers are formed separately from each other to extend not only on entire parts of said bottoms of said source/drain diffusion regions but also on bottoms of said lightly doped regions.

29. A source/drain diffusion region structure in a field effect transistor comprising:

source/drain diffusion regions being doped with an impurity of a first conductivity type at a first impurity concentration, said source/drain diffusion regions being provided in a semiconductor bulk region doped with an impurity of a second conductivity type at a second impurity concentration lower than said first impurity concentration; and at least one diffusion capacitance reduction layer provided only under at least one of said source/drain diffusion regions so as to be in contact with an entire bottom of a respective said source/drain diffusion region, said diffusion capacitance reduction layer being doped with an impurity of said second conductivity type at a third impurity concentration which is at least lower than said second impurity concentration of said semiconductor bulk region thereby to reduce a parasitic capacitance between said respective source/drain diffusion region and said semiconductor bulk region.

30. The structure as claimed in claim 29, wherein said third impurity concentration is set at zero to form said diffusion capacitance reduction layer in an intrinsic or a quasi-intrinsic semiconductor layer.

31. The structure as claimed in claim 29, wherein said third impurity concentration is set to form said diffusion capacitance reduction layer in a low impurity concentration diffusion layer.

32. The structure as claimed in claim 31, wherein:

said first conductivity type is n-type and said second conductivity type is p-type and wherein:

said first impurity concentration of said diffusion region is $1 \times 10^{20}$ atoms/cm$^3$ and said third impurity concentration of said diffusion capacitance reduction layer is $1\times10^{15}$ atoms/cm$^3$ to thereby form a space charge region with a width of 0.6 micrometers between said diffusion region and said low impurity concentration diffusion layer.

33. The structure as claimed in claim 32, wherein said second impurity concentration of said semiconductor bulk region is $8\times10^{12}$ atoms/cm$^3$.

34. The structure as claimed in claim 31, wherein:

said first conductivity type is p-type and said second conductivity type is n-type and wherein:

said first impurity concentration of said diffusion region is $1\times10^{20}$ atoms/cm$^3$ and said third impurity concentration of said diffusion capacitance reduction layer is $1\times10^{16}$ atoms/cm$^3$ to thereby form a space charge region with a width of 0.3 micrometers between said diffusion region and said low impurity concentration diffusion layer.

35. The structure as claimed in claim 34, wherein said second impurity concentration of said semiconductor bulk region is $8\times10^{12}$ atoms/cm$^3$.

36. The structure as claimed in claim 29, wherein said semiconductor bulk region comprises a semiconductor substrate.

37. The structure as claimed in claim 29, wherein said semiconductor bulk region comprises a semiconductor well region formed in a semiconductor substrate.

38. The structure as claimed in claim 29, wherein said semiconductor bulk region comprises a semiconductor well region formed in a semi-insulating substrate.

39. The structure as claimed in claim 29, wherein said semiconductor bulk region is formed on an insulating substrate.

* * * * *